United States Patent [19]

Mitchell et al.

[11] Patent Number: 4,791,403
[45] Date of Patent: Dec. 13, 1988

[54] LOG ENCODER/DECORDER SYSTEM

[75] Inventors: Joan L. Mitchell, Ossining; William B. Pennebaker, Carmel; Gerald Goertzel, White Plains, all of N.Y.

[73] Assignee: International Business Machines Corporation, Armonk, N.Y.

[21] Appl. No.: 80,187

[22] Filed: Jul. 28, 1987

Related U.S. Application Data

[63] Continuation of Ser. No. 805,157, Dec. 4, 1985.

[51] Int. Cl.[4] .............................................. H03M 7/00
[52] U.S. Cl. ..................................... 341/51; 364/748; 364/857; 341/63; 341/75
[58] Field of Search ................ 340/347 DD; 364/748, 364/857

[56] References Cited

U.S. PATENT DOCUMENTS

| | | | |
|---|---|---|---|
| 3,875,344 | 4/1975 | Bogart | 179/15.55 |
| 4,286,256 | 8/1981 | Langdon, Jr. et al. | 340/347 DD |
| 4,467,317 | 8/1984 | Langdon, Jr. et al. | 340/347 DD |
| 4,633,490 | 12/1986 | Goertzel et al. | 375/122 |

OTHER PUBLICATIONS

G. G. Langdon, Jr., "An Introduction to Arithmetic Coding", IBM J. Research Develop., vol. 28, No. 2, pp. 135–149, Mar. 1984.
G. G. Langdon, Jr. et al, "Arithmetic Coding", IBM J. Res. Develop., vol. 23, NO. 2, pp. 149–162, Mar. 1979.
G. G. Langdon, Jr. et al, "Compression of Black-White Images with Arithmetic Coding", IEEE Trans. Commun., Com-29, 858–867, Jun. 1981.

Primary Examiner—T. J. Sloyan
Attorney, Agent, or Firm—Marc A. Block

[57] ABSTRACT

A high speed form of finite precision binary arithmetic coding comprises encoding/decoding performed in the logarithm domain, resulting in facilitated computation based on additions and subtractions rather than multiplications and divisions. In encoding and decoding, antilogs are used which are retrieved from an antilog table. The antilog table is characterized by the following constraints to assure decodability wherein for any two mantissas $\alpha$ and $\beta$ representing respective inputs to the antilog table:

(a) antilog $(\alpha+\beta) \leq$ antilog $(\alpha)$ * antilog $(\beta)$; at least when $(\alpha+\beta)$ is less than one; and
(b) each antilog table output value is to be unique.

17 Claims, 30 Drawing Sheets

LOG ENCODER/DECODER SYSTEM

This is a continuation of application Ser. No. 805,157, filed Dec. 4, 1985.

FIELD OF THE INVENTION

In general, the present invention involves encoding and decoding data by using logarithms. In particular, the invention relates to encoding and decoding in an arithmetic coding system which compresses data during coding and de-compresses data during decoding, wherein at least some of the computations are performed in a logarithmic domain.

BACKGROUND OF THE INVENTION

One technique of compressing and de-compressing data is known as arithmetic coding. Arithmetic coding provides that, during encoding, the results of a set of events are made to correspond to a respect point on a number line and, during decoding, the results from the set of events can be re-determined from a knowledge of the respective point. Specifically, during encoding the occurrence of a first answer for an event (or decision) is related to a corresponding first interval along the number line. The occurrence of a second (subsequent) event is associated with a subinterval along the first interval. With additional events, successive subintervals are determined. The final subinterval is represented by a selected point, which is defined as a compressed data stream. For a given set of answers for a respective set of decisions, only one subinterval with one corresponding compressed data stream is defined. Moreover, only one set of answers can give rise to a given compressed data stream.

Hence, given the compressed data stream, the original set of answers can be determined during decoding.

When the possible number of answers which can occur at any given event is two, the arithmetic coding is binary. One example of a binary application is embodied in the processing of white/black data of a picture element (pel) of a facsimile processing system. In this facsimile application, there are two complementary probabilities referred to herein as "P" and "Q". Given that a pel can be either black or white, one probability corresponds to a pel being black and the other corresponds to the pel being white. Such an environment is discussed in an article by Langdon, "An Introduction to Arithmetic Coding", *IBM J. Res. Develop.* Vol 28, No 2, pages 135–149 (March, 1984).

As noted in the article, one of the two possible answers in binary coding may be more likely than the other at a given time. Moreover, from time to time, which of the two answers is more likely may switch. In a black background, for example, the probability of the "black" should be significantly greater than for the "white" answer, whereas in a white background the "white" answer should be more likely. In the Langdon article, an approach is proposed which may be applied to a binary arithmetic code or, more generally, to a multisymbol alphabet environment. In each case, the approach involves processing numerical data in the real number system. Specifically, the encoding process is described as defining a variable C (representing a code point along the number line) and an expressing C+A (representing an available space starting at the current code point C and extending a length A along the number line). The interval A is sometimes referred to as the range. In the binary context, Langdon represents the variable A in floating point notation.

Other references of a related nature include two patents, U.S. Pat. Nos. 4,467,317 and 4,286,256. An article by Rissanen and Langdon, "Arithmetic Coding", *IBM J. Res. Develop.* Vol 23, No 2, pages 149–162 (March 1979), also discusses arithmetic coding. In the Langdon and Rissanen-Langdon articles and in the above-referenced patents, which are incorporated herein by reference, additional patents and publications are discussed which may serve as further background to the present invention.

In reviewing the various cited references, it is observed that logarithms are used to represent the measure of entropy H(S) of a symbol and to represent a measure of the width of the code space. The use of logarithms in converting computationally expensive multiplies and divides into additions and subtractions is well known. A review of prior technology also indicates that no references disclose an encoder/decoder in an arithmetic coding system wherein range is re-computed for successive subintervals with finite precision in the logarithmic domain rather than in the real number domain.

The use of logarithms for re-computing range is not straightforward because of the precision requirements of arithmetic coding. Specifically, when transferring from the real number domain to a logarithm domain in which there is finite precision, the resulting logarithm includes some truncation due to the finite precision requirement. A problem attending the truncation involves the antilogs that are to be subsequently taken. Due to the truncation, it is possible for the sum of the antilogs of log P and log Q to exceed one—resulting in ambiguity which cannot be tolerated in the arithmetic coding. Stated otherwise, the truncation operation must be performed to assure decodability. Until the present invention, this feature has not been achieved with a log coder.

SUMMARY OF THE INVENTION

Hence, it is a major object of the present invention to provide an arithmetic coding encoder/decoder system in which probabilities are represented in the logarithmic domain with finite precision. In achieving the above-noted object, prescribed log tables and an antilog table are employed. In accordance with the present invention, the antilog table is generated in accordance with specific constraints applied in working with fractions employed in the encoding and decoding process.

In the case of a binary event (or decision), the more probable symbol has a probability P and the other (less probable) symbol has a probability Q. A range R is defined along a number line wherein R defines the limits in which a point is to be located. As recognized in the previous technology, a "new" range R' has been defined as the current range R multiplied by a symbol probability such as P. The new range R' would thus be R*P—where * indicates multiplication—and corresponds to a reduction in the range R.

In accordance with the present invention, overlap of intervals along the number line is avoided by imposing the constraint:

$$R*P + R*Q \leq R.$$

In the logarithmic domain, this condition becomes:

$$\frac{\text{antilog}(\log R + \log P)}{\text{antilog}(\log R)} + \frac{\text{antilog}(\log R + \log Q)}{\text{antilog}(\log R)} \leq 1$$

Based on the above relationships, the following constraints apply:

$$\frac{\text{antilog}(\log R + \log P)}{\text{antilog}(\log R)} \leq \text{antilog}(\log P)$$

and $$\frac{\text{antilog}(\log R + \log Q)}{\text{antilog}(\log R)} \leq \text{antilog}(\log Q)$$

From the above-discussed relationships, a general condition is defined as:

$$\text{antilog } (\alpha + \beta) \leq \text{antilog } (\alpha) * \text{antilog } (\beta)$$

where $\alpha$ and $\beta$ represent any two mantissas which correspond to inputs to an antilog table.

An antilog table formed according to the general condition set forth immediately hereinabove applies whether $\alpha$ corresponds to log R and $\beta$ corresponds to log P or whether, for a real number product R*Q, $\alpha$ would be log R and $\beta$ would be log Q.

The present invention is accordingly able to achieve the object of modifying the range R—formed from a product of real numbers such as R*P or R*Q—in the logarithmic domain where the antilog table employed has the above-noted general condition applied thereto.

The present invention achieves the further object of reducing the size of the antilog table by applying the above-noted general condition in only certain cases while applying a different condition in other cases. That is, the antilog table outputs are limited to achieve reduced size based on the following two relationships:

antilog $(\alpha + \beta) \leq$ antilog $(\alpha)*$antilog $(\beta)$;
$\alpha + \beta \leq 1$
2*antilog $(\alpha + \beta - 1) \leq$ antilog $(\alpha)*$antilog $(\beta)$;
$\alpha + \beta \leq 1$ A further object of the present invention is the assuring of decodability. This object is achieved by imposing a constraint in addition to the above two relationships. According to this added constraint, all output values of the antilog table must be unique.

With decodability assured, the logarithm domain is employed to convert multiplications and divisions in the real number domain into additions and subtractions in the logarithmic domain. This achieves the object of reducing computational requirements.

The present invention also provides for controlled rounding in the log table used in converting to the log domain in order to guarantee correct identification of the least probable symbol in the decoder while still in the log domain.

Also according to the invention, optimized matched pairs of log P and log Q are determined for finite precision (and decodable) operation.

Furthermore, the present invention enables the collapse of the log P's to an optimal set for the given precision.

Further reduction of the log P table is achieved with an upper limit placed on the maximum coding error at least over a range of actual probabilities.

The present invention also provides for the encoding of successive occurrences of the most probable symbol in a given state of constant probability by a simple counting procedure.

Moreover, the present invention provides for byte, rather than bit, oriented input/output of compressed data with minimal testing.

In addition to the above-mentioned features and objects achieved by the present invention, the present logarithmic encoder/decoder addresses difficulties recognized as generally affecting arithmetic coding compression/de-compression systems.

Furthermore, it should be observed that the antilog table embodied with the aforementioned constraints may be used in applications other than in arithmetic coding. In general, where multiplications and divisions of real numbers are performed, such calculations can be facilitated by performing additions and subtractions in the logarithmic domain. The aforementioned antilog table enables the conversion to and from the logarithmic domain where the real numbers and logarithms have finite precision and where reversibility is required.

DESCRIPTION OF THE INVENTION

I. Introduction

Section II of this disclosure discusses some basic principles of arithmetic coding that pertain to the implementation of a log coder. Section III develops the basic mathematical rules for arithmetic coding in the log domain, and therefore the rules by which the various antilog and log tables must be generated. Section IV discusses more detailed aspects of an actual implementation, dealing with such practical aspects as changing the state being coded, renormalization, carry propagation, and byte oriented input/output. It also describes the implementation of a probability adaptation concept described in a co-pending patent application of W. B. Pennebaker and J. L. Mitchell, co-inventors of the present invention, entitled "Probability Adaptation for Arithmetic Coders" filed on even date herewith. Section V describes tests of the functioning encoder and decoder.

Appendix 1 contains a software implementation of the log encoder/decoder in the Program Development System (PDS) language. PDS, it is noted, used forward polish notation (i.e., the operators are followed by the operands). Appendices 2, 3 and 4 contain the PDS software for the calculation of the log and antilog tables. Appendix 5 contains a detailed operational test of the encoder and decoder.

II. Basic Principles of Arithmetic Coding as Applied to Log Coding

Figure 1:
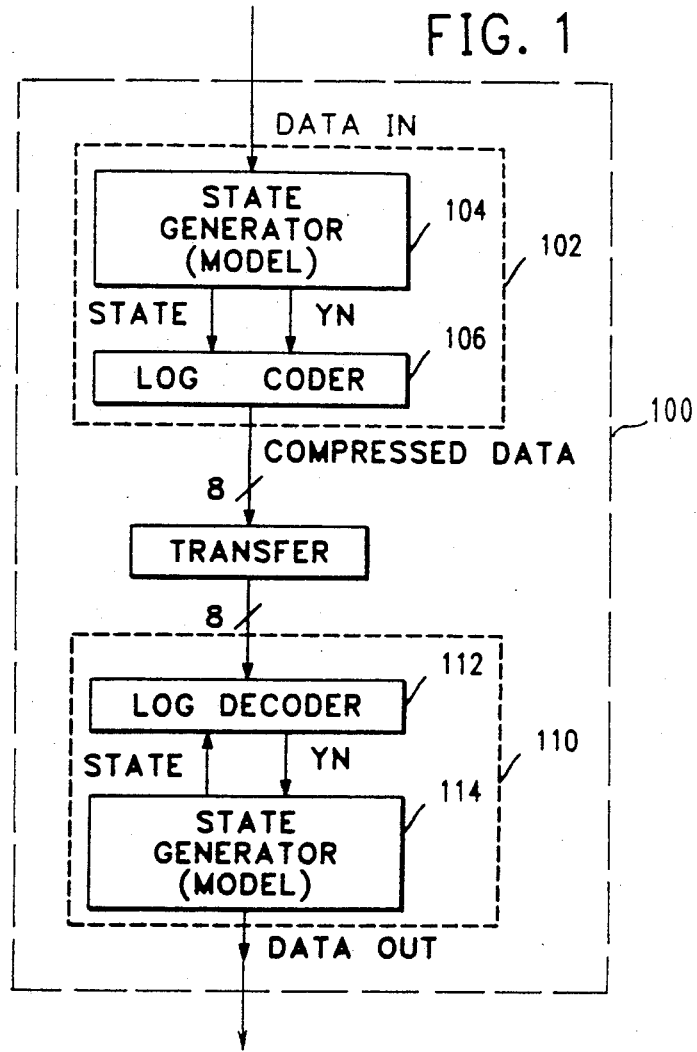
FIG. 1 is a diagram illustrating the basic structure of a compression/de-compression system including a log coder and log decoder.

Referring to FIG. 1, the basic structure of a compression/de-compression system 100 is shown. The encoder 102 is divided into two basic parts, a state generator 104 and a log coder 106. The decoder 110 is the inverse of this, including a log decoder 112 and a state generator 114. The state generator 102 contains a model which classifies input data into a set of binary context states which are, in general, history dependent.

The state generator 104 communicates to the log coder 106 the context state for the current binary decision. A similar context state output is provided by the state generator 114 for the decoder.

The context state, it is noted, identifies the most probable symbol (MPS); stores an index value I corresponding to a probability value in the lookup table; stores a count (i.e., the k count) representing the number of occurrences of the LPS symbol; and stores a count (i.e., the n count) representing the number of occurrences of either symbol. The YN (yes/no) output from the encoder state generator 104 informs the log coder 106 what the current binary symbol is.

In the example of a black/white facsimile system, the state generator 104 identifies a context state which is arrived at as the result of a particular pattern (or one of several patterns) of black/white pels. The actual next pel in the pattern is provided as a YN output.

The YN output from the log decoder 112 informs the decoder state generator 114 what the current symbol is. Using the YN value the decoder state generator 114 is able to reconstruct the output data. The output from the log coder 106 is a single merged compressed data stream. Each context state, however, is encoded by the log coder 106 as if it were an independent entity. Preferably, additional information is passed via the state which enables the encoder 102 and decoder 110 to perform calculations required for probability adaptation (such as is set forth in the aforementioned patent application filed on even date herewith). Combining the encoding/decoding method or apparatus of the present invention with the probability adaptation improves overall computational efficiency and compression performance. However, the present invention may be implemented in a system wherein probabilities are predetermined or are fixed and do not adapt with entry of new data. Hereinbelow, the present invention sets forth an embodiment employing probability adaptation.

In encoding a set of binary decision, the present invention represents a point on the probability number line with sufficient precision to uniquely identify the particular sequence of symbols from all other possible sequences. The intervals on the number line are allotted according to the probabilities of the sequences. The more probable sequences are coded with less precision—i.e., with fewer bits—and cover a larger interval.

Figure 2:
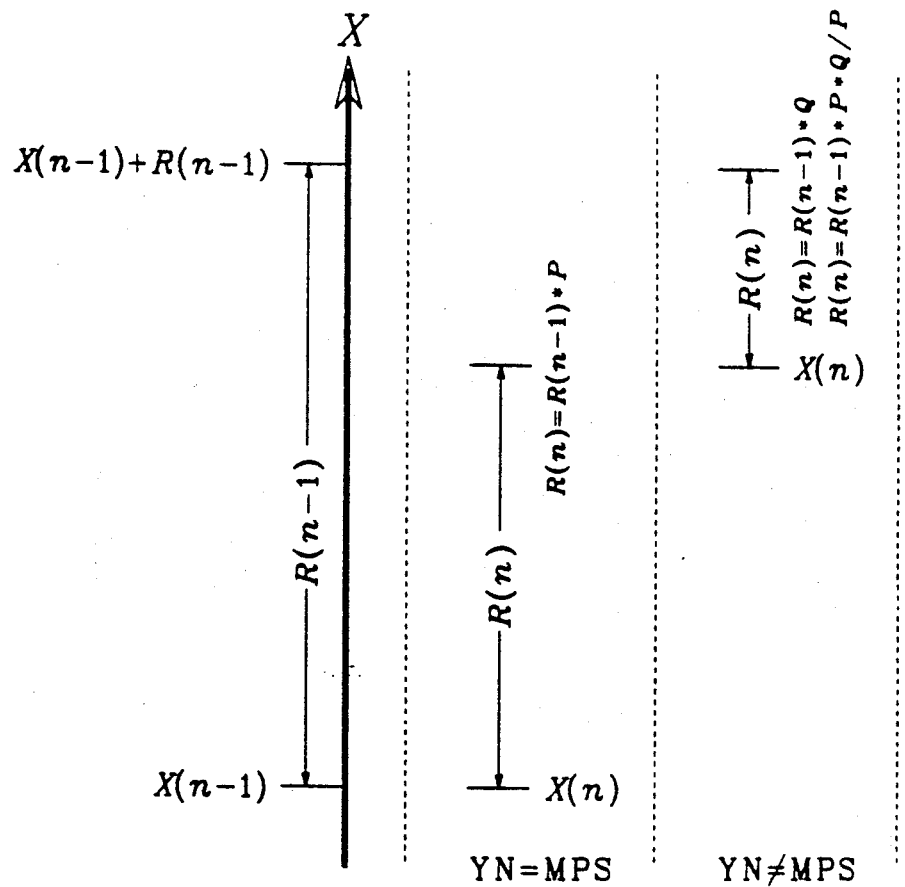
FIG. 2 is an illustration showing a piece of number line divided into segments, one corresponding to the most (more) probable symbol and the other segment corresponding to the least (less) probable symbol.

A schematic of the mathematic operations for arithmetic coding based on infinite precision (rather than finite precision as in the present invention) is shown in FIG. 2. The symbol $X(n-1)$ is an infinite precision compressed data stream generated in coding the n-1 prior binary decisions. $X(n-1)$ points to the bottom of the range, along the number line, that is available to the nth symbol. $R(n-1)$ is in the range available for that symbol. The log coder 106 uses the convention that the most probable symbol (MPS) and least probable symbol (LPS) are ordered such that the probability interval allotted to the MPS is below that of the LPS. Then, if the nth YN is an MPS, the point represented by $X(n)$ remains fixed at the base of the interval and the range $R(n)$ shrinks to that accorded the MPS. If the nth YN is an LPS, a the MPS range is added to $X(n-1)$ to shift the bottom point of the range $X(n)$ to the base of the interval for the LPS and the range $R(n)$ shrinks to that accorded the LPS. These two possibilities are shown graphically in FIG. 2.

Adopting the convention that the MPS occupies the lower part of the interval has computational advantages. In this regard, it is noted that the only information required for the coding process is a current compressed data stream $X(n-1)$, a current range $R(n-1)$ along the probability number line and a current MPS probability P. (The probability of the LPS, Q, is by definition 1-P.) As the nth symbol is started, the current compressed data stream and interval are known. The current probability is determined from the context state information, i.e., the I value.

The basic principles of arithmetic coding discussed hereinabove are now considered in constructing to encoder and decoder. The problems relating to finite precision and carry propagation will be ignored for the moment.

Figure 3:
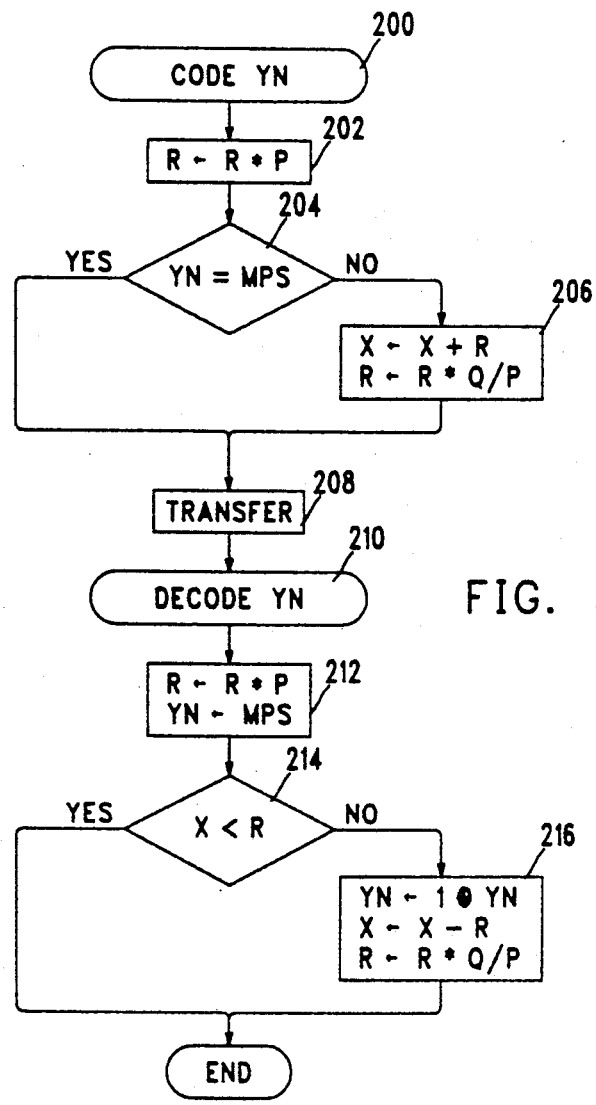
FIG. 3 is a flowchart showing an encoder and decoder in an arithmetic coding compression/de-compression system.

A flow chart for an infinite precision arithmetic encoder and decoder is illustrated in FIG. 3. The encoder is identified at block 200 of the flow chart and the decoder is identified at block 210. Note that the oval blocks label the function which is performed by the flow chart.

The encoder first reduces the range from R to R*P at block 202. If an MPS is being encoded (at decision block 204), that is all that is required for that symbol. If an LPS is being encoded, the compressed data stream X is increased by R so that it points to the bottom of the new probability interval (see $X(n)$ in FIG. 2 wherein YN≠MPS), and the range R is further reduced by multiplying by the ratio Q/P (Q being less than P by definition). These operations are performed at block 206. The coded data is in compressed form and may be transferred by any of various known elements 208 to the decoder.

The decoder operates in a manner analogous to the encoder. For each symbol being decoded, the decoder first reduces the current range R to R*P. The symbol YN is assumed to be an MPS, and is so set at block 212. If the compressed data stream X is determined at decision block 214 to be less than the new range R, the symbol must have been an MPS, and the decoder has successfully decoded the symbol. If this test fails, however, an LPS must be decoded. The YN symbol is switched to an LPS via an 'exclusive or' operation; the range allotted to the MPS subtracted from X; and—as in the encoder—the new range is further reduced by the ratio Q/P in block 216.

The particular sequence of operations described in FIG. 3, it is noted, leads to a computationally efficient implementation relative to other valid operational sequences.

Figure 4:
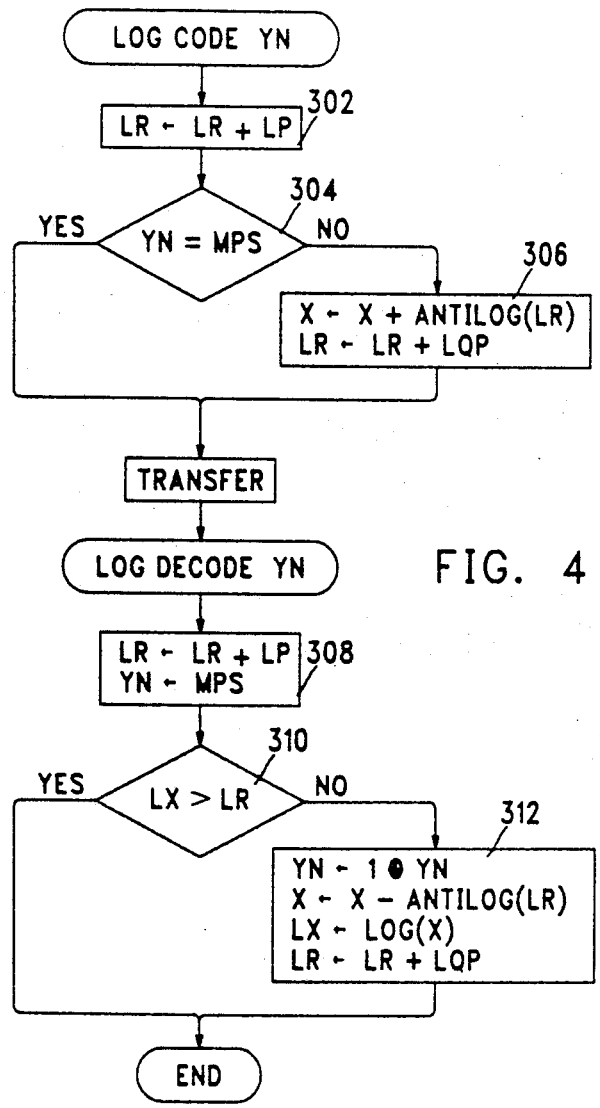
FIG. 4 is a flowchart remapping the structure of FIG. 3 to a log coder implementation.

The remapping of FIG. 3 to a Log Coder and Log Decoder implementation is shown in FIG. 4. This is an overview of the function performed in the Log Coder 106 and Log Decoder 112 illustrated in FIG. 1. The logarithm of the current range, LR, is the measure of the probability interval available. LP is the log of the current MPS probability. The product, R*P, is therefore replaced by the sum of logarithms in block 302. Again, if YN is the MPS at decision block 304, the encoding operation is complete (conceptually). If YN is an LPS, the compressed data stream X must be increased by the antilog of the LR determined at step 302, and the log of the ratio of Q/P (LQP) must be added to LR as shown at block 306.

The decoder follows a similar structure. The range is first reduced, which in the log domain is done by adding two logarithms. (Preferably, the logarithms discussed in this embodiment are in base −2.) This is performed at block 308. The YN symbol is initially defined to be an MPS, and a test is made (in the log domain) to see if the compressed data stream X is less than the range determined in block 310. Note that LX and LR are logrithm magnitudes of numbers less than one. LX greater than LR means than X is less than R. If so, the log decoder is finished for that symbol. If not, the YN is converted to an LPS; the value of X is adjusted by subtracting the probability interval allotted to the MPS (ANTILOG(LR)); a new log X (denoted by LX) is calculated; and the log of the range LR is adjusted to match to the LPS range. These operations are performed at block 312.

This section has described the basic conceptual structure of the log coder and decoder. In this description the quantities LP and LQP were assumed to be looked up in tables from the context state information. In addition, the antilog calculation was assumed to be performed by a simple lookup table procedure. In making these assumptions, a number of very fundamental questions regarding finite precision arithmetic and guarantees of decodability have been side-stepped. These questions are addressed in the next section.

III. Mathematical Principles and Generation of Tables for Arithmetic Coding in the Logarithmic Domain If decodability is to be guaranteed, there must never be any overlap of intervals along the probability number line. A necessary condition for this is:

$$P+Q \leq 1 \quad \text{Eq. 1}$$

In the long domain this becomes:

$$\text{antilog}(\log P) + \text{antilog}(\log Q) \leq 1 \quad \text{Eq. 2}$$

where the antilog is done by lookup tables which are generated subject to constraints described below.

The precision of log P is restricted to a given number of bits. For 10 bit precision log P can be regarded as being renormalized to convert it to a 10 bit integer having values from 1 to 1024. Since P is a fraction where $0.5 \leq P < 1$, log P is negative. For convenience, LP and LQ are defined as:

$$LP = 1024*(-\log P) \quad \text{Eq. 3a}$$

$$LQ = 1024*(-\log Q) \quad \text{Eq. 3b}$$

$$LQP = 1024*(\log P - \log Q) \quad \text{Eq. 3c}$$
$$= LQ - LP$$

where the factor 1024 applies to 10 bit precision in the log tables.

Equation 2 is not a sufficient condition for decodability. In this regard, it is noted that in general, the range R is not 1, so equation 1 must be modified to:

$$R*P + R*Q \leq R \quad \text{Eq. 4}$$

which in the log domain becomes:

$$\text{antilog}(\log R + \log P) + \text{antilog}(\log R + \log Q) \leq \text{antilog}(\log R) \quad \text{Eq. 5}$$

Dividing both sides of equation 5 by antilog(log R) gives:

$$\frac{\text{antilog}(\log R + \log P)}{\text{antilog}(\log R)} + \frac{\text{antilog}(\log R + \log Q)}{\text{antilog}(\log R)} \leq 1 \quad \text{Eq. 5a}$$

In order for both equations 2 and 5 to always hold $$\frac{\text{antilog}(\log R + \log P)}{\text{antilog}(\log R)} \leq \text{antilog}(\log P)$$

and $$\frac{\text{antilog}(\log R + \log Q)}{\text{antilog}(\log R)} \leq \text{antilog}(\log Q)$$

Therefore, if in general $$\text{antilog}(\alpha + \beta) \leq \text{antilog}(\alpha)*\text{antilog}(\beta) \quad \text{Eq. 6}$$

holds for the antilog table, equation 5 will be satisfied. Moreover, to achieve decodability, all output values of the antilog table must be unique.

Equation 6 represents a fundamental constraint on the structure of the antilog table.

To limit the size of the antilog table, equation 6 is revised slightly as follows.

$$\text{antilog}(\alpha + \beta) \leq \text{antilog}(\alpha)*\text{antilog}(\beta); \text{ where}$$
$$\alpha + \beta < 1 \quad \text{Eq. 7a}$$

$$2*\text{antilog}(\alpha + \beta - 1) \leq \text{antilog}(\alpha)*\text{antilog}(\beta); \text{ where}$$
$$\alpha + \beta \geq 1 \quad \text{Eq. 7b}$$

These two relationships are used in the generations of the antilog table, together with the one further constraint; namely, all output values of the antilog table must be unique, to achieve decodability and facilitated computation.

A program for generating and optimizing the antilog table is set forth in Appendix 2. The optimized 12 bit precision antilog table can be found in the function 'maketbls' in Appendix 1. (The table order has been inverted in the actual code, because the table address there is not generated from the true mantissa, mx, but rather from 1-mx.) Note that the antilog table is defined such that the log index is a number between 0 and 1, giving outputs between 1 and 2 (with proper renormalization of inputs and outputs). Although 14 bits are actually used in the antilog table in 'maketbls', only 4096 entries are needed for the table. With the exception of the first entry in the table, the two most significant bits are always the same. Thus, it can be regarded as a 12 bit precision table. It is also noted that the non-linearities of the log and antilog tables and the uniqueness requirement demand that the precision of the antilog table be somewhat higher than the precision of the log table.

Once the antilog table is known, the log tables can be constructed. Two tables are required. As suggested in FIG. 4, both the encoder and decoder require a knowledge of log P and log Q/P. Given all possible values of log P (or LP), equation 2 can now be used to generate the values of log Q/P (LQP) which satisfy that constraint. While all values of log P are valid and decodable, the finite precision and constraints placed on the antilog table make many of the log P values non-optimum (as defined below).

For 10-bit precision, there are $2^{10}$ or 1024 possible estimated probabilities. This high number of probabilities is unwieldy. Hence, the number of probabilities is reduced according to appropriate criteria. In the present invention, estimated probabilities are discarded based on coding inefficiency. In this regard, it is noted that coding inefficiency is defined as:

$$\text{INEFFICIENCY} = \frac{\text{Bit Rate} - \text{Entropy}}{\text{Entropy}}$$

Entropy is equal $-P \log 2(P) - Q \log 2(Q)$ where $P+Q=1$ and is defined in terms of bits/symbol for ideal coding. Bit Rate is equal to $-P \log 2(P_{est}) - Q \log 2(Q_{est})$ where $(Q_{est}+P_{est}) \leq 1$ and is defined in terms of bits/symbol for an estimated probability (Bit Rate=Entropy represents the ideal condition).

Figure 5:
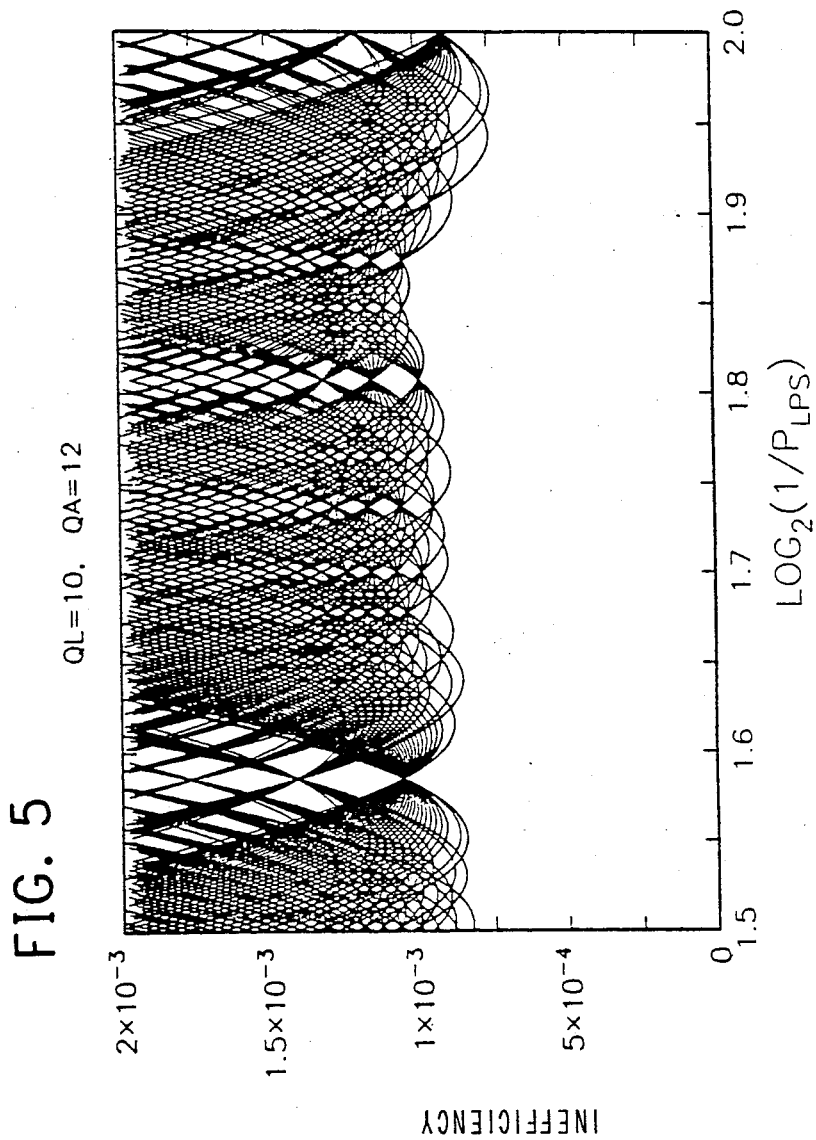
FIG. 5 is a graph depicting coding inefficiency relative to the entropy limit for all possible LP values for a sample probability interval. $P_{<LPS>}$ has the same meaning as Q and LP represents the $\log 2$ $(1/P_{MPS})$.

Referring to FIG. 5, each curve corresponds to a probability estimate. Some curves have at least one point which, for a $$\log 2 \frac{1}{P_{LPS}}$$

abscissa value corresponding thereto, has a lower inefficiency value than any other curve. Some do not. Those estimated probabilities having curves that do not have a relative minimum inefficiency value are discarded as non-optimum. In FIG. 5, $P_{LPS}$ means Q and QL and QA represent the log and antilog precisions, respectively. The relative error is the coding inefficiency defined above.

After applying the "relative minimum criteria," the 1024 possible probabilities are reduced to 131. These 131 estimated probabilities may serve as entries in a table for estimated Q's.

Figure 6:
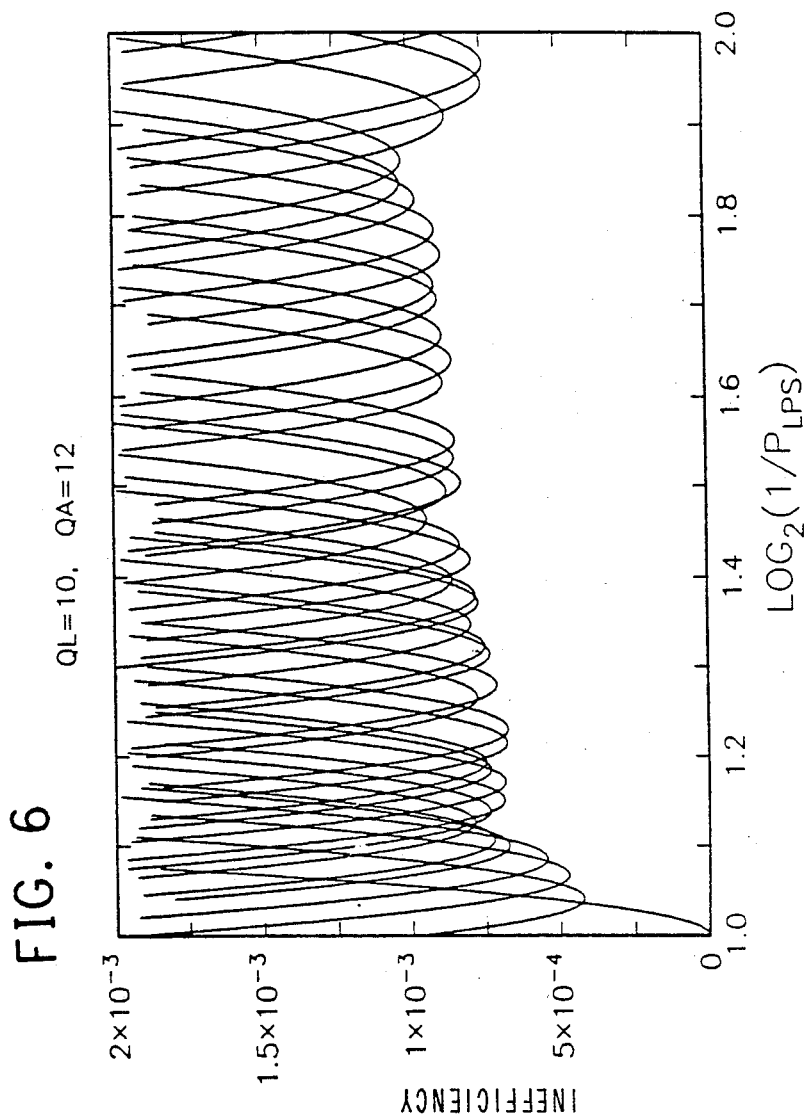
FIG. 6 is a graph depicting coding inefficiency relative to the entropy limit for an optimum set of LP values for a sample probability interval.

A plot of relative coding inefficiency with respect to the entropy limit, (P*LP+Q*(LP+LQP)-Entropy)/Entropy, is shown in FIG. 6 for a sample probability interval for the set of 131 remaining probabilities.

Figure 7:
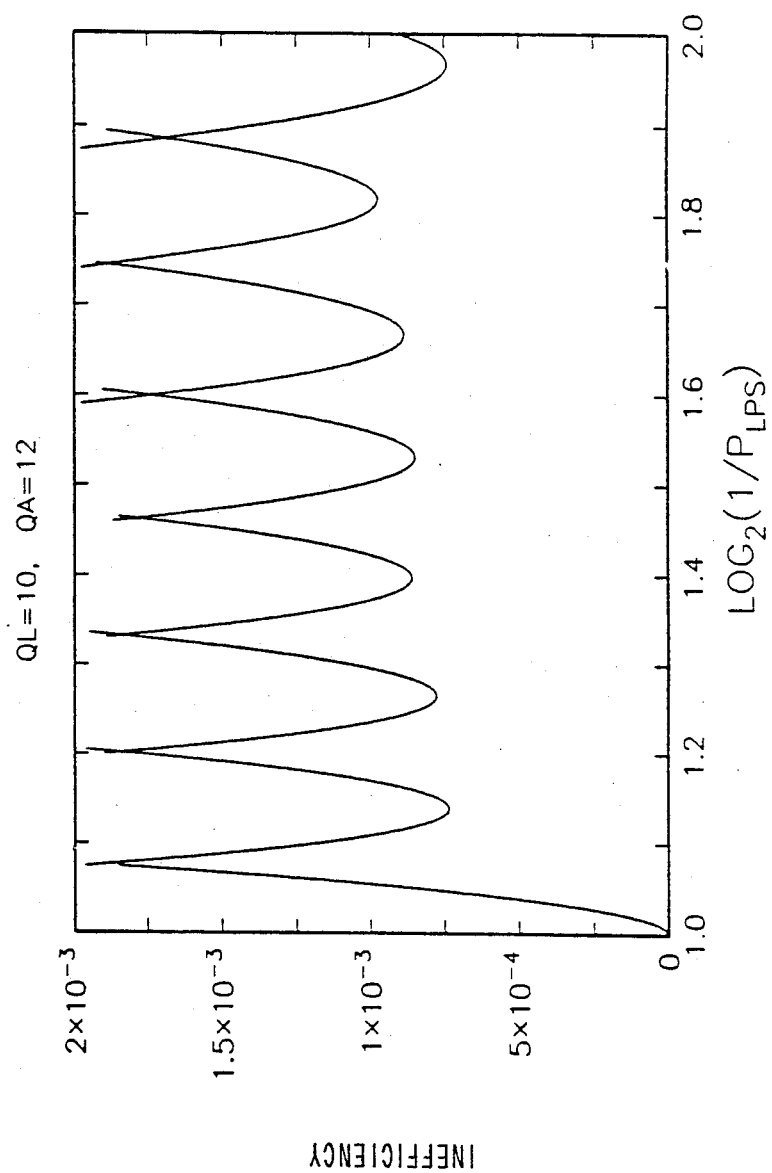
FIG. 7 is a graph depicting coding error relative to the entropy limit for a reduced set of LP values for a sample probability interval.
Figure 8:
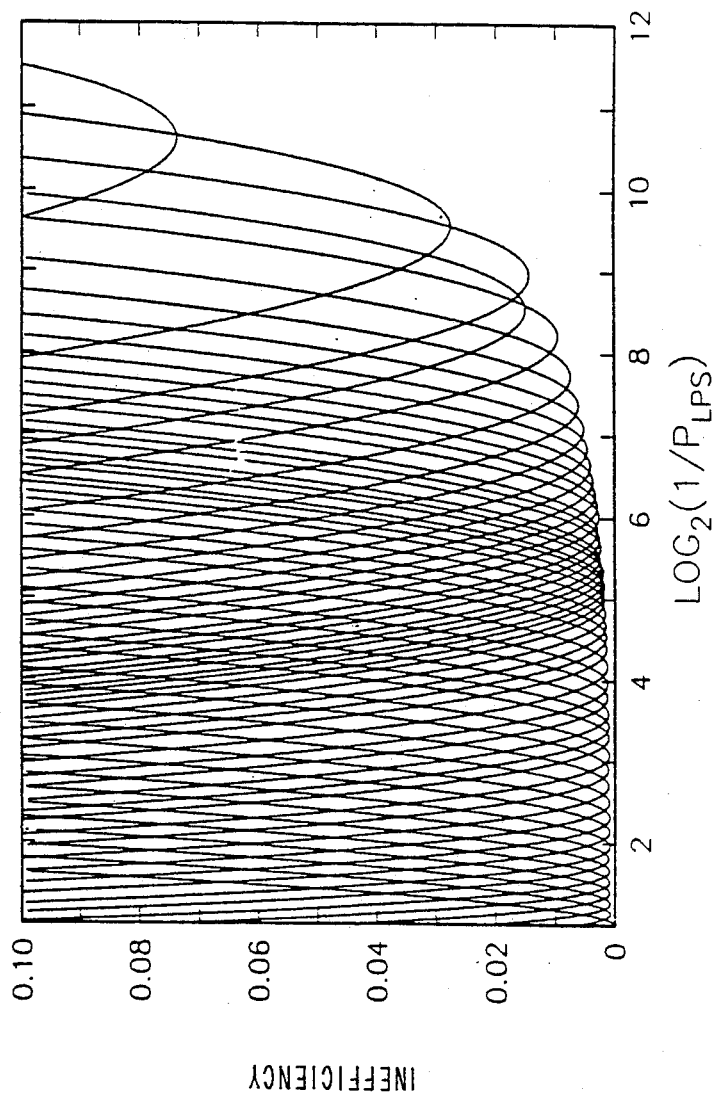
FIG. 8 is a graph depicting coding error relative to the entropy limit for all 48 LP values in the reduced set.

If slightly larger coding inefficiencies are allowed than the table would produce, the table can be further reduced. For example, deleting entries which can be replaced by neighboring entries without increasing the coding inefficiency to more than 0.2% further collapses the table to 48 entries. FIG. 7 shows this set for the same probability interval used for FIG. 6. FIG. 8 shows the coding inefficiency curves for all 48 entries. Code for constructing and collapsing the LP, LQP tables is given in Appendix 3. A 10 bit precision LP, LQP table is found in the function 'maketbls' in Appendix 1. This table has been collapsed in 48 entries.

In addition to the LP and LQP tables, the decoder also requires a log table in order to generate LX, the log of the current piece of the compressed data. This table must be structured so as to guarantee that the comparison of LX with LR will give exactly the same decision as a comparison of X with R. The following basic rules must be followed in constructing the LX table:

1. There must be an entry for every possible antilog value. Therefore, 4096 entries are required if the antilog table has 12 bit precision. Since only 10 bit precision is required in the log domain for this case, the table can be guaranteed to have all possible (1024) output values.

2. The LX table must be reversible for all values which are outputs of the antilog table. That is:

$$LX = \log(\text{antilog}(LX)) \quad \text{Eq. 8}$$

3. Given an Xa and Xb as two adjacent output values from the antilog table, and an X' such that $Xa > X' > Xb$, the output for log X' must be rounded down to log Xb. The reason for this is as follows:

For each Xc generated by the antilog table, if the bound between LPS and MPS occurs at Xc, Xc must be distinguished from Xc−1. If $X \geq Xc$, and LPS has occurred, and if $X \leq Xc-1$, an MPS has occurred. Therefore, for any given antilog table output, if X is slightly less than that output, log (X) should be rounded down to the log of the next antilog table output. If it were rounded up, it might be decoded as an LPS. Since log (R) must be changed by at least one (i.e., by the smallest log P increment allowed) before decoding the next symbol, there is no danger that the next symbol might be erroneously decoded as an MPS.

IV. Detailed Description of the Log Coder Operation

A. Definitions

LR is defined as $1024*(-\log R)$, in keeping with the conventions used for LP and LQP. LR is a 16 bit integer, but can be considered a binary fraction with the binary point positioned to provide 10 fractional bits and 6 integer bits. LR serves a dual function function; it is a measure of the current range and also a measure of the symbol count for probability adaption. Probability adaptation is discussed in the previously cited patent application.

X contains the least significant bits of the compressed data stream for the encoder. In the encoder, X is a 32 bit word consisting of 12 integer bits and 20 fractional bits plus any carry. In the decoder only the 20 fractional bits are used and X is the current most significant bits after proper renormalization.

Figure 9:
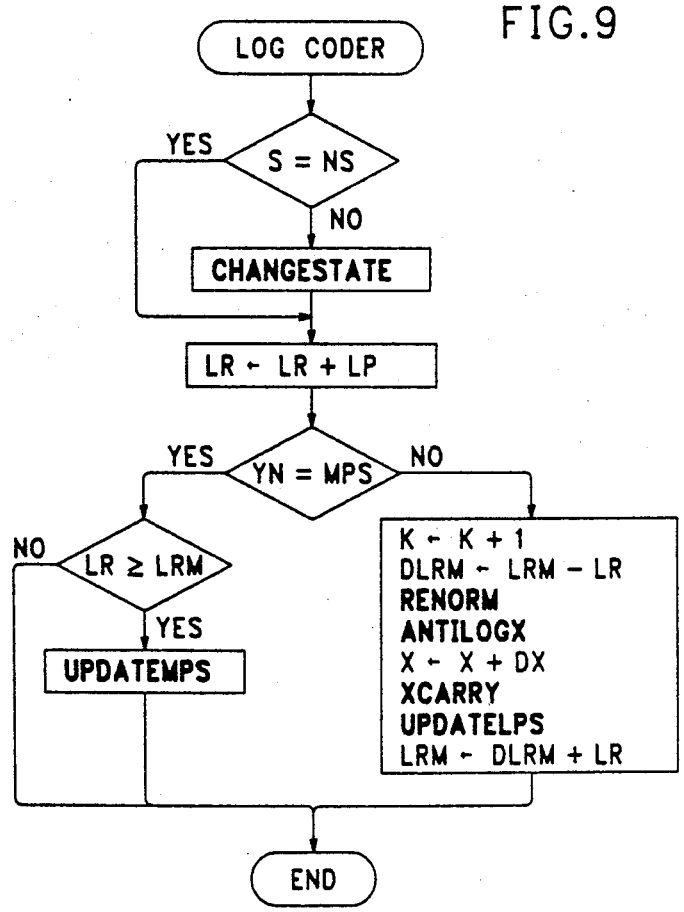
FIG. 9 is a flowchart illustrating the operations of a log coder according to the present invention.
Figure 10:
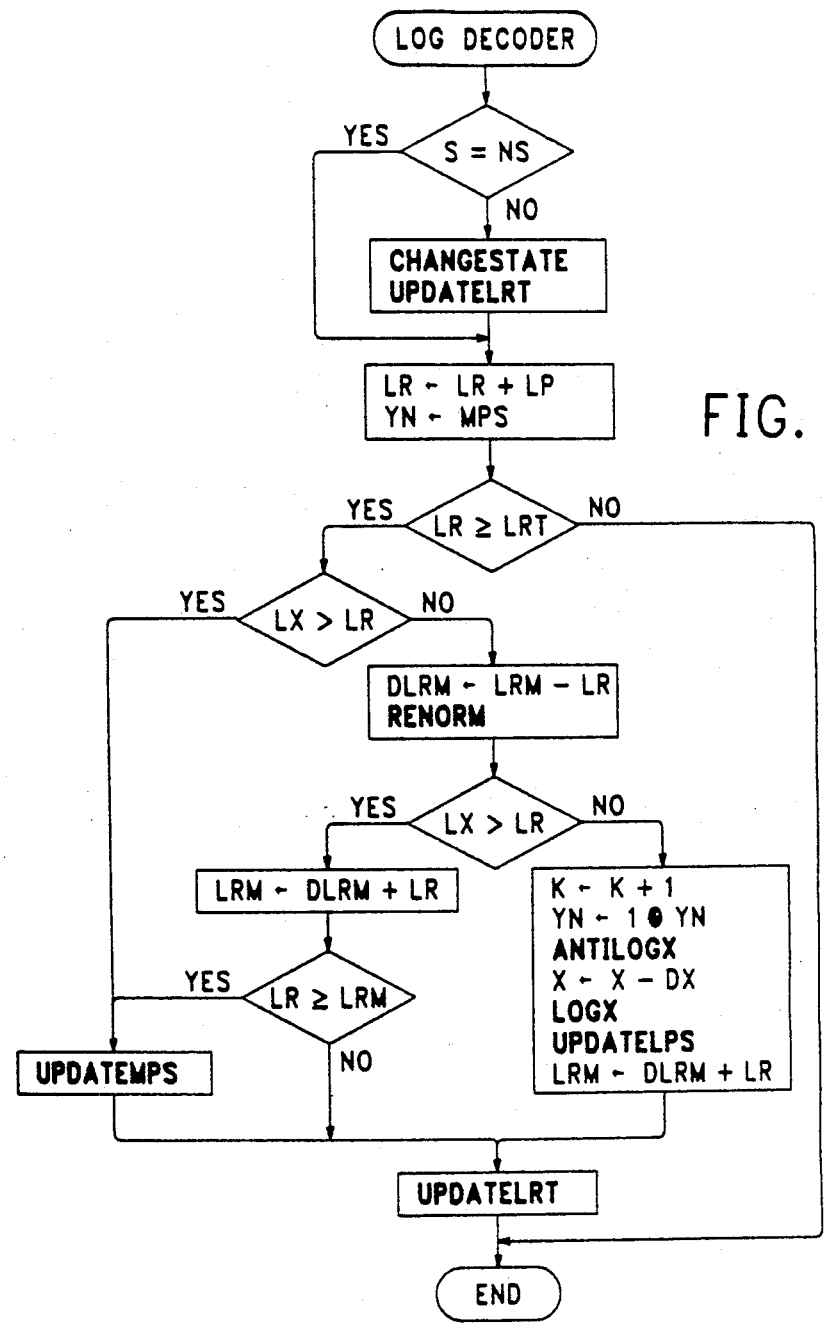
FIG. 10 is a flowchart illustrating the operations of a log decoder according to the present invention.

B. LOG CODER (FIG. 9):

FIG. 9 shows a flow chart for an actual software implementation of the log coder. Some of the basic structure from FIG. 4 should be apparent, but there are significant addition. Before encoding a new symbol, a check is made to see if there is a new context state, NS, changed from the previous context state, S. The new context state is dictated by the model. By way of example, if the neighborhood identified with a pel changes from being predominantly black to predominantly white, a corresponding model would declare a new state (NS). Accordingly, a new set of parameters—MPS I, k, and n (or the like)—would be called.

Figure 11:
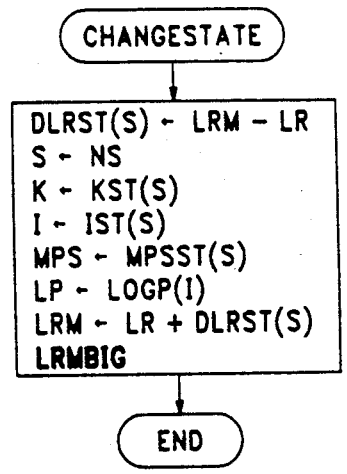
FIGS. 11 through 31 are routines employed in the log coder or decoder or both to perform the arithmetic coding in accordance with the invention.
Figure 12:
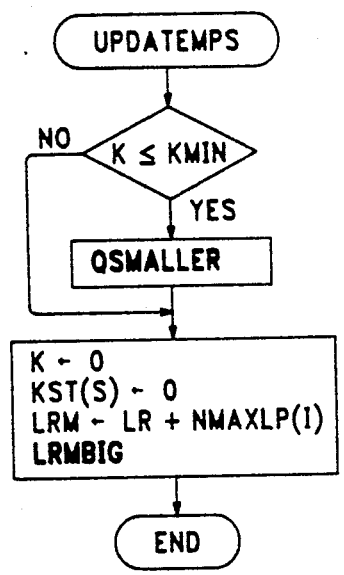
Figure 13:
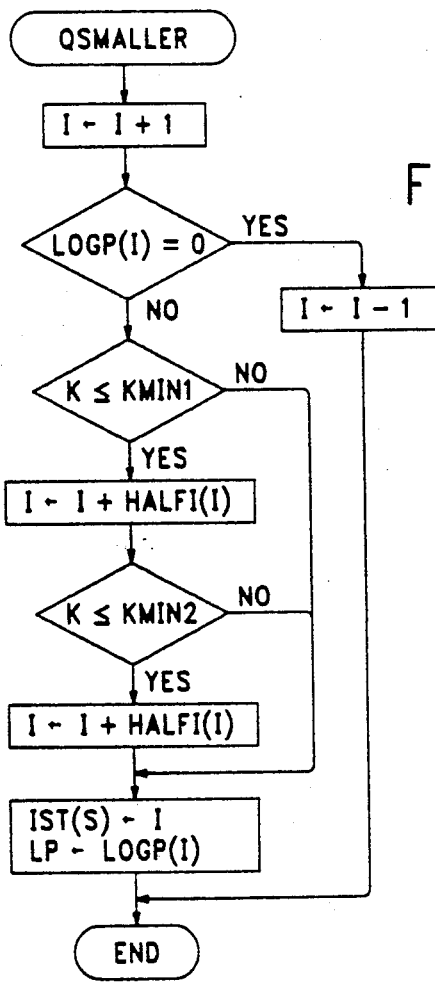

CHANGESTATE (FIG. 11) is called to save and restore (a) a pointer to the probability table, (b) parameters required for probability adaption, and (c) the MPS symbol. Once the context state is set, LR is increased by LP, as in FIG. 4. (Note the sign conventions for LR and LP.)

The adjusting of LR serves as a count indicator in the following way. If R is the current range and P is the MPS probability, the new range R' after n events which happen to be MPS's is:

$$R' = R*P*P*\ldots, P=R*P^n$$

In logarithmic form, this becomes:

$$\log R' = \log R + n \log P$$

which can also be represented as:

$$|\log R'| = |\log R| + n |\log P|$$

The number n is then set forth as:

$$n |\log P| = |\log R'| - |\log R|$$

Hence, the adjustment of R in logarithmic terms (i.e., LR) is in units of $|\log P|$. When nmax log P=n log P, the probability adaption discussed herein and in the co-pending application is triggered. The YN decision is compared to MPS, and if an MPS has occurred, the coding is essentially complete. However, range checking must now be done to see if LR is too big. In this regard it is noted that event counting is performed in movements of log P rather than by 1. That is, instead of counting so that n⇌n+1, the count for the MPS increments by log P with each occurrence of an MPS symbol. LR is compared to a quantity LRM, which is a measure of the total symbol count required before a meaningful check can be made on the current probability. If LR does reach LRM, a call is made to UPDATEMPS, where checks are made to see if a new (smaller Q) probability is required. The UPDATEMPTS routine is described in the co-pending application which, it is noted, is directed to a single context state.

If YN is not equal to MPS, an LPS has occurred. In this case the LPS counter, K, is incremented and a measure of the number of symbols encountered in the current block, DLRM, is saved. RENORM is then called to do any renormalization of LR and X required to guarantee that the integer part of LR is less than 8. After renormalization, ANTILOGX is called to calculate the amount DX which must be added to X to shift the compressed data to the base of the LPS probability interval. Then XCARRY is called to handle any carry which might have occurred when DX was added to X, and finally, UPDATELPS is called to take care of any probability adaptation (larger Q). LRM is then calculated from the saved DLRM and the new LR value.

C. LOG DECODER (FIG. 10)

The decoder also has some significant additions relative to the conceptual version of FIG. 4. As in the encoder, if the context state has been changed from the last decoder call, CHANGESTATE is invoked. A comparison measure LRT is specified as the smaller of LRM and LX. LRT must be updated if the context state is changed. LP is then added to LR to decrease the range, and the YN answer is defaulted to MPS. LR is then compared to LRT and, if smaller, the MPS symbol decode is complete. Since LRT is the smaller of LRM and LX, the comparison of LR against LRT serves a dual purpose. If LX is larger than LRM, passing the test means that the probability adaptation data block size was reached and that checking for probability adaptation must be done. If LX is not bigger than LR, either an LPS symbol has been decoded or renormalization is required. The count of symbols for the current data block is saved in DLRM and the range measure LR is then renormalized. If LX is still greater than LR (LX and LR are the magnitude of log X and log R), only a renormalization is needed. However, LR must still be compared to LRM in the event that UPDATEMPS is required.

If LX is equal to or less than LR, an LPS has been decoded. The LPS count, K—which is employed in probability adaptation—is incremented; the YN answer is switched to LPS; and the antilog table is used to calculate DX, which is then subtracted from X. A new LX is then calculated; the probability adaptation code is called; and finally LRM is updated. For all paths which require a new value of LRM, UPDATELRT is called to calculate a new value of LRT.

D. CHANGESTATE (FIG. 11)

CHANGESTATE saves the total symbol count DLRST(S), required for the probability adaptation in that state. (The LPS count K and the pointer to the probability table—i.e., log P, log Q/P, etc.,—are saved each time they are changed and do not need to be saved here.) The pointer S is then shifted to the new context state NS. The LPS count K, the probability table pointer I, and the current MPS are restored. The value of the current log P is represented by LP (which is preferably saved in a register), and LRM is calculated from the current LR and the saved measure of the symbol count is this context state. LRMBIG is then called to do any renormalization that might be needed.

E. UPDATEMPS (FIG. 12)

UPDATEMPS checks to see if the probability needs to be adjusted. If the probability confidence measure so indicates, QSMALLER is called to adjust the probability table pointer to a smaller Q value. UPDATEMPS then resets the LPS count, K; stores the new value in KST(S); and adjusts the comparison value LRM to the end of the new block of symbols. LRMBIG is then called to see if any renormalization is required before proceeding.

F. QSMALLER (FIG. 13)

QSMALLER performs the probability adaptation as described in the co-pending cited patent application. Basically, if the LPS count K is too small, the probability table pointer I is adjusted to a new position (smaller Q) which restores confidence in the probability estimate. The last entry in the table of log P values is a zero. This is an illegal value which is used as a stop. If zero is encountered, the index is backed up to the last valid entry in the table. It is also noted that whenever I is changed, the new index is saved in the context state information. The value of LP must also be updated from LOGP(I).

Figure 14:
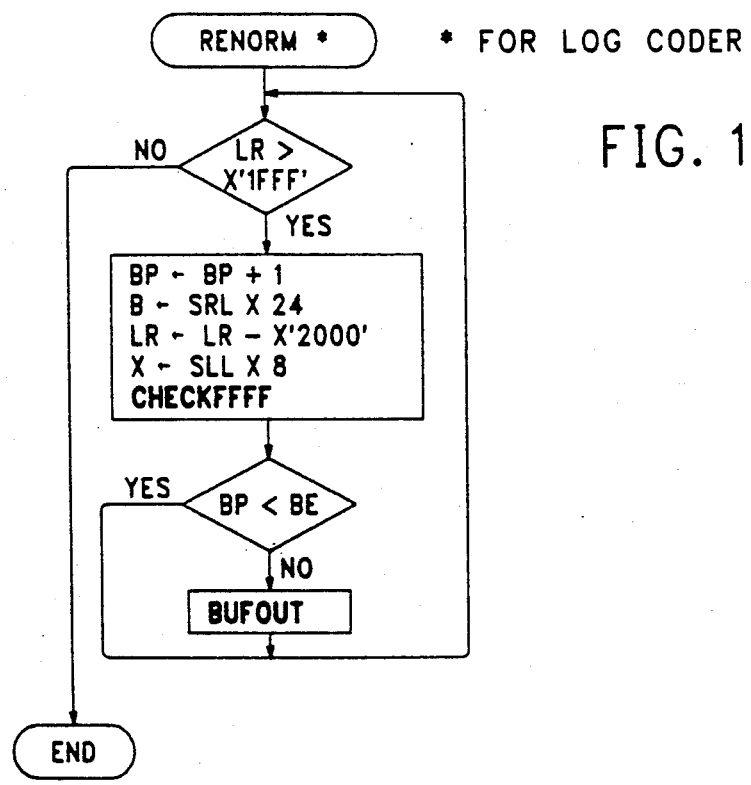
Figure 15:
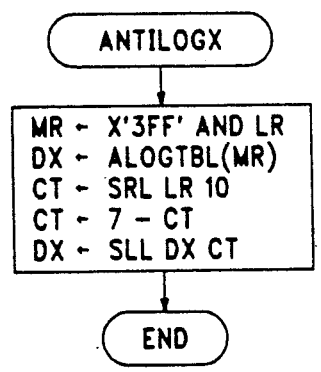
Figure 16:
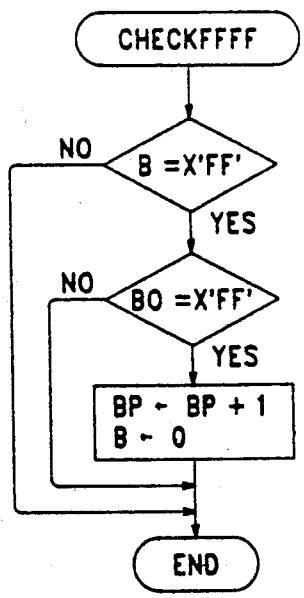
Figure 17:
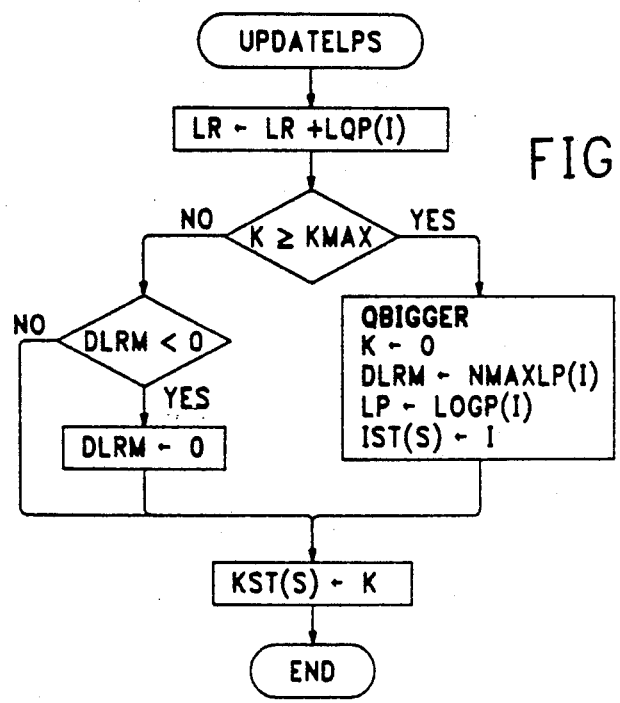
Figure 18:
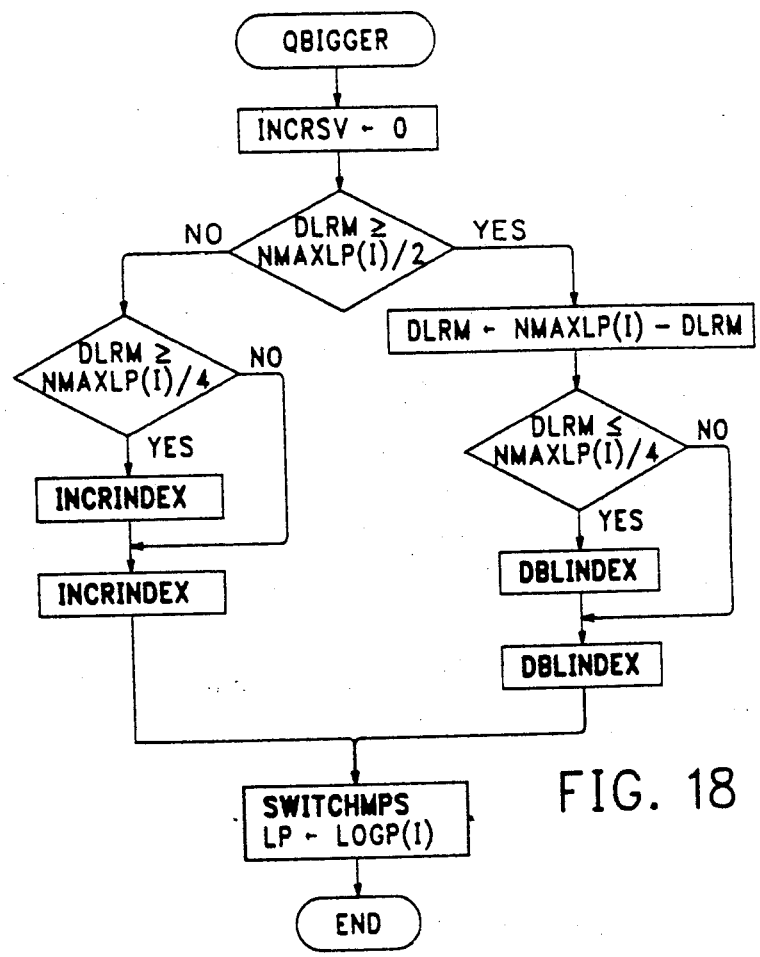
Figure 19:
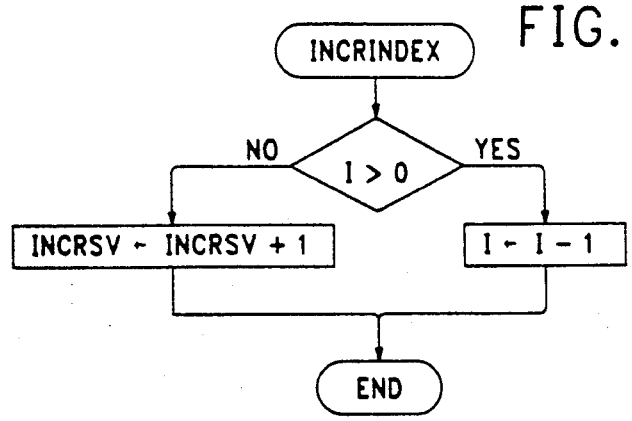
Figure 20:
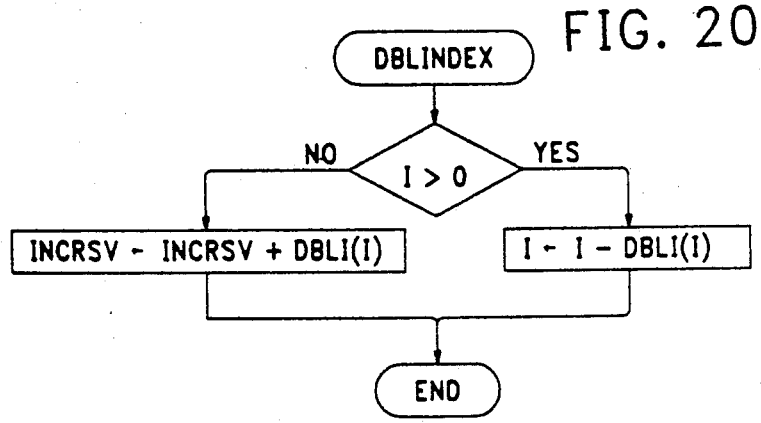
Figure 21:
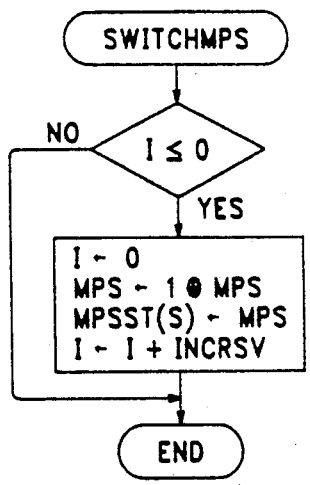
Figure 22:
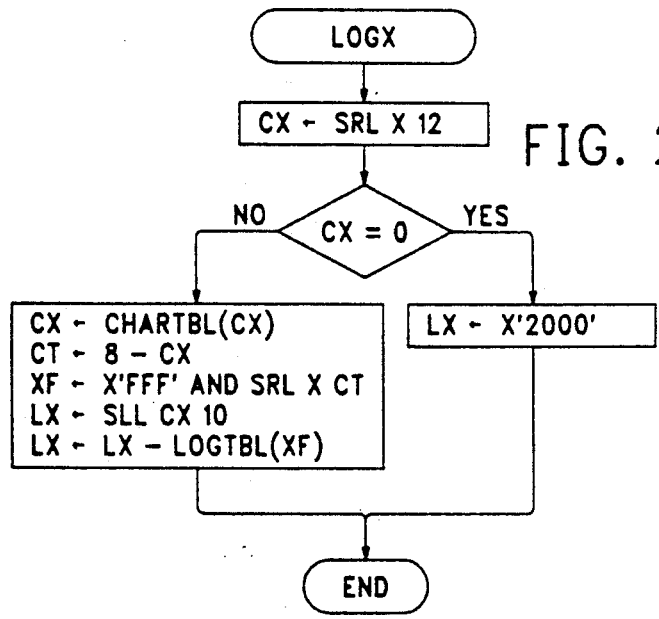

G. RENORM—for the log encoder (FIG. 14)

RENORM does the renormalization of LR and X, thus preventing LR from overflowing the allowed 15 bit range. Each time the characteristic part of LR (a log magnitude quantity) reaches or exceeds 8, one byte can be shifted from X to the compressed data stream buffer. The byte pointer BP is incremented to point to the next byte position; the high order byte in X is stored in B (byte pointed to by BP); and LR is decremented by the integer value of 8 (i.e., hex 2000). At that point the bytes remaining in X can be shifted left by 8 bits. Each time a new byte is added to the buffer, CHECKFFFF is called to see if a bit pattern of hex FFFF has been created in the buffer. If so, a byte must be stuffed in the buffer to block carry propagation. This is a form of bit stuffing as described in the aforementioned Rissanen-Langdon article entitled "Arithmetic Coding".

Each time a byte is added to the buffer a check is made to see if the buffer is full. If so, BUFOUT is called to transmit the contents of the buffer. This loop is repeated until the integer part of LR is less than 8.

H. ANTILOGX (FIG. 15)

ANTILOGX calculates the antilog of LR wherein DX—the amount which must be added to the code stream in the encoder and subtracted from the code stream in the decoder—is obtained. The mantissa of LR (MR) is first obtained from the low 12 bits of LR. (Actually, 1-MR is the true mantissa, but the antilog table is inverted to avoid this subtraction). MR is used to index into the ANTILOG table (see function 'maketbls' in Appendix 1.) CT, the integer part of LR, is obtained by shifting LR right by 10 bits. The true characteristic would be calculated as 8-CT if one unit were not already imbedded in the MR value. Consequently, the output of the ANTILOG table only needs to be shifted by 7-CT to provide DX.

J. CHECKFFFF (FIG. 16)

As described earlier, CHECKFFFF looks for hex FFFF patterns on byte boundaries in the code stream. If the pattern is found, a zero byte is stuffed in the code stream following the FFFF pattern.

K. UPDATELPS (FIG. 17)

UPDATELPS is called when an LPS occurs. It first adjusts the range measure, LR, to that of the LPS. It then checks to see if probability adaptation is required by comparing the count K with Kmax. If K is greater or equal to Kmax, QBIGGER is called to shift the probability table pointer to a larger Q. The LPS count K is then zeroed and the block counter DLRM reset. The new probability table index is stored in the context state information and LP is updated.

If the current LPS count is within the confidence limits (K<Kmax), the total count measure DLRM is checked to see if it is negative. If so, it is clamped to zero.

The new K value is stored in the context state information as the last step.

L. QBIGGER (FIG. 18)

QBIGGER moves the probability table index to a larger Q. If required, it also interchanges the definitions of LPS and MPS. Since the probability table does not extend beyond Q=0.5 (the symbols are interchanged instead), there is a discontinuity in the probability adjustment procedure at Q=0.5. This discontinuity is approximately compensated for by saving the unused table index increment in INCRSV and using it (in SWITCHMPS) to adjust the index to a smaller Q after the MPS-LPS interchange. The test sequence and table pointer adjustment algorithm are described in the previously cited patent application. After adjustment of the index I a new LP value is set.

M. INCRINDEX (FIG. 19)

INCRINDEX shifts the probability table index to a larger Q if possible. If the pointer is already at the top of the table (I=0), the unused increment is saved for use in SWITCHMPS.

N. DBLINDEX (FIG. 20)

DBLINDEX attempts to adjust the probability table index so as to double the value of Q. If it can not do so, the index change is saved in INCRSV for use in SWITCHMPS.

P. SWITCHMPS (FIG. 21)

SWITCHMPS checks to see if the probability table index is at the top of the table. If so, it is time to interchange the MPS and LPS symbols. The revised definition of the MPS is stored in the context state information, and any unused table adjustment is now added to I to shift the new interchanged Q to a smaller value.

Q. LOGX (FIG. 22)

LOGX calculates log X for use in the decoder. Noting that X is a 20 bit binary fraction, the characteristic is first obtained by shifting X until only the eight most significant bits of X are present. A maximum of 8 bits can be used for the characteristic, as at least 12 bits must be retained in X for it to align properly with the output of the antilog table. If the eight bits (CX) that define the characteristic are all zero, the value of LX is defaulted to hex 2000, a lower limit to the true value. For the conventions used, hex 2000 is equivalent to a characteristic of −8. If CX is not zero, it is converted to the true characteristic by a lookup table (chartbl in the function 'maketbls' in Appendix 1). After the shift by CT, the X value has 13 bits, but the leading bit is always 1 and is truncated by the 'AND' with hex FFF. This provides the address to logtbl (see 'maketbls') where the log of X is tabulated. The output of the log table is subtracted from the characteristic of X, properly shifted to conform to the conventions used for the logs.

Figure 23:
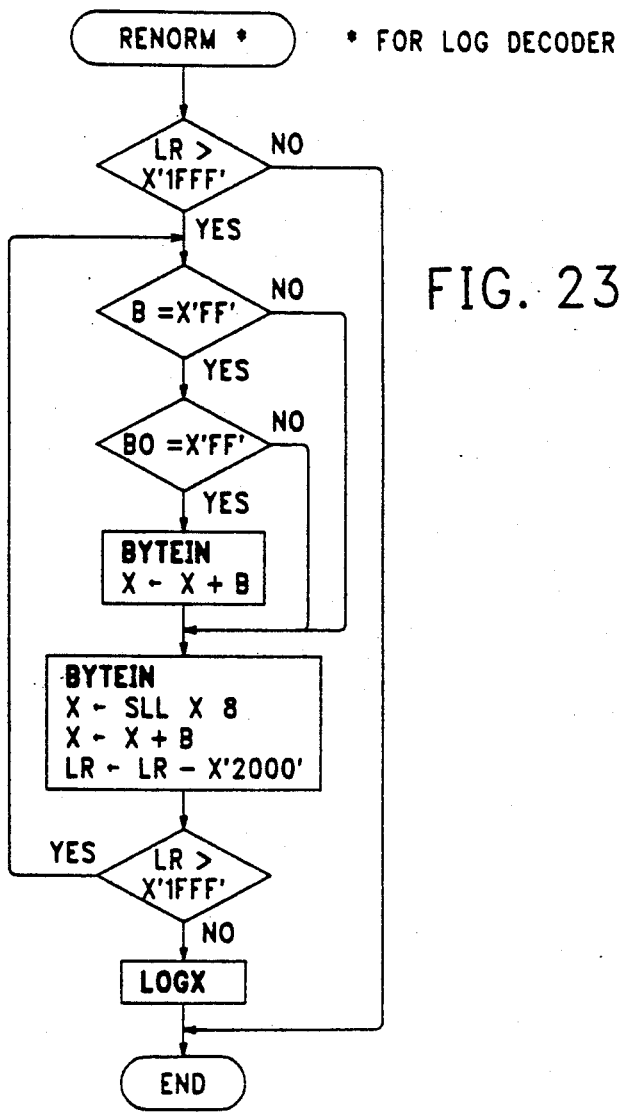
Figure 26:
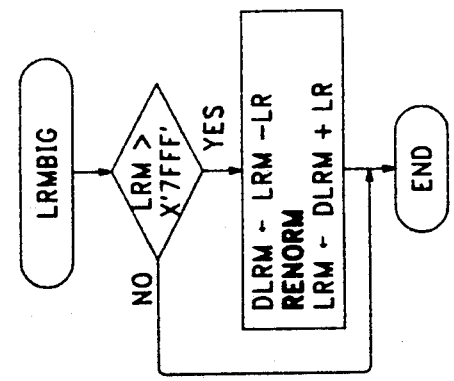
Figure 25:
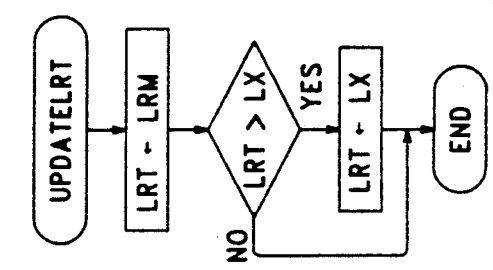
Figure 24:
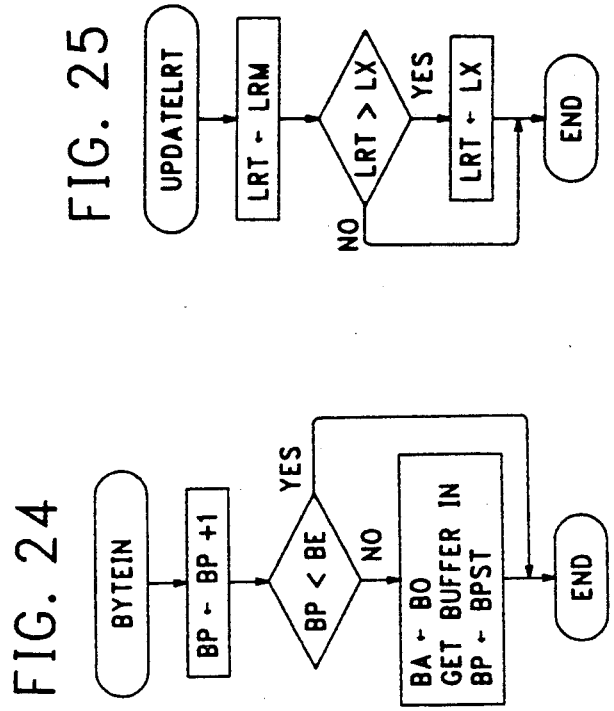
Figure 27:
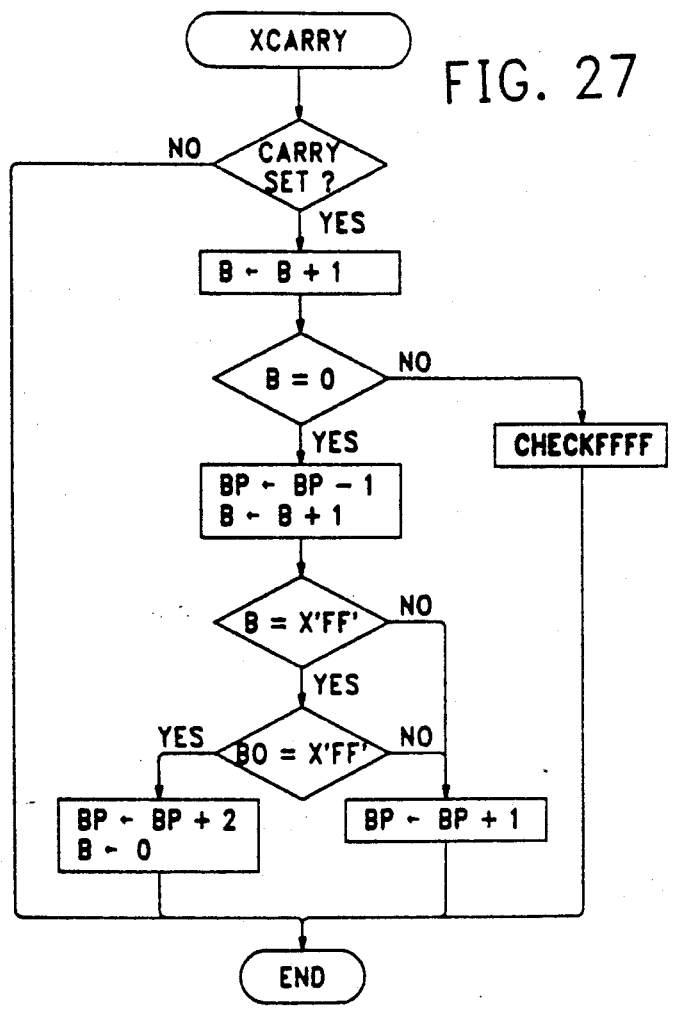
Figure 30:
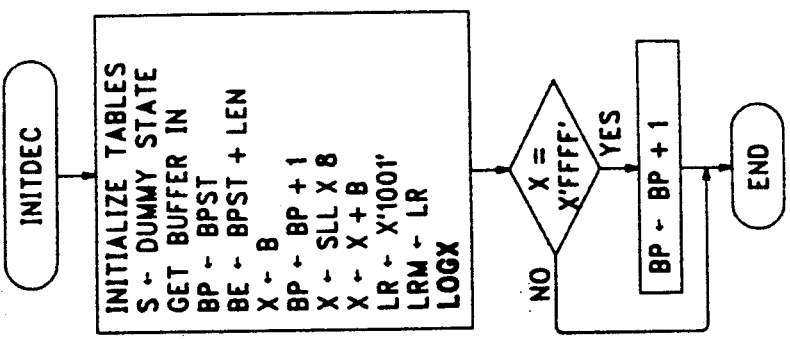
Figure 29:
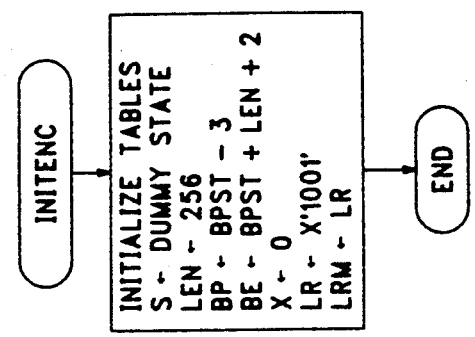
Figure 28:
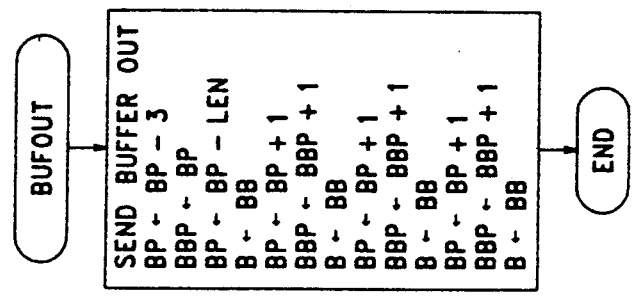
Figure 31:
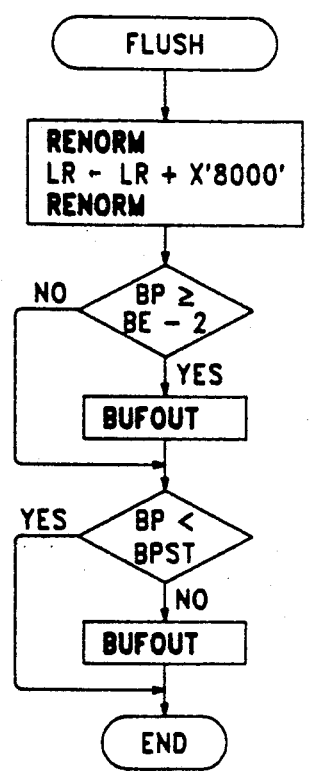

R. RENORM—for the log decoder (FIG. 23)

If the LR value is hex 2000 or larger, renormalization is required before an LPS symbol can be decoded. RENORM is also called when LRM gets too large to fit in 15 bits. RENORM's first task is to check for the hex FFFF pattern in the code stream. If the previous two bytes read from the buffer (B and BO) were both hex FF, the next byte will contain only a possible carry which must be read and added to the present value of X. After this special situation is taken care of, X is shifted by 8 bits and the next byte read and added in. Each time a non-carry byte is read from the code stream, LR is decremented by hex 2000, the change in the characteristic required for an 8 bit shift in X and R. This process is repeated until the integer part of LR is less than 8. After renormalization, a new value of LX is obtained in the call to LOGX.

S. BYTEIN (FIG. 24)

Each time a byte is read from the code stream buffer the pointer BP is first incremented and a check made to see if it is at the end of the buffer (BE). If so, the final byte in the buffer BO is moved to the byte just preceding the start of the buffer BA in order to preserve any possible hex FFFF patterns. Then a new buffer is obtained before returning with the pointer at the byte to be read.

T. UPDATELRT (FIG. 25)

LRT is the parameter required in the comparison with LR in the decoder. The test has two functions: first to detect the occurrence of an LPS, and second to see if the current block count is at the point where a probability update may be required. LX is the measure for the first test, LRM for the second. LRT is always set to the smaller of the two.

U. LRMBIG (FIG. 26)

This code makes sure that LR does not overflow a 15 bit range. If LRM (which is always greater or equal to LR) exceeds hex 7FFF, the 16th bit has been set and renormalization is required. Note that DLRM, the symbol count in the current block, is saved before renormalization so that the probability adaptation is not disturbed.

V. XCARRY (FIG. 27)

XCARRY checks to see if the latest addition to X in the encoder has caused a carry. If so, the carry is propagated to the last byte written into the code stream buffer. That byte is checked for overflow, and any hex FFFF pattern that might have been created is also handled. This technique has been described in a co-pending patent application to J. L. Mitchell and G. Goertzel entitled, "Symmetrical Adaptive Data Compression/Decompression System" which is incorporated into this application by reference to the extent, if any, required to fully disclose the present invention.

W. BUFOUT (FIG. 28)

BUFOUT has the task of transmitting a complete buffer and moving the last three bytes written to the buffer back to the beginning of the buffer. Depending on the circumstances, the bytes moved may or may not be part of the next buffer, but may be required for CHECKFFFF and XCARRY.

X. INITENC (FIG. 29)

INITENC does the initialization for the encoder. It first sets up the tables required, such as the state tables and the various log, antilog and probability tables. It points the state pointer at a dummy state so that a call to CHANGESTATE is forced when the first symbol is encoded. It sets the length of the buffer for the code stream to 256 bytes (an arbitrary but convenient choice), and initializes the pointer to that buffer to 3 bytes before the actual start of the buffer to be sent. The initialization conditions create two dummy bytes of data that are not required to be sent. The pointer is updated before a byte is written; hence an offset of 3 at initialization is needed. Zeroing Z zeros both the 20 fractional bits and the 12 integer bits, creating 12 bits in the code stream which are guaranteed to be zero. LR should, in principle, be initialized to 1, giving a range slightly smaller than 1. However, by initializing to hex 1001, an extra 4 bit shift of X is forced, creating exactly two bytes of zeros. These become history for the carry propagation code, but are never sent. The pointer BE is set to point two bytes beyond the last byte in the actual buffer being sent. Note that CHECKFFFF may move the buffer pointer beyond this point before the contents of the buffer are actually sent. Note that setting LRM to LR is not necessary. The CHANGESTATE call overrides this and initializes LRM with LR+DLRST(I). Currently, the initialization of all context states is to IST(S)=0, MPSST(S)=0, KST(S)=0, and DLRST(S)=NMAXLP(0). Thus, all states start a new block with P=0.5 and MPS=0.

Y. INITDEC (FIG. 30)

INITDEC does the initialization for the decoder. All states are initialized as in the encoder. Note that again a call to CHANGESTATE is forced. The initialization of X is from the buffer of compressed data. It is noted, however, that LR is initialized to match to the encoder. This forces the extra 4 bit shift required to match the shift in the encoder. LX is calculated by LOGX from the actual code stream data. If the initial two bytes happen to create the hex FFFF pattern, the next zero byte must be skipped.

Z. FLUSH (FIG. 31)

FLUSH is called after the last symbol has been encoded to 'flush' out any residual compressed data from X. By calling RENORM all but the last 4 bytes are sent. Those 4 bytes are forced out by adding hex 8000 to LR and calling RENORM again. Then any buffers or partial buffers remaining must be sent.

V. Tests of the Log Coder

Tests of the present encoder and decoder have included tests on large image data files of both grayscale and facsimile data. The results show that the encoder and decoder are running without error, and that performance is slightly better (less than 1% better) than the arithmetic coder described in the Mitchell-Goertzel patent application referenced hereinabove. It should be noted, however, that no attempt was made to initialize the log coder to the expected skew as was done in the coder described in the Mitchell-Goertzel patent application referenced hereinabove. According to the test performed, a grayscale encoder according to the present invention produces context states with remarkably stable and well behaved statistical distributions.

The results of a detailed test are given in Appendix 5 for a 256 bit data file. This test contains a comprehesive breakdown of the operation of both the encoder and decoder.

The Log Encoder/Decoder system is designed for implementation on both 16 and 32 bit processors. As noted hereinabove, the operations are structured to make the computational effort scale with the output of compressed data. When working with large probability skews in a single context state, the encoding process reduces essentially to a single 16 bit addition, a test for the type of symbol encountered, and a test for overflow of the allowed range. At the same time, coding efficiency is not sacrificed. Unless the skews are very large (and very little coded data is being generated) the coding efficiency is within 0.2% of the entropy limit, given a correctly specified probability.

VI. Alternative Embodiments

While the invention has been described with reference to preferred embodiments thereof, it will be understood by those skilled in the art that various changes in form and details may be made without departing from the scope of the invention.

For example, as suggested hereinabove, the described embodiment includes probability adaptation. That is, as data is processed, the probabilities are adjusted in response thereto. A number of the functions detailed hereinabove relate to this feature. The present invention may however also be practiced without probability adaptation—wherein probabilities do not adapt based on prior inputs—in which event an artisan of ordinary skill may readily omit or alter the operations as appropriate.

Moreover, although described in the context of a grayscale application and a general facsimile application, the teachings of the present invention extend also to other environments in which the product of probabilities are required. Such environments include, but are not limited to, weather calculations, language applications (such as speech recognition), and other problems that may characterized in a probabilistic manner. The result of reducing computational requirements by converting to and computing in the log domain has general use and is intended to have broad scope of application.

It is further noted that, although set forth with a binary arithmetic coding preferred embodiment, the present invention may also be applied to environments in which more than two outcomes (or answers) may result from a decision. In such a case, the multisymbol outcome may be represented as a group of binary decisions or some alternative approach employing the teachings of the invention may be implemented.

It is also observed that the logarithmic domain set forth hereinabove is preferably the base-2 logarithmic domain, although some of the logarithms may be taken in other bases. In this regard, base-2 logarithms are notated by $\log_2$ or log2.

It is further noted that the number line may be ordered with the P-related values at the lower end or with the Q-related values at the lower end in accordance with the invention.

Appendix 1.  Software Implementation of the Log Encoder/Decoder in PDS

Storage and Register definitions:

register i b1 p

```
  (in probtbl based on i)
  based b1
    half logp;             (log p at index i)
    half lqp;              (log q - log p)
    half nmaxlp;           (nmax * lp)
    half nmx;              (not used currently)
    byte halfi;            (pointer to q halved)
    byte dbli;             (pointer to q doubled)

common
    pointer s;             (pointer to statistics for this state)
    (statistics based on s (old state initially))
    pointer ist(base s);   (index into probtbl)
    half dlrst(base s+4);  (lrm-lr+lp)
    byte mpsst(base s+6);  (most probable symbol)
    byte kst(base s+7);    (lps count)

byte mps;              (most probable symbol value - 0 or 1)
    byte yn;               (symbol to be coded)
    byte k;                (least probable symbol count)
    byte kmin2;            (LPS count for reduction of Q by 4)
    byte kmin1;            (LPS count for reduction of Q by 2)
    byte kmin;             (largest LSP count for smaller Q)
    byte kavg;             (expected average LPS count)
```

| | |
|---|---|
| byte kmax; | (smallest LPS count for larger Q) |
| word x; | (finite precision window on code stream) |
| half lp; | (minus log p) |
| half lr; | (minus log of the range) |
| half dlrm; | (difference between lrm and lr) |
| half lrm; | (maximum lr before change index) |
| half lrt; | (decoder - minimum of lrm and lx) |
| half lx; | (decoder - log x) |
| word mr; | (mantissa of range for calculating antilog) |
| word dx; | (antilog of lr) |
| word ct; | (decoder - number of bits to shift for logx) |
| word cx; | (decoder - characteristic of x) |
| half xf; | (fractional part of x) |
| word xsv; | (saves finite precision window on code stream) |
| half x1sv(at xsv); | (high order half word of xsv) |
| half x2sv(at xsv+2); | (low order half word of xsv) |
| half lrsv; | (saves log of the range-only low 16 bits used) |
| word len; | (length of compressed buffer) |
| pointer rc; | (return code pointer) |
| pointer bp; | (pointer to b) |
| pointer bbp; | (pointer to bb) |
| pointer be; | (end of compressed buffer) |
| pointer bpst; | (pointer to start of compressed buffer) |
| pointer alogaddr; | (address of alogtbl) |
| pointer logaddr; | (address of logtbl) |
| pointer probaddr; | (address of probtbl) |
| pointer charaddr; | (address of chartbl) |
| word stats(300); | (statistics area - 99 states) |
| word padding(100); | (pad for now) |
| byte buffer(300); | (compressed buffer) |
| byte cbuffer(at buffer+4); | (guarantee padding before and after..) |
| byte b(base bp); | (byte pointed to by bp) |
| byte bb(base bbp); | (byte pointed to by bbp) |
| word cfile; | (file cntl block) |
| word ifile; | (file cntl block) |
| word rfile; | (file cntl block) |
| pointer linksv; | (saves LINK reg in local subroutine calls) |
| word incrsv; | (save extra increments at MPS exchange) |

Replace Statement Definitions applying to both Encoder and Decoder:

replace tdi; 10 endrepl    :(bytes representing 1 unit change in tbl)

replace bufout;
  d0=writec bpst rc          :(send out a buffer of coded data)

```
    bp=-bp 3                    :(point back three bytes)
    bbp=bp                      :(copy into bbp)
    bp=-bp expl len             :(point back one buffer length)
    b=bb                        :(copy a byte)
    bp=+bp 1                    :(point to next byte to be copied)
    bbp=+bbp 1                  :(point to next receiver)
    b=bb                        :(copy a byte)
    bp=+bp 1                    :(point to next byte to be copied)
    bbp=+bbp 1                  :(point to next receiver)
    b=bb                        :(copy a byte)
    bp=+bp 1                    :(point to next byte to be copied)
    bbp=+bbp 1                  :(point to next receiver)
    b=bb                        :(copy a byte)
  endrepl
  replace checkffff;
    if & (b = hex ff) (byteat -bp 1=hex ff)   :(if both bytes FF)
      bp=+bp 1
      b=0
    endif
  endrepl replace qsmaller;
    i=+i tdi                    :(next slot in probtbl)
    if logp=0                   :(if end of table)
      i=-i tdi                  :(back up)
    else                        :(see if q should be even smaller)
      if k¬>kmin1               :(really confident interval wrong)
        i=+i expl halfi
        if k¬>kmin2             :(absolutely sure interval wrong)
          i=+i expl halfi
        endif
      endif
      ist=i                     :(update state storage)
      lp=logp                   :(update counting unit)
    endif
  endrepl replace switchmps;
    if i lle probaddr           :(MPS change - fell off end of table)
      i=probaddr                :(force back in range)
      mps=eor mps 1             :(interchange def of MPS)
      mpsst=mps                 :(save new mps)
      i=+i incrsv
    endif
  endrepl
```

```
replace dblindex;
  if i lgt probaddr
    i=-i exp1 dbli
  else
    incrsv=+incrsv exp1 dbli
  endif
endrepl replace incrindex;
  if i lgt probaddr
    i=-i tdi
  else
    incrsv=+incrsv tdi
  endif
endrepl replace qbigger;
  incrsv=0                          :(zero increment counter)
  if dlrm ¬< srl nmaxlp 1           :(if at least half of nmax left)
    dlrm=-nmaxlp dlrm               :(number of events in block)
    if dlrm ¬> srl nmaxlp 2         :(if n < 1/4 nmax)
      dblindex
    endif
    dblindex
  else
    if dlrm ¬< srl nmaxlp 2         :(if (nmax-n) >= 1/4 nmax)
      incrindex
    endif
    incrindex                       :(next slot in probtbl)
  endif
  switchmps
  lp=logp                           :(update counting unit)
endrepl replace updatemps;
  if k ¬> kmin                      :(if fluctuation encountered)
    qsmaller
  endif
  k=0                               :(zero lps count)
  kst=0                             :(store new k)
  lrm=+lr nmaxlp                    :(init new interval)
  lrmbig                            :(check to see if lrm is too big)
endrepl replace updatelps;
  lr=+lr lqp                        :(new range following LPS)
```

```
  if k ¬< kmax                    :(if fluctuation encountered)
    qbigger                       :(make lps probability bigger)
    k=0                           :(zero lps count)
    dlrm=nmaxlp                   :(restart interval count)
    lp=logp                       :(update counting unit)
    ist=i                         :(store new probtbl index)
  else
    if dlrm<0                     :(would have hit updatemps if neg)
      dlrm=0                      :(clamp interval count)
    endif
  endif
  kst=k                           :(store new k in state table)
endrepl replace logx;
  cx=srl x 12
  if cx=0
    lx=hex 2000
  else
    cx=expl byteat +charaddr cx   :(characteristic=# of leading zeros+1)
    ct=-8 cx
    xf=expl and hex fff srl x ct  :(fract part of x in lx register)
    xf=sll xf 1                   :(double for index into halfword table)
    xf=halfat +logaddr expl xf
    lx=expl sll cx 10
    lx=-lx xf                     :(add mantissa to characteristic)
  endif
endrepl replace antilogx;
 :(mr=-hex 400 and hex 3ff lr ---true mantissa)
  mr= expl and hex 3ff lr         :(negative mantissa - entry to antilog)
  mr=sll mr 1                     :(index into half word table)
  dx=expl halfat +alogaddr mr     (magnitude of fraction to be added to x)
  ct=srl expl lr 10               :(negative characteristic)
  ct=-7 ct                        :(mantissa negative, net x shift required)
  dx=sll dx ct
endrepl replace lrmbig;
  if lrm lgt hex 7fff             :(if carry beyond 15 bits)
    dlrm=-lrm lr                  :(save difference)
    call renorm                   :(renormalize log R, shift X)
    lrm=+dlrm lr                  :(restore difference)
  endif
endrepl
```

```
replace updatemps;
  if k ¬> kmin                    :(if fluctuation encountered)
      qsmaller
    endif
    k=0                           :(zero lps count)
    kst=0                         :(store new k)
    lrm=+lr nmaxlp                :(init new interval)
    lrmbig                        :(check to see if lrm is too big)
  endrepl replace changestate;
    dlrm=-lrm lr                  :(find difference)
    dlrst=dlrm                    :(save delta to end of current index i)
    s=ns                          :(save current state)
   :(*** restore status of new state ***)
    i=ist                         :(restore current index into register)
    k=kst                         :(restore lps count)
    mps=mpsst                     :(get current mps for new state)
    lp=logp                       :(put current lp into register)
    lrm=+lr dlrst                 :(new maximum)
    lrmbig                        :(see if lrm carry)
  endrepl Encoder:

function encoder ns(p) yn(b);
    replace xcarry;
      b=+b 1
      if b=0                      :(if add to 1st byte gave carry)
        bp=-bp 1                  :(point to previous byte)
        b=+b 1                    :(add in the carry)
        if & (b=hex ff) (byteat -bp 1=hex ff)
          bp=+bp 2 b=0                     :(add 2nd 0 to code stream)
        else
          bp=+bp 1                :(back to last byte added)
        endif
      else                        :(1st byte add did not cause carry)
        checkffff                 :(check for possible carry)
      endif                       :(if carry)
    endrepl
    if s¬=ns                      (if changing state)
      changestate                 (save old delta, get new parms, renorm)
    endif
```

```
    lr=+lr lp                    (increment log R)
    if yn=mps                    (if MPS encountered)
      if lr lge lrm              (if changing index)
        updatemps                (set up parms for next index)
      endif
    else                         (LPS occurred)
      k=+k 1                     (count the LPS)
      dlrm=-lrm lr               (save difference)
      call renorm                (renormalize log R, log R max, shift X)
      (*** code a LPS - get characteristic and mantissa ***)
      antilogx                   (calculate antilog, cr, mr and dx)
      xsv=x                      (save x in case carry occurs)
      x=+ x dx                   (shift antilog to align with x and add)
      if x llt xsv               (a carry must have occurred)
        xcarry                   (propagate carry to buffer if x carry)
      endif                      (if x carry)
      updatelps                  (calc new lr, new index for lps path)
      lrm=+dlrm lr               (get true log R max)
    endif                        (if MPS, else LPS)
  subr renorm
      linksv=LINK
      (renormalize logR so that the characteristic is < 8)
      begin
        if lr lgt hex 1fff       (if renormalization needed)
          bp=+bp 1                (point to new slot in buffer)
          b=expl srl x 24         (h.o. byte to be stored in buffer)
          lr=-lr hex 2000         (subtract 8 from characteristic)
          x=sll x 8
          checkffff
          if bp lge be            (be points one past real buffer end)
            bufout                (ship one buffer of compressed data)
          endif
          repeat
        endif                     (if renormalization needed)
      endbegin
      LINK=linksv
    endsubr
  endfn Decoder:

function decoder ns(p);
    replace updatelrt;
      lrt=lrm                    :(set test point for lr)
      if lrt lgt lx              :(if greater than logx)
```

```
        lrt=lx                      :(make test point log x)
      endif
    endrepl
    replace bytein;
      bp=+bp 1                      :(point to next byte in buffer)
      if bp lge be                  :(see if at end of buffer)
        byteat -bpst 1=byteat -bp 1 :(copy last byte for reference)
        d0=readc bpst rc            :(read in a new buffer of coded data)
        bp=bpst                     :(point to start of buffer)
      endif
    endrepl
    if s¬=ns                        (if changing s)
      changestate                   (save old delta, get new parms, renorm)
      updatelrt                     (set lrt to min of lrmax, lx)
    endif
    lr=+lr lp                       (increment log R)
    yn=mps                          (expect mps)
    if lr lge lrt                   (may be a LPS)
      if lx lgt lr                  (MPS, but time to change index)
        updatemps                   (set up parms for next index)
      else                          (may be LPS)
        dlrm=-lrm lr                (save difference)
        call renorm                 (renormalize log R, shift x)
        if lx > lr                  (wasn't LPS, just renormalization)
          lrm=+dlrm lr              (recalc lrm)
          if lr ¬< lrm              (see if time to change index after all)
            updatemps               (set up parms for next index)
          endif
        else                        (definitely a LPS)
          k=+k 1                    (count the LPS)
          yn= eor yn 1              (make answer lps)
          (*** decode a LPS - get characteristic and mantissa ***)
          antilogx                  (calculate antilog, cr, mr and dx)
          x=- x dx                  (shift antilog, align with x and sub.)
          logx
          updatelps                 (calc new lr, new index for lps path)
          lrm=+dlrm lr              (get true log R max)
        endif
      endif                         (if lx lgt lr )
      updatelrt                     (set lrt to min of lrmax, lx)
    endif                           (if lrt lle lr - may be LPS)
    return yn                       (return the symbol decoded)
  subr renorm
    (renormalize log R so that the characteristic is < 8)
    linksv=LINK
```

```
        if lr lgt hex 1fff           (if characteristic >=8, renormalize)
          begin                      (renormalization loop)
            if & (b=hex ff) (byteat -bp 1=hex ff)
              bytein                 (point to next byte in buffer)
              x=+x expl b            (add any carry to x)
            endif
            bytein                   (point to next byte in buffer)
            x=sll x 8                (shift x up 8 bits)
            x=+x expl b              (add new byte of coded data to x)
            lr=-lr hex 2000          (subtract 8 from characteristic)
            if lr lgt hex 1fff       (if further renormalization needed)
              repeat
            endif
            logx                     (calculate log of x)
          endbegin
        endif                        (if renormalization needed)
        LINK=linksv
      endsubr
    endfn Other Subroutines:

function flush;
(This function outputs the final bytes of x so that the decoder
is guaranteed to have enough unique data.)
call renorm                          (renormalize log R, log R max, shift X)
lr=+lr hex 8000                      (force last 4 bytes)
call renorm
if bp lge -be 2                      (if data beyond normal end of buffer)
  bufout
endif
if bp llt bpst                       (nothing to ship)
  return;
endif
begin                                (fill rest of buffer with zeros)
  bp=+bp 1
  if bp llt be
    b=0
    repeat
  endif
endbegin
bufout
subr renorm                          :(same as renorm in encoder)
  (renormalize logR so that the characteristic is < 8)
  linksv=LINK
```

```
          begin
            if lr lgt hex 1fff         (if renormalization needed)
              bp=+bp 1                 (point to new slot in buffer)
              b=expl srl x 24          (h.o. byte to be stored in buffer)
              lr=-lr hex 2000          (subtract 8 from characteristic)
              x=sll x 8
              checkffff
              if bp lge be             (be points one past real buffer end)
                bufout                 (ship one buffer of compressed data)
              endif
              repeat
            endif                      (if renormalization needed)
          endbegin
          LINK=linksv
        endsubr
endfn function maketbls;
  (set up log, antilog, and characteristic tables for encoder, decoder)
  static
    half alogtbl(1024);
    half logtbl(4096);
    half probtbl(250);
    byte chartbl(512);

(init alogtbl-antilog table with QL=10, QA=12)
init alogtbl
hex 2000 hex 1ffd hex 1ff7 hex 1ff1 hex 1fec hex 1fe6 hex 1fe1 hex 1fdb
hex 1fd6 hex 1fd0 hex 1fcb hex 1fc5 hex 1fc0 hex 1fba hex 1fb5 hex 1faf
hex 1faa hex 1fa4 hex 1f9f hex 1f99 hex 1f94 hex 1f8e hex 1f89 hex 1f83
hex 1f7e hex 1f79 hex 1f73 hex 1f6e hex 1f68 hex 1f63 hex 1f5d hex 1f58
hex 1f53 hex 1f4d hex 1f48 hex 1f42 hex 1f3d hex 1f37 hex 1f32 hex 1f2d
hex 1f27 hex 1f22 hex 1f1c hex 1f17 hex 1f12 hex 1f0c hex 1f07 hex 1f02
hex 1efc hex 1ef7 hex 1ef1 hex 1eec hex 1ee7 hex 1ee1 hex 1edc hex 1ed7
hex 1ed1 hex 1ecc hex 1ec7 hex 1ec1 hex 1ebc hex 1eb7 hex 1eb1 hex 1eac
hex 1ea7 hex 1ea1 hex 1e9c hex 1e97 hex 1e92 hex 1e8c hex 1e87 hex 1e82
hex 1e7c hex 1e77 hex 1e72 hex 1e6d hex 1e67 hex 1e62 hex 1e5d hex 1e58
hex 1e52 hex 1e4d hex 1e48 hex 1e43 hex 1e3d hex 1e38 hex 1e33 hex 1e2e
hex 1e28 hex 1e23 hex 1e1e hex 1e19 hex 1e14 hex 1e0e hex 1e09 hex 1e04
hex 1dff hex 1dfa hex 1df4 hex 1def hex 1dea hex 1de5 hex 1de0 hex 1dda
hex 1dd5 hex 1dd0 hex 1dcb hex 1dc6 hex 1dc1 hex 1dbc hex 1db6 hex 1db1
hex 1dac hex 1da7 hex 1da2 hex 1d9d hex 1d98 hex 1d93 hex 1d8d hex 1d88
hex 1d83 hex 1d7e hex 1d79 hex 1d74 hex 1d6f hex 1d6a hex 1d65 hex 1d5f
hex 1d5a hex 1d55 hex 1d50 hex 1d4b hex 1d46 hex 1d41 hex 1d3c hex 1d37
hex 1d32 hex 1d2d hex 1d28 hex 1d23 hex 1d1e hex 1d19 hex 1d14 hex 1d0e
``` hex 1d09 hex 1d04 hex 1cff hex 1cfa hex 1cf5 hex 1cf0 hex 1ceb hex 1ce6
hex 1ce1 hex 1cdc hex 1cd7 hex 1cd2 hex 1ccd hex 1cc8 hex 1cc3 hex 1cbf
hex 1cba hex 1cb5 hex 1cb0 hex 1cab hex 1ca6 hex 1ca1 hex 1c9c hex 1c97
hex 1c92 hex 1c8d hex 1c88 hex 1c83 hex 1c7e hex 1c79 hex 1c74 hex 1c6f
hex 1c6a hex 1c65 hex 1c61 hex 1c5c hex 1c57 hex 1c52 hex 1c4d hex 1c48
hex 1c43 hex 1c3e hex 1c39 hex 1c34 hex 1c2f hex 1c2b hex 1c26 hex 1c21
hex 1c1c hex 1c17 hex 1c12 hex 1c0d hex 1c09 hex 1c04 hex 1bff hex 1bfa
hex 1bf5 hex 1bf0 hex 1bec hex 1be7 hex 1be2 hex 1bdd hex 1bd8 hex 1bd3
hex 1bcf hex 1bca hex 1bc5 hex 1bc0 hex 1bbb hex 1bb7 hex 1bb2 hex 1bad
hex 1ba8 hex 1ba3 hex 1b9f hex 1b9a hex 1b95 hex 1b90 hex 1b8c hex 1b87
hex 1b82 hex 1b7d hex 1b78 hex 1b74 hex 1b6f hex 1b6a hex 1b66 hex 1b61
hex 1b5c hex 1b57 hex 1b53 hex 1b4e hex 1b49 hex 1b44 hex 1b40 hex 1b3b
hex 1b36 hex 1b32 hex 1b2d hex 1b28 hex 1b23 hex 1b1f hex 1b1a hex 1b15
hex 1b11 hex 1b0c hex 1b07 hex 1b03 hex 1afe hex 1af9 hex 1af5 hex 1af0
hex 1aeb hex 1ae7 hex 1ae2 hex 1add hex 1ad9 hex 1ad4 hex 1acf hex 1acb
hex 1ac6 hex 1ac1 hex 1abd hex 1ab8 hex 1ab4 hex 1aaf hex 1aaa hex 1aa6
hex 1aa1 hex 1a9c hex 1a98 hex 1a93 hex 1a8f hex 1a8a hex 1a85 hex 1a81
hex 1a7c hex 1a78 hex 1a73 hex 1a6f hex 1a6a hex 1a65 hex 1a61 hex 1a5c
hex 1a58 hex 1a53 hex 1a4f hex 1a4a hex 1a46 hex 1a41 hex 1a3c hex 1a38
hex 1a33 hex 1a2f hex 1a2a hex 1a26 hex 1a21 hex 1a1d hex 1a18 hex 1a14
hex 1a0f hex 1a0b hex 1a06 hex 1a02 hex 19fd hex 19f9 hex 19f4 hex 19f0
hex 19eb hex 19e7 hex 19e2 hex 19de hex 19d9 hex 19d5 hex 19d0 hex 19cc
hex 19c7 hex 19c3 hex 19be hex 19ba hex 19b6 hex 19b1 hex 19ad hex 19a8
hex 19a4 hex 199f hex 199b hex 1996 hex 1992 hex 198e hex 1989 hex 1985
hex 1980 hex 197c hex 1978 hex 1973 hex 196f hex 196a hex 1966 hex 1962
hex 195d hex 1959 hex 1954 hex 1950 hex 194c hex 1947 hex 1943 hex 193e
hex 193a hex 1936 hex 1931 hex 192d hex 1929 hex 1924 hex 1920 hex 191c
hex 1917 hex 1913 hex 190f hex 190a hex 1906 hex 1902 hex 18fd hex 18f9
hex 18f5 hex 18f0 hex 18ec hex 18e8 hex 18e3 hex 18df hex 18db hex 18d6
hex 18d2 hex 18ce hex 18ca hex 18c5 hex 18c1 hex 18bd hex 18b8 hex 18b4
hex 18b0 hex 18ac hex 18a7 hex 18a3 hex 189f hex 189b hex 1896 hex 1892
hex 188e hex 188a hex 1885 hex 1881 hex 187d hex 1879 hex 1874 hex 1870
hex 186c hex 1868 hex 1863 hex 185f hex 185b hex 1857 hex 1853 hex 184e
hex 184a hex 1846 hex 1842 hex 183e hex 1839 hex 1835 hex 1831 hex 182d
hex 1829 hex 1824 hex 1820 hex 181c hex 1818 hex 1814 hex 180f hex 180b
hex 1807 hex 1803 hex 17ff hex 17fb hex 17f7 hex 17f2 hex 17ee hex 17ea
hex 17e6 hex 17e2 hex 17de hex 17da hex 17d5 hex 17d1 hex 17cd hex 17c9
hex 17c5 hex 17c1 hex 17bd hex 17b9 hex 17b5 hex 17b0 hex 17ac hex 17a8
hex 17a4 hex 17a0 hex 179c hex 1798 hex 1794 hex 1790 hex 178c hex 1788
hex 1784 hex 177f hex 177b hex 1777 hex 1773 hex 176f hex 176b hex 1767
hex 1763 hex 175f hex 175b hex 1757 hex 1753 hex 174f hex 174b hex 1747
hex 1743 hex 173f hex 173b hex 1737 hex 1733 hex 172f hex 172b hex 1727
hex 1723 hex 171f hex 171b hex 1717 hex 1713 hex 170f hex 170b hex 1707
hex 1703 hex 16ff hex 16fb hex 16f7 hex 16f3 hex 16ef hex 16eb hex 16e7
hex 16e3 hex 16df hex 16db hex 16d7 hex 16d3 hex 16cf hex 16cb hex 16c7 hex 16c3 hex 16bf hex 16bb hex 16b7 hex 16b3 hex 16b0 hex 16ac hex 16a8
hex 16a4 hex 16a0 hex 169c hex 1698 hex 1694 hex 1690 hex 168c hex 1688
hex 1685 hex 1681 hex 167d hex 1679 hex 1675 hex 1671 hex 166d hex 1669
hex 1665 hex 1662 hex 165e hex 165a hex 1656 hex 1652 hex 164e hex 164a
hex 1647 hex 1643 hex 163f hex 163b hex 1637 hex 1633 hex 162f hex 162c
hex 1628 hex 1624 hex 1620 hex 161c hex 1618 hex 1615 hex 1611 hex 160d
hex 1609 hex 1605 hex 1602 hex 15fe hex 15fa hex 15f6 hex 15f2 hex 15ee
hex 15eb hex 15e7 hex 15e3 hex 15df hex 15dc hex 15d8 hex 15d4 hex 15d0
hex 15cc hex 15c9 hex 15c5 hex 15c1 hex 15bd hex 15b9 hex 15b6 hex 15b2
hex 15ae hex 15aa hex 15a7 hex 15a3 hex 159f hex 159c hex 1598 hex 1594
hex 1590 hex 158d hex 1589 hex 1585 hex 1581 hex 157e hex 157a hex 1576
hex 1573 hex 156f hex 156b hex 1567 hex 1564 hex 1560 hex 155c hex 1559
hex 1555 hex 1551 hex 154e hex 154a hex 1546 hex 1542 hex 153f hex 153b
hex 1537 hex 1534 hex 1530 hex 152c hex 1529 hex 1525 hex 1521 hex 151e
hex 151a hex 1516 hex 1513 hex 150f hex 150b hex 1508 hex 1504 hex 1501
hex 14fd hex 14f9 hex 14f6 hex 14f2 hex 14ee hex 14eb hex 14e7 hex 14e4
hex 14e0 hex 14dc hex 14d9 hex 14d5 hex 14d2 hex 14ce hex 14ca hex 14c7
hex 14c3 hex 14c0 hex 14bc hex 14b8 hex 14b5 hex 14b1 hex 14ae hex 14aa
hex 14a6 hex 14a3 hex 149f hex 149c hex 1498 hex 1495 hex 1491 hex 148d
hex 148a hex 1486 hex 1483 hex 147f hex 147c hex 1478 hex 1475 hex 1471
hex 146e hex 146a hex 1466 hex 1463 hex 145f hex 145c hex 1458 hex 1455
hex 1451 hex 144e hex 144a hex 1447 hex 1443 hex 1440 hex 143c hex 1439
hex 1435 hex 1432 hex 142e hex 142b hex 1427 hex 1424 hex 1420 hex 141d
hex 1419 hex 1416 hex 1412 hex 140f hex 140b hex 1408 hex 1405 hex 1401
hex 13fd hex 13fa hex 13f7 hex 13f3 hex 13f0 hex 13ec hex 13e9 hex 13e5
hex 13e2 hex 13de hex 13db hex 13d8 hex 13d4 hex 13d1 hex 13cd hex 13ca
hex 13c7 hex 13c3 hex 13c0 hex 13bc hex 13b9 hex 13b5 hex 13b2 hex 13ae
hex 13ab hex 13a8 hex 13a4 hex 13a1 hex 139e hex 139a hex 1397 hex 1393
hex 1390 hex 138d hex 1389 hex 1386 hex 1382 hex 137f hex 137c hex 1378
hex 1375 hex 1372 hex 136e hex 136b hex 1367 hex 1364 hex 1361 hex 135d
hex 135a hex 1357 hex 1353 hex 1350 hex 134d hex 1349 hex 1346 hex 1343
hex 133f hex 133c hex 1339 hex 1335 hex 1332 hex 132f hex 132b hex 1328
hex 1325 hex 1321 hex 131e hex 131b hex 1317 hex 1314 hex 1311 hex 130e
hex 130a hex 1307 hex 1304 hex 1300 hex 12fd hex 12fa hex 12f7 hex 12f3
hex 12f0 hex 12ed hex 12e9 hex 12e6 hex 12e3 hex 12df hex 12dc hex 12d9
hex 12d6 hex 12d2 hex 12cf hex 12cc hex 12c9 hex 12c5 hex 12c2 hex 12bf
hex 12bc hex 12b8 hex 12b5 hex 12b2 hex 12af hex 12ac hex 12a8 hex 12a5
hex 12a2 hex 129f hex 129b hex 1298 hex 1295 hex 1292 hex 128e hex 128b
hex 1288 hex 1285 hex 1282 hex 127e hex 127b hex 1278 hex 1275 hex 1272
hex 126e hex 126b hex 1268 hex 1265 hex 1262 hex 125e hex 125b hex 1258
hex 1255 hex 1252 hex 124f hex 124b hex 1248 hex 1245 hex 1242 hex 123f
hex 123c hex 1238 hex 1235 hex 1232 hex 122f hex 122c hex 1229 hex 1226
hex 1222 hex 121f hex 121c hex 1219 hex 1216 hex 1213 hex 1210 hex 120c
hex 1209 hex 1206 hex 1203 hex 1200 hex 11fd hex 11fa hex 11f7 hex 11f4
hex 11f0 hex 11ed hex 11ea hex 11e7 hex 11e4 hex 11e1 hex 11de hex 11db hex 11d8 hex 11d5 hex 11d1 hex 11ce hex 11cb hex 11c8 hex 11c5 hex 11c2
hex 11bf hex 11bc hex 11b9 hex 11b6 hex 11b3 hex 11b0 hex 11ad hex 11a9
hex 11a6 hex 11a3 hex 11a0 hex 119d hex 119a hex 1197 hex 1194 hex 1191
hex 118e hex 118b hex 1188 hex 1185 hex 1182 hex 117f hex 117c hex 1179
hex 1176 hex 1173 hex 1170 hex 116d hex 116a hex 1167 hex 1164 hex 1161
hex 115e hex 115b hex 1158 hex 1155 hex 1152 hex 114f hex 114c hex 1149
hex 1146 hex 1143 hex 1140 hex 113d hex 113a hex 1137 hex 1134 hex 1131
hex 112e hex 112b hex 1128 hex 1125 hex 1122 hex 111f hex 111c hex 1119
hex 1116 hex 1113 hex 1110 hex 110d hex 110a hex 1107 hex 1104 hex 1101
hex 10fe hex 10fb hex 10f8 hex 10f5 hex 10f2 hex 10ef hex 10ec hex 10e9
hex 10e6 hex 10e3 hex 10e0 hex 10de hex 10db hex 10d8 hex 10d5 hex 10d2
hex 10cf hex 10cc hex 10c9 hex 10c6 hex 10c3 hex 10c0 hex 10bd hex 10ba
hex 10b8 hex 10b5 hex 10b2 hex 10af hex 10ac hex 10a9 hex 10a6 hex 10a3
hex 10a0 hex 109e hex 109b hex 1098 hex 1095 hex 1092 hex 108f hex 108c
hex 1089 hex 1086 hex 1084 hex 1081 hex 107e hex 107b hex 1078 hex 1075
hex 1072 hex 1070 hex 106d hex 106a hex 1067 hex 1064 hex 1061 hex 105e
hex 105c hex 1059 hex 1056 hex 1053 hex 1050 hex 104d hex 104a hex 1048
hex 1045 hex 1042 hex 103f hex 103c hex 1039 hex 1037 hex 1034 hex 1031
hex 102e hex 102b hex 1028 hex 1026 hex 1023 hex 1020 hex 101d hex 101a
hex 1018 hex 1015 hex 1012 hex 100f hex 100c hex 100a hex 1007 hex 1004;

(initiallize probability tables)
(*** logp      lqp      nmaxlp     nmx      halfi,dbli)
init probtbl

| logp | lqp | nmaxlp | nmx | halfi,dbli |
|---|---|---|---|---|
| 1024 | 0 | 16384 | 16 | hex 5000 |
| 895 | 272 | 16110 | 18 | hex 500a |
| 795 | 502 | 15105 | 19 | hex 4614 |
| 706 | 726 | 14826 | 21 | hex 461e |
| 628 | 941 | 14444 | 23 | hex 4628 |
| 559 | 1150 | 13975 | 25 | hex 3c32 |
| 493 | 1371 | 13804 | 28 | hex 3c3c |
| 437 | 1578 | 13547 | 31 | hex 3c46 |
| 379 | 1819 | 13265 | 35 | hex 3c50 |
| 331 | 2044 | 13240 | 40 | hex 3c46 |
| 287 | 2278 | 12915 | 45 | hex 3c46 |
| 247 | 2521 | 12844 | 52 | hex 3c3c |
| 212 | 2765 | 12720 | 60 | hex 3c3c |
| 186 | 2971 | 12648 | 68 | hex 3c3c |
| 158 | 3227 | 12482 | 79 | hex 3c3c |
| 143 | 3382 | 12441 | 87 | hex 3c3c |
| 127 | 3566 | 12319 | 97 | hex 3c3c |
| 110 | 3788 | 12320 | 112 | hex 3c3c |
| 98 | 3965 | 12250 | 125 | hex 3c3c |
| 84 | 4200 | 12180 | 145 | hex 503c |
| 72 | 4435 | 12168 | 169 | hex 5a3c |

| | | | | |
|---|---|---|---|---|
| 65 | 4590 | 12155 | 187 | hex 643c |
| 59 | 4737 | 12154 | 206 | hex 643c |
| 53 | 4899 | 12084 | 228 | hex 643c |
| 48 | 5050 | 12096 | 252 | hex 643c |
| 45 | 5147 | 12105 | 269 | hex 6446 |
| 42 | 5250 | 12096 | 288 | hex 6450 |
| 40 | 5325 | 12080 | 302 | hex 5a50 |
| 37 | 5441 | 12062 | 326 | hex 5a5a |
| 35 | 5527 | 12075 | 345 | hex 505a |
| 33 | 5617 | 12078 | 366 | hex 5064 |
| 30 | 5758 | 12060 | 402 | hex 4664 |
| 28 | 5863 | 12068 | 431 | hex 4664 |
| 26 | 5976 | 12090 | 465 | hex 3c64 |
| 23 | 6157 | 12075 | 525 | hex 3c64 |
| 21 | 6295 | 12075 | 575 | hex 3c64 |
| 19 | 6447 | 12103 | 637 | hex 325a |
| 17 | 6616 | 12121 | 713 | hex 3250 |
| 15 | 6806 | 12150 | 810 | hex 2846 |
| 13 | 7024 | 12181 | 937 | hex 283c |
| 11 | 7278 | 12221 | 1111 | hex 1e3c |
| 9 | 7585 | 12294 | 1366 | hex 1e32 |
| 7 | 7972 | 12411 | 1773 | hex 1e28 |
| 5 | 8495 | 12615 | 2523 | hex 1e1e |
| 4 | 8884 | 13120 | 3280 | hex 141e |
| 3 | 9309 | 13113 | 4371 | hex 141e |
| 2 | 10065 | 14574 | 7287 | hex 0a14 |
| 1 | 11689 | 21860 | 21860 | hex 000a |
| 0 | 0 | 0 | 0 | 0; |

(initiallize logx table)

init logtbl hex 000 hex 000 hex 000 hex 000 hex 001 hex 001 hex 001 hex 002
    hex 002 hex 002 hex 003 hex 003 hex 004 hex 004 hex 004 hex 005
    hex 005 hex 005 hex 006 hex 006 hex 006 hex 007 hex 007 hex 007
    hex 008 hex 008 hex 009 hex 009 hex 009 hex 00a hex 00a hex 00a
    hex 00b hex 00b hex 00b hex 00c hex 00c hex 00c hex 00d hex 00d
    hex 00e hex 00e hex 00e hex 00f hex 00f hex 00f hex 010 hex 010
    hex 010 hex 011 hex 011 hex 011 hex 012 hex 012 hex 012 hex 013
    hex 013 hex 014 hex 014 hex 014 hex 015 hex 015 hex 015 hex 016
    hex 016 hex 016 hex 017 hex 017 hex 017 hex 018 hex 018 hex 018
    hex 019 hex 019 hex 01a hex 01a hex 01a hex 01b hex 01b hex 01b
    hex 01c hex 01c hex 01c hex 01d hex 01d hex 01d hex 01e hex 01e
    hex 01e hex 01f hex 01f hex 01f hex 020 hex 020 hex 021 hex 021
    hex 021 hex 022 hex 022 hex 022 hex 023 hex 023 hex 023 hex 024
    hex 024 hex 024 hex 025 hex 025 hex 025 hex 026 hex 026 hex 026
    hex 027 hex 027 hex 028 hex 028 hex 028 hex 029 hex 029 hex 029 hex 02a hex 02a hex 02a hex 02b hex 02b hex 02b hex 02c hex 02c
hex 02c hex 02d hex 02d hex 02d hex 02e hex 02e hex 02f hex 02f
hex 02f hex 030 hex 030 hex 030 hex 031 hex 031 hex 031 hex 032
hex 032 hex 032 hex 033 hex 033 hex 033 hex 034 hex 034 hex 034
hex 035 hex 035 hex 035 hex 036 hex 036 hex 036 hex 037 hex 037
hex 038 hex 038 hex 038 hex 039 hex 039 hex 039 hex 03a hex 03a
hex 03a hex 03b hex 03b hex 03b hex 03c hex 03c hex 03c hex 03d
hex 03d hex 03d hex 03e hex 03e hex 03e hex 03f hex 03f hex 03f
hex 040 hex 040 hex 041 hex 041 hex 041 hex 042 hex 042 hex 042
hex 043 hex 043 hex 043 hex 044 hex 044 hex 044 hex 045 hex 045
hex 045 hex 046 hex 046 hex 046 hex 047 hex 047 hex 047 hex 048
hex 048 hex 048 hex 049 hex 049 hex 049 hex 04a hex 04a hex 04a
hex 04b hex 04b hex 04b hex 04c hex 04c hex 04c hex 04d hex 04d
hex 04e hex 04e hex 04e hex 04f hex 04f hex 04f hex 050 hex 050
hex 050 hex 051 hex 051 hex 051 hex 052 hex 052 hex 052 hex 053
hex 053 hex 053 hex 054 hex 054 hex 054 hex 055 hex 055 hex 055
hex 056 hex 056 hex 056 hex 057 hex 057 hex 057 hex 058 hex 058
hex 058 hex 059 hex 059 hex 059 hex 05a hex 05a hex 05a hex 05b
hex 05b hex 05b hex 05c hex 05c hex 05c hex 05d hex 05d hex 05d
hex 05e hex 05e hex 05e hex 05f hex 05f hex 05f hex 060 hex 060
hex 060 hex 061 hex 061 hex 061 hex 062 hex 062 hex 062 hex 063
hex 063 hex 063 hex 064 hex 064 hex 064 hex 065 hex 065 hex 065
hex 066 hex 066 hex 066 hex 067 hex 067 hex 067 hex 068 hex 068
hex 068 hex 069 hex 069 hex 069 hex 06a hex 06a hex 06a hex 06b
hex 06b hex 06b hex 06c hex 06c hex 06c hex 06d hex 06d hex 06d
hex 06e hex 06e hex 06e hex 06f hex 06f hex 06f hex 070 hex 070
hex 070 hex 071 hex 071 hex 071 hex 072 hex 072 hex 072 hex 073
hex 073 hex 073 hex 074 hex 074 hex 074 hex 075 hex 075 hex 075
hex 076 hex 076 hex 076 hex 077 hex 077 hex 077 hex 078 hex 078
hex 078 hex 079 hex 079 hex 079 hex 07a hex 07a hex 07a hex 07b
hex 07b hex 07b hex 07c hex 07c hex 07c hex 07d hex 07d hex 07d
hex 07e hex 07e hex 07e hex 07f hex 07f hex 07f hex 080 hex 080
hex 080 hex 081 hex 081 hex 081 hex 082 hex 082 hex 082 hex 083
hex 083 hex 083 hex 084 hex 084 hex 084 hex 085 hex 085 hex 085
hex 086 hex 086 hex 086 hex 087 hex 087 hex 087 hex 088 hex 088
hex 088 hex 089 hex 089 hex 089 hex 08a hex 08a hex 08a hex 08b
hex 08b hex 08b hex 08c hex 08c hex 08c hex 08d hex 08d hex 08d
hex 08e hex 08e hex 08e hex 08f hex 08f hex 08f hex 090 hex 090
hex 090 hex 091 hex 091 hex 091 hex 091 hex 092 hex 092 hex 092
hex 093 hex 093 hex 093 hex 094 hex 094 hex 094 hex 095 hex 095
hex 095 hex 096 hex 096 hex 096 hex 097 hex 097 hex 097 hex 098
hex 098 hex 098 hex 099 hex 099 hex 099 hex 09a hex 09a hex 09a
hex 09b hex 09b hex 09b hex 09c hex 09c hex 09c hex 09d hex 09d
hex 09d hex 09e hex 09e hex 09e hex 09e hex 09f hex 09f hex 09f
hex 0a0 hex 0a0 hex 0a0 hex 0a1 hex 0a1 hex 0a1 hex 0a2 hex 0a2 hex 0a2 hex 0a3 hex 0a3 hex 0a3 hex 0a4 hex 0a4 hex 0a4 hex 0a5
hex 0a5 hex 0a5 hex 0a6 hex 0a6 hex 0a6 hex 0a7 hex 0a7 hex 0a7
hex 0a8 hex 0a8 hex 0a8 hex 0a8 hex 0a9 hex 0a9 hex 0a9 hex 0aa
hex 0aa hex 0aa hex 0ab hex 0ab hex 0ab hex 0ac hex 0ac hex 0ac
hex 0ad hex 0ad hex 0ad hex 0ae hex 0ae hex 0ae hex 0af hex 0af
hex 0af hex 0b0 hex 0b0 hex 0b0 hex 0b1 hex 0b1 hex 0b1 hex 0b1
hex 0b2 hex 0b2 hex 0b2 hex 0b3 hex 0b3 hex 0b3 hex 0b4 hex 0b4
hex 0b4 hex 0b5 hex 0b5 hex 0b5 hex 0b6 hex 0b6 hex 0b6 hex 0b7
hex 0b7 hex 0b7 hex 0b8 hex 0b8 hex 0b8 hex 0b8 hex 0b9 hex 0b9
hex 0b9 hex 0ba hex 0ba hex 0ba hex 0bb hex 0bb hex 0bb hex 0bc
hex 0bc hex 0bc hex 0bd hex 0bd hex 0bd hex 0be hex 0be hex 0be
hex 0bf hex 0bf hex 0bf hex 0bf hex 0c0 hex 0c0 hex 0c0 hex 0c1
hex 0c1 hex 0c1 hex 0c2 hex 0c2 hex 0c2 hex 0c3 hex 0c3 hex 0c3
hex 0c4 hex 0c4 hex 0c4 hex 0c5 hex 0c5 hex 0c5 hex 0c5 hex 0c6
hex 0c6 hex 0c6 hex 0c7 hex 0c7 hex 0c7 hex 0c8 hex 0c8 hex 0c8
hex 0c9 hex 0c9 hex 0c9 hex 0ca hex 0ca hex 0ca hex 0cb hex 0cb
hex 0cb hex 0cb hex 0cc hex 0cc hex 0cc hex 0cd hex 0cd hex 0cd
hex 0ce hex 0ce hex 0ce hex 0cf hex 0cf hex 0cf hex 0d0 hex 0d0
hex 0d0 hex 0d0 hex 0d1 hex 0d1 hex 0d1 hex 0d2 hex 0d2 hex 0d2
hex 0d3 hex 0d3 hex 0d3 hex 0d4 hex 0d4 hex 0d4 hex 0d5 hex 0d5
hex 0d5 hex 0d5 hex 0d6 hex 0d6 hex 0d6 hex 0d7 hex 0d7 hex 0d7
hex 0d8 hex 0d8 hex 0d8 hex 0d9 hex 0d9 hex 0d9 hex 0da hex 0da
hex 0da hex 0da hex 0db hex 0db hex 0db hex 0dc hex 0dc hex 0dc
hex 0dd hex 0dd hex 0dd hex 0de hex 0de hex 0de hex 0de hex 0df
hex 0df hex 0df hex 0e0 hex 0e0 hex 0e0 hex 0e1 hex 0e1 hex 0e1
hex 0e2 hex 0e2 hex 0e2 hex 0e2 hex 0e3 hex 0e3 hex 0e3 hex 0e4
hex 0e4 hex 0e4 hex 0e5 hex 0e5 hex 0e5 hex 0e6 hex 0e6 hex 0e6
hex 0e7 hex 0e7 hex 0e7 hex 0e7 hex 0e8 hex 0e8 hex 0e8 hex 0e9
hex 0e9 hex 0e9 hex 0ea hex 0ea hex 0ea hex 0eb hex 0eb hex 0eb
hex 0eb hex 0ec hex 0ec hex 0ec hex 0ed hex 0ed hex 0ed hex 0ee
hex 0ee hex 0ee hex 0ef hex 0ef hex 0ef hex 0ef hex 0f0 hex 0f0
hex 0f0 hex 0f1 hex 0f1 hex 0f1 hex 0f2 hex 0f2 hex 0f2 hex 0f3
hex 0f3 hex 0f3 hex 0f3 hex 0f4 hex 0f4 hex 0f4 hex 0f5 hex 0f5
hex 0f5 hex 0f6 hex 0f6 hex 0f6 hex 0f6 hex 0f7 hex 0f7 hex 0f7
hex 0f8 hex 0f8 hex 0f8 hex 0f9 hex 0f9 hex 0f9 hex 0f9 hex 0fa
hex 0fa hex 0fa hex 0fb hex 0fb hex 0fb hex 0fc hex 0fc hex 0fc
hex 0fd hex 0fd hex 0fd hex 0fd hex 0fe hex 0fe hex 0fe hex 0ff
hex 0ff hex 0ff hex 100 hex 100 hex 100 hex 100 hex 101 hex 101
hex 101 hex 102 hex 102 hex 102 hex 103 hex 103 hex 103 hex 104
hex 104 hex 104 hex 104 hex 105 hex 105 hex 105 hex 106 hex 106
hex 106 hex 107 hex 107 hex 107 hex 107 hex 108 hex 108 hex 108
hex 109 hex 109 hex 109 hex 10a hex 10a hex 10a hex 10a hex 10b
hex 10b hex 10b hex 10c hex 10c hex 10c hex 10d hex 10d hex 10d
hex 10d hex 10e hex 10e hex 10e hex 10f hex 10f hex 10f hex 110
hex 110 hex 110 hex 110 hex 111 hex 111 hex 111 hex 112 hex 112 hex 112 hex 113 hex 113 hex 113 hex 113 hex 114 hex 114 hex 114
hex 115 hex 115 hex 115 hex 116 hex 116 hex 116 hex 116 hex 117
hex 117 hex 117 hex 118 hex 118 hex 118 hex 119 hex 119 hex 119
hex 119 hex 11a hex 11a hex 11a hex 11b hex 11b hex 11b hex 11c
hex 11c hex 11c hex 11c hex 11d hex 11d hex 11d hex 11e hex 11e
hex 11e hex 11e hex 11f hex 11f hex 11f hex 120 hex 120 hex 120
hex 121 hex 121 hex 121 hex 121 hex 122 hex 122 hex 122 hex 123
hex 123 hex 123 hex 124 hex 124 hex 124 hex 124 hex 125 hex 125
hex 125 hex 126 hex 126 hex 126 hex 126 hex 127 hex 127 hex 127
hex 128 hex 128 hex 128 hex 129 hex 129 hex 129 hex 129 hex 12a
hex 12a hex 12a hex 12b hex 12b hex 12b hex 12b hex 12c hex 12c
hex 12c hex 12d hex 12d hex 12d hex 12e hex 12e hex 12e hex 12e
hex 12f hex 12f hex 12f hex 130 hex 130 hex 130 hex 131 hex 131
hex 131 hex 131 hex 132 hex 132 hex 132 hex 133 hex 133 hex 133
hex 133 hex 134 hex 134 hex 134 hex 135 hex 135 hex 135 hex 135
hex 136 hex 136 hex 136 hex 137 hex 137 hex 137 hex 137 hex 138
hex 138 hex 138 hex 139 hex 139 hex 139 hex 13a hex 13a hex 13a
hex 13a hex 13b hex 13b hex 13b hex 13c hex 13c hex 13c hex 13c
hex 13d hex 13d hex 13d hex 13e hex 13e hex 13e hex 13f hex 13f
hex 13f hex 13f hex 140 hex 140 hex 140 hex 141 hex 141 hex 141
hex 141 hex 142 hex 142 hex 142 hex 143 hex 143 hex 143 hex 143
hex 144 hex 144 hex 144 hex 145 hex 145 hex 145 hex 145 hex 146
hex 146 hex 146 hex 147 hex 147 hex 147 hex 148 hex 148 hex 148
hex 148 hex 149 hex 149 hex 149 hex 149 hex 14a hex 14a hex 14a
hex 14b hex 14b hex 14b hex 14c hex 14c hex 14c hex 14c hex 14d
hex 14d hex 14d hex 14e hex 14e hex 14e hex 14e hex 14f hex 14f
hex 14f hex 150 hex 150 hex 150 hex 150 hex 151 hex 151 hex 151
hex 152 hex 152 hex 152 hex 152 hex 153 hex 153 hex 153 hex 154
hex 154 hex 154 hex 154 hex 155 hex 155 hex 155 hex 156 hex 156
hex 156 hex 156 hex 157 hex 157 hex 157 hex 158 hex 158 hex 158
hex 158 hex 159 hex 159 hex 159 hex 15a hex 15a hex 15a hex 15a
hex 15b hex 15b hex 15b hex 15c hex 15c hex 15c hex 15c hex 15d
hex 15d hex 15d hex 15e hex 15e hex 15e hex 15e hex 15f hex 15f
hex 15f hex 160 hex 160 hex 160 hex 160 hex 161 hex 161 hex 161
hex 162 hex 162 hex 162 hex 162 hex 163 hex 163 hex 163 hex 164
hex 164 hex 164 hex 164 hex 165 hex 165 hex 165 hex 166 hex 166
hex 166 hex 166 hex 167 hex 167 hex 167 hex 167 hex 168 hex 168
hex 168 hex 169 hex 169 hex 169 hex 169 hex 16a hex 16a hex 16a
hex 16b hex 16b hex 16b hex 16b hex 16c hex 16c hex 16c hex 16d
hex 16d hex 16d hex 16d hex 16e hex 16e hex 16e hex 16f hex 16f
hex 16f hex 16f hex 170 hex 170 hex 170 hex 171 hex 171 hex 171
hex 171 hex 172 hex 172 hex 172 hex 172 hex 173 hex 173 hex 173
hex 174 hex 174 hex 174 hex 174 hex 175 hex 175 hex 175 hex 176
hex 176 hex 176 hex 176 hex 177 hex 177 hex 177 hex 178 hex 178
hex 178 hex 178 hex 179 hex 179 hex 179 hex 179 hex 17a hex 17a hex 17a hex 17b hex 17b hex 17b hex 17b hex 17c hex 17c hex 17c
hex 17d hex 17d hex 17d hex 17d hex 17e hex 17e hex 17e hex 17e
hex 17f hex 17f hex 17f hex 180 hex 180 hex 180 hex 180 hex 181
hex 181 hex 181 hex 182 hex 182 hex 182 hex 182 hex 183 hex 183
hex 183 hex 183 hex 184 hex 184 hex 184 hex 185 hex 185 hex 185
hex 185 hex 186 hex 186 hex 186 hex 187 hex 187 hex 187 hex 187
hex 188 hex 188 hex 188 hex 188 hex 189 hex 189 hex 189 hex 18a
hex 18a hex 18a hex 18a hex 18b hex 18b hex 18b hex 18c hex 18c
hex 18c hex 18c hex 18d hex 18d hex 18d hex 18d hex 18e hex 18e
hex 18e hex 18f hex 18f hex 18f hex 18f hex 190 hex 190 hex 190
hex 190 hex 191 hex 191 hex 191 hex 192 hex 192 hex 192 hex 192
hex 193 hex 193 hex 193 hex 194 hex 194 hex 194 hex 194 hex 195
hex 195 hex 195 hex 195 hex 196 hex 196 hex 196 hex 197 hex 197
hex 197 hex 197 hex 198 hex 198 hex 198 hex 198 hex 199 hex 199
hex 199 hex 19a hex 19a hex 19a hex 19a hex 19b hex 19b hex 19b
hex 19b hex 19c hex 19c hex 19c hex 19d hex 19d hex 19d hex 19d
hex 19e hex 19e hex 19e hex 19e hex 19f hex 19f hex 19f hex 1a0
hex 1a0 hex 1a0 hex 1a0 hex 1a1 hex 1a1 hex 1a1 hex 1a1 hex 1a2
hex 1a2 hex 1a2 hex 1a3 hex 1a3 hex 1a3 hex 1a3 hex 1a4 hex 1a4
hex 1a4 hex 1a4 hex 1a5 hex 1a5 hex 1a5 hex 1a5 hex 1a6 hex 1a6
hex 1a6 hex 1a7 hex 1a7 hex 1a7 hex 1a7 hex 1a8 hex 1a8 hex 1a8
hex 1a8 hex 1a9 hex 1a9 hex 1a9 hex 1aa hex 1aa hex 1aa hex 1aa
hex 1ab hex 1ab hex 1ab hex 1ab hex 1ac hex 1ac hex 1ac hex 1ad
hex 1ad hex 1ad hex 1ad hex 1ae hex 1ae hex 1ae hex 1ae hex 1af
hex 1af hex 1af hex 1af hex 1b0 hex 1b0 hex 1b0 hex 1b1 hex 1b1
hex 1b1 hex 1b1 hex 1b2 hex 1b2 hex 1b2 hex 1b2 hex 1b3 hex 1b3
hex 1b3 hex 1b4 hex 1b4 hex 1b4 hex 1b4 hex 1b5 hex 1b5 hex 1b5
hex 1b5 hex 1b6 hex 1b6 hex 1b6 hex 1b6 hex 1b7 hex 1b7 hex 1b7
hex 1b8 hex 1b8 hex 1b8 hex 1b8 hex 1b9 hex 1b9 hex 1b9 hex 1b9
hex 1ba hex 1ba hex 1ba hex 1ba hex 1bb hex 1bb hex 1bb hex 1bc
hex 1bc hex 1bc hex 1bc hex 1bd hex 1bd hex 1bd hex 1bd hex 1be
hex 1be hex 1be hex 1bf hex 1bf hex 1bf hex 1bf hex 1c0 hex 1c0
hex 1c0 hex 1c0 hex 1c1 hex 1c1 hex 1c1 hex 1c1 hex 1c2 hex 1c2
hex 1c2 hex 1c3 hex 1c3 hex 1c3 hex 1c3 hex 1c4 hex 1c4 hex 1c4
hex 1c4 hex 1c5 hex 1c5 hex 1c5 hex 1c5 hex 1c6 hex 1c6 hex 1c6
hex 1c6 hex 1c7 hex 1c7 hex 1c7 hex 1c8 hex 1c8 hex 1c8 hex 1c8
hex 1c9 hex 1c9 hex 1c9 hex 1c9 hex 1ca hex 1ca hex 1ca hex 1ca
hex 1cb hex 1cb hex 1cb hex 1cb hex 1cc hex 1cc hex 1cc hex 1cd
hex 1cd hex 1cd hex 1cd hex 1ce hex 1ce hex 1ce hex 1ce hex 1cf
hex 1cf hex 1cf hex 1cf hex 1d0 hex 1d0 hex 1d0 hex 1d1 hex 1d1
hex 1d1 hex 1d1 hex 1d2 hex 1d2 hex 1d2 hex 1d2 hex 1d3 hex 1d3
hex 1d3 hex 1d3 hex 1d4 hex 1d4 hex 1d4 hex 1d4 hex 1d5 hex 1d5
hex 1d5 hex 1d5 hex 1d6 hex 1d6 hex 1d6 hex 1d7 hex 1d7 hex 1d7
hex 1d7 hex 1d8 hex 1d8 hex 1d8 hex 1d8 hex 1d9 hex 1d9 hex 1d9
hex 1d9 hex 1da hex 1da hex 1da hex 1da hex 1db hex 1db hex 1db

```
hex 1dc  hex 1dc  hex 1dc  hex 1dc  hex 1dd  hex 1dd  hex 1dd  hex 1dd
hex 1de  hex 1de  hex 1de  hex 1de  hex 1df  hex 1df  hex 1df  hex 1df
hex 1e0  hex 1e0  hex 1e0  hex 1e0  hex 1e1  hex 1e1  hex 1e1  hex 1e2
hex 1e2  hex 1e2  hex 1e2  hex 1e3  hex 1e3  hex 1e3  hex 1e3  hex 1e4
hex 1e4  hex 1e4  hex 1e4  hex 1e5  hex 1e5  hex 1e5  hex 1e5  hex 1e6
hex 1e6  hex 1e6  hex 1e6  hex 1e7  hex 1e7  hex 1e7  hex 1e7  hex 1e8
hex 1e8  hex 1e8  hex 1e9  hex 1e9  hex 1e9  hex 1e9  hex 1ea  hex 1ea
hex 1ea  hex 1ea  hex 1eb  hex 1eb  hex 1eb  hex 1eb  hex 1ec  hex 1ec
hex 1ec  hex 1ec  hex 1ed  hex 1ed  hex 1ed  hex 1ed  hex 1ee  hex 1ee
hex 1ee  hex 1ee  hex 1ef  hex 1ef  hex 1ef  hex 1f0  hex 1f0  hex 1f0
hex 1f0  hex 1f1  hex 1f1  hex 1f1  hex 1f1  hex 1f2  hex 1f2  hex 1f2
hex 1f2  hex 1f3  hex 1f3  hex 1f3  hex 1f3  hex 1f4  hex 1f4  hex 1f4
hex 1f4  hex 1f5  hex 1f5  hex 1f5  hex 1f5  hex 1f6  hex 1f6  hex 1f6
hex 1f6  hex 1f7  hex 1f7  hex 1f7  hex 1f7  hex 1f8  hex 1f8  hex 1f8
hex 1f9  hex 1f9  hex 1f9  hex 1f9  hex 1fa  hex 1fa  hex 1fa  hex 1fa
hex 1fb  hex 1fb  hex 1fb  hex 1fb  hex 1fc  hex 1fc  hex 1fc  hex 1fc
hex 1fd  hex 1fd  hex 1fd  hex 1fd  hex 1fe  hex 1fe  hex 1fe  hex 1fe
hex 1ff  hex 1ff  hex 1ff  hex 1ff  hex 200  hex 200  hex 200  hex 200
hex 201  hex 201  hex 201  hex 201  hex 202  hex 202  hex 202  hex 202
hex 203  hex 203  hex 203  hex 204  hex 204  hex 204  hex 204  hex 205
hex 205  hex 205  hex 205  hex 206  hex 206  hex 206  hex 206  hex 207
hex 207  hex 207  hex 207  hex 208  hex 208  hex 208  hex 208  hex 209
hex 209  hex 209  hex 209  hex 20a  hex 20a  hex 20a  hex 20a  hex 20b
hex 20b  hex 20b  hex 20b  hex 20c  hex 20c  hex 20c  hex 20c  hex 20d
hex 20d  hex 20d  hex 20d  hex 20e  hex 20e  hex 20e  hex 20e  hex 20f
hex 20f  hex 20f  hex 20f  hex 210  hex 210  hex 210  hex 210  hex 211
hex 211  hex 211  hex 211  hex 212  hex 212  hex 212  hex 212  hex 213
hex 213  hex 213  hex 213  hex 214  hex 214  hex 214  hex 214  hex 215
hex 215  hex 215  hex 215  hex 216  hex 216  hex 216  hex 216  hex 217
hex 217  hex 217  hex 217  hex 218  hex 218  hex 218  hex 218  hex 219
hex 219  hex 219  hex 219  hex 21a  hex 21a  hex 21a  hex 21a  hex 21b
hex 21b  hex 21b  hex 21b  hex 21c  hex 21c  hex 21c  hex 21c  hex 21d
hex 21d  hex 21d  hex 21d  hex 21e  hex 21e  hex 21e  hex 21e  hex 21f
hex 21f  hex 21f  hex 21f  hex 220  hex 220  hex 220  hex 220  hex 221
hex 221  hex 221  hex 221  hex 222  hex 222  hex 222  hex 222  hex 223
hex 223  hex 223  hex 223  hex 224  hex 224  hex 224  hex 224  hex 225
hex 225  hex 225  hex 225  hex 226  hex 226  hex 226  hex 226  hex 227
hex 227  hex 227  hex 227  hex 228  hex 228  hex 228  hex 228  hex 229
hex 229  hex 229  hex 229  hex 22a  hex 22a  hex 22a  hex 22a  hex 22b
hex 22b  hex 22b  hex 22b  hex 22c  hex 22c  hex 22c  hex 22c  hex 22d
hex 22d  hex 22d  hex 22d  hex 22e  hex 22e  hex 22e  hex 22e  hex 22f
hex 22f  hex 22f  hex 22f  hex 230  hex 230  hex 230  hex 230  hex 231
hex 231  hex 231  hex 231  hex 232  hex 232  hex 232  hex 232  hex 233
hex 233  hex 233  hex 233  hex 234  hex 234  hex 234  hex 234  hex 235
hex 235  hex 235  hex 235  hex 236  hex 236  hex 236  hex 236  hex 237
``` hex 237 hex 237 hex 237 hex 237 hex 238 hex 238 hex 238 hex 238
hex 239 hex 239 hex 239 hex 239 hex 23a hex 23a hex 23a hex 23a
hex 23b hex 23b hex 23b hex 23b hex 23c hex 23c hex 23c hex 23c
hex 23d hex 23d hex 23d hex 23d hex 23e hex 23e hex 23e hex 23e
hex 23f hex 23f hex 23f hex 23f hex 240 hex 240 hex 240 hex 240
hex 241 hex 241 hex 241 hex 241 hex 242 hex 242 hex 242 hex 242
hex 243 hex 243 hex 243 hex 243 hex 243 hex 244 hex 244 hex 244
hex 244 hex 245 hex 245 hex 245 hex 245 hex 246 hex 246 hex 246
hex 246 hex 247 hex 247 hex 247 hex 247 hex 248 hex 248 hex 248
hex 248 hex 249 hex 249 hex 249 hex 249 hex 24a hex 24a hex 24a
hex 24a hex 24b hex 24b hex 24b hex 24b hex 24c hex 24c hex 24c
hex 24c hex 24c hex 24d hex 24d hex 24d hex 24d hex 24e hex 24e
hex 24e hex 24e hex 24f hex 24f hex 24f hex 24f hex 250 hex 250
hex 250 hex 250 hex 251 hex 251 hex 251 hex 251 hex 252 hex 252
hex 252 hex 252 hex 253 hex 253 hex 253 hex 253 hex 253 hex 254
hex 254 hex 254 hex 254 hex 255 hex 255 hex 255 hex 255 hex 256
hex 256 hex 256 hex 256 hex 257 hex 257 hex 257 hex 257 hex 258
hex 258 hex 258 hex 258 hex 259 hex 259 hex 259 hex 259 hex 25a
hex 25a hex 25a hex 25a hex 25a hex 25b hex 25b hex 25b hex 25b
hex 25c hex 25c hex 25c hex 25c hex 25d hex 25d hex 25d hex 25d
hex 25e hex 25e hex 25e hex 25e hex 25f hex 25f hex 25f hex 25f
hex 25f hex 260 hex 260 hex 260 hex 260 hex 261 hex 261 hex 261
hex 261 hex 262 hex 262 hex 262 hex 262 hex 263 hex 263 hex 263
hex 263 hex 264 hex 264 hex 264 hex 264 hex 264 hex 265 hex 265
hex 265 hex 265 hex 266 hex 266 hex 266 hex 266 hex 267 hex 267
hex 267 hex 267 hex 268 hex 268 hex 268 hex 268 hex 269 hex 269
hex 269 hex 269 hex 269 hex 26a hex 26a hex 26a hex 26a hex 26b
hex 26b hex 26b hex 26b hex 26c hex 26c hex 26c hex 26c hex 26d
hex 26d hex 26d hex 26d hex 26e hex 26e hex 26e hex 26e hex 26e
hex 26f hex 26f hex 26f hex 26f hex 270 hex 270 hex 270 hex 270
hex 271 hex 271 hex 271 hex 271 hex 272 hex 272 hex 272 hex 272
hex 272 hex 273 hex 273 hex 273 hex 273 hex 274 hex 274 hex 274
hex 274 hex 275 hex 275 hex 275 hex 275 hex 276 hex 276 hex 276
hex 276 hex 276 hex 277 hex 277 hex 277 hex 277 hex 278 hex 278
hex 278 hex 278 hex 279 hex 279 hex 279 hex 279 hex 27a hex 27a
hex 27a hex 27a hex 27a hex 27b hex 27b hex 27b hex 27b hex 27c
hex 27c hex 27c hex 27c hex 27d hex 27d hex 27d hex 27d hex 27e
hex 27e hex 27e hex 27e hex 27e hex 27f hex 27f hex 27f hex 27f
hex 280 hex 280 hex 280 hex 280 hex 281 hex 281 hex 281 hex 281
hex 282 hex 282 hex 282 hex 282 hex 282 hex 283 hex 283 hex 283
hex 283 hex 284 hex 284 hex 284 hex 284 hex 285 hex 285 hex 285
hex 285 hex 285 hex 286 hex 286 hex 286 hex 286 hex 287 hex 287
hex 287 hex 287 hex 288 hex 288 hex 288 hex 288 hex 289 hex 289
hex 289 hex 289 hex 289 hex 28a hex 28a hex 28a hex 28a hex 28b
hex 28b hex 28b hex 28b hex 28c hex 28c hex 28c hex 28c hex 28c hex 28d hex 28d hex 28d hex 28d hex 28e hex 28e hex 28e hex 28e
hex 28f hex 28f hex 28f hex 28f hex 28f hex 290 hex 290 hex 290
hex 290 hex 291 hex 291 hex 291 hex 291 hex 292 hex 292 hex 292
hex 292 hex 292 hex 293 hex 293 hex 293 hex 293 hex 294 hex 294
hex 294 hex 294 hex 295 hex 295 hex 295 hex 295 hex 295 hex 296
hex 296 hex 296 hex 296 hex 297 hex 297 hex 297 hex 297 hex 298
hex 298 hex 298 hex 298 hex 298 hex 299 hex 299 hex 299 hex 299
hex 29a hex 29a hex 29a hex 29a hex 29b hex 29b hex 29b hex 29b
hex 29b hex 29c hex 29c hex 29c hex 29c hex 29d hex 29d hex 29d
hex 29d hex 29e hex 29e hex 29e hex 29e hex 29e hex 29f hex 29f
hex 29f hex 29f hex 2a0 hex 2a0 hex 2a0 hex 2a0 hex 2a1 hex 2a1
hex 2a1 hex 2a1 hex 2a1 hex 2a2 hex 2a2 hex 2a2 hex 2a2 hex 2a3
hex 2a3 hex 2a3 hex 2a3 hex 2a3 hex 2a4 hex 2a4 hex 2a4 hex 2a4
hex 2a5 hex 2a5 hex 2a5 hex 2a5 hex 2a6 hex 2a6 hex 2a6 hex 2a6
hex 2a6 hex 2a7 hex 2a7 hex 2a7 hex 2a7 hex 2a8 hex 2a8 hex 2a8
hex 2a8 hex 2a8 hex 2a9 hex 2a9 hex 2a9 hex 2a9 hex 2aa hex 2aa
hex 2aa hex 2aa hex 2ab hex 2ab hex 2ab hex 2ab hex 2ab hex 2ac
hex 2ac hex 2ac hex 2ac hex 2ad hex 2ad hex 2ad hex 2ad hex 2ad
hex 2ae hex 2ae hex 2ae hex 2ae hex 2af hex 2af hex 2af hex 2af
hex 2b0 hex 2b0 hex 2b0 hex 2b0 hex 2b0 hex 2b1 hex 2b1 hex 2b1
hex 2b1 hex 2b2 hex 2b2 hex 2b2 hex 2b2 hex 2b2 hex 2b3 hex 2b3
hex 2b3 hex 2b3 hex 2b4 hex 2b4 hex 2b4 hex 2b4 hex 2b5 hex 2b5
hex 2b5 hex 2b5 hex 2b5 hex 2b6 hex 2b6 hex 2b6 hex 2b6 hex 2b7
hex 2b7 hex 2b7 hex 2b7 hex 2b7 hex 2b8 hex 2b8 hex 2b8 hex 2b8
hex 2b9 hex 2b9 hex 2b9 hex 2b9 hex 2b9 hex 2ba hex 2ba hex 2ba
hex 2ba hex 2bb hex 2bb hex 2bb hex 2bb hex 2bb hex 2bc hex 2bc
hex 2bc hex 2bc hex 2bd hex 2bd hex 2bd hex 2bd hex 2be hex 2be
hex 2be hex 2be hex 2be hex 2bf hex 2bf hex 2bf hex 2bf hex 2c0
hex 2c0 hex 2c0 hex 2c0 hex 2c0 hex 2c1 hex 2c1 hex 2c1 hex 2c1
hex 2c2 hex 2c2 hex 2c2 hex 2c2 hex 2c2 hex 2c3 hex 2c3 hex 2c3
hex 2c3 hex 2c4 hex 2c4 hex 2c4 hex 2c4 hex 2c4 hex 2c5 hex 2c5
hex 2c5 hex 2c5 hex 2c6 hex 2c6 hex 2c6 hex 2c6 hex 2c6 hex 2c7
hex 2c7 hex 2c7 hex 2c7 hex 2c8 hex 2c8 hex 2c8 hex 2c8 hex 2c8
hex 2c9 hex 2c9 hex 2c9 hex 2c9 hex 2ca hex 2ca hex 2ca hex 2ca
hex 2ca hex 2cb hex 2cb hex 2cb hex 2cb hex 2cc hex 2cc hex 2cc
hex 2cc hex 2cc hex 2cd hex 2cd hex 2cd hex 2cd hex 2ce hex 2ce
hex 2ce hex 2ce hex 2ce hex 2cf hex 2cf hex 2cf hex 2cf hex 2d0
hex 2d0 hex 2d0 hex 2d0 hex 2d0 hex 2d1 hex 2d1 hex 2d1 hex 2d1
hex 2d2 hex 2d2 hex 2d2 hex 2d2 hex 2d2 hex 2d3 hex 2d3 hex 2d3
hex 2d3 hex 2d4 hex 2d4 hex 2d4 hex 2d4 hex 2d4 hex 2d5 hex 2d5
hex 2d5 hex 2d5 hex 2d6 hex 2d6 hex 2d6 hex 2d6 hex 2d6 hex 2d7
hex 2d7 hex 2d7 hex 2d7 hex 2d8 hex 2d8 hex 2d8 hex 2d8 hex 2d8
hex 2d9 hex 2d9 hex 2d9 hex 2d9 hex 2da hex 2da hex 2da hex 2da
hex 2da hex 2db hex 2db hex 2db hex 2db hex 2db hex 2dc hex 2dc
hex 2dc hex 2dc hex 2dd hex 2dd hex 2dd hex 2dd hex 2dd hex 2de hex 2de hex 2de hex 2de hex 2df hex 2df hex 2df hex 2df hex 2df
hex 2e0 hex 2e0 hex 2e0 hex 2e0 hex 2e1 hex 2e1 hex 2e1 hex 2e1
hex 2e1 hex 2e2 hex 2e2 hex 2e2 hex 2e2 hex 2e3 hex 2e3 hex 2e3
hex 2e3 hex 2e3 hex 2e4 hex 2e4 hex 2e4 hex 2e4 hex 2e4 hex 2e5
hex 2e5 hex 2e5 hex 2e5 hex 2e6 hex 2e6 hex 2e6 hex 2e6 hex 2e6
hex 2e7 hex 2e7 hex 2e7 hex 2e7 hex 2e8 hex 2e8 hex 2e8 hex 2e8
hex 2e8 hex 2e9 hex 2e9 hex 2e9 hex 2e9 hex 2ea hex 2ea hex 2ea
hex 2ea hex 2ea hex 2eb hex 2eb hex 2eb hex 2eb hex 2eb hex 2ec
hex 2ec hex 2ec hex 2ec hex 2ed hex 2ed hex 2ed hex 2ed hex 2ed
hex 2ee hex 2ee hex 2ee hex 2ee hex 2ef hex 2ef hex 2ef hex 2ef
hex 2ef hex 2f0 hex 2f0 hex 2f0 hex 2f0 hex 2f0 hex 2f1 hex 2f1
hex 2f1 hex 2f1 hex 2f2 hex 2f2 hex 2f2 hex 2f2 hex 2f2 hex 2f3
hex 2f3 hex 2f3 hex 2f3 hex 2f3 hex 2f4 hex 2f4 hex 2f4 hex 2f4
hex 2f5 hex 2f5 hex 2f5 hex 2f5 hex 2f5 hex 2f6 hex 2f6 hex 2f6
hex 2f6 hex 2f7 hex 2f7 hex 2f7 hex 2f7 hex 2f7 hex 2f8 hex 2f8
hex 2f8 hex 2f8 hex 2f8 hex 2f9 hex 2f9 hex 2f9 hex 2f9 hex 2fa
hex 2fa hex 2fa hex 2fa hex 2fa hex 2fb hex 2fb hex 2fb hex 2fb
hex 2fb hex 2fc hex 2fc hex 2fc hex 2fc hex 2fd hex 2fd hex 2fd
hex 2fd hex 2fd hex 2fe hex 2fe hex 2fe hex 2fe hex 2fe hex 2ff
hex 2ff hex 2ff hex 2ff hex 300 hex 300 hex 300 hex 300 hex 300
hex 301 hex 301 hex 301 hex 301 hex 301 hex 302 hex 302 hex 302
hex 302 hex 303 hex 303 hex 303 hex 303 hex 303 hex 304 hex 304
hex 304 hex 304 hex 304 hex 305 hex 305 hex 305 hex 305 hex 306
hex 306 hex 306 hex 306 hex 306 hex 307 hex 307 hex 307 hex 307
hex 307 hex 308 hex 308 hex 308 hex 308 hex 309 hex 309 hex 309
hex 309 hex 309 hex 30a hex 30a hex 30a hex 30a hex 30a hex 30b
hex 30b hex 30b hex 30b hex 30c hex 30c hex 30c hex 30c hex 30c
hex 30d hex 30d hex 30d hex 30d hex 30d hex 30e hex 30e hex 30e
hex 30e hex 30e hex 30f hex 30f hex 30f hex 30f hex 310 hex 310
hex 310 hex 310 hex 310 hex 311 hex 311 hex 311 hex 311 hex 311
hex 312 hex 312 hex 312 hex 312 hex 313 hex 313 hex 313 hex 313
hex 313 hex 314 hex 314 hex 314 hex 314 hex 314 hex 315 hex 315
hex 315 hex 315 hex 315 hex 316 hex 316 hex 316 hex 316 hex 317
hex 317 hex 317 hex 317 hex 317 hex 318 hex 318 hex 318 hex 318
hex 318 hex 319 hex 319 hex 319 hex 319 hex 319 hex 31a hex 31a
hex 31a hex 31a hex 31b hex 31b hex 31b hex 31b hex 31b hex 31c
hex 31c hex 31c hex 31c hex 31c hex 31d hex 31d hex 31d hex 31d
hex 31e hex 31e hex 31e hex 31e hex 31e hex 31f hex 31f hex 31f
hex 31f hex 31f hex 320 hex 320 hex 320 hex 320 hex 320 hex 321
hex 321 hex 321 hex 321 hex 321 hex 322 hex 322 hex 322 hex 322
hex 323 hex 323 hex 323 hex 323 hex 323 hex 324 hex 324 hex 324
hex 324 hex 324 hex 325 hex 325 hex 325 hex 325 hex 325 hex 326
hex 326 hex 326 hex 326 hex 327 hex 327 hex 327 hex 327 hex 327
hex 328 hex 328 hex 328 hex 328 hex 328 hex 329 hex 329 hex 329
hex 329 hex 329 hex 32a hex 32a hex 32a hex 32a hex 32a hex 32b hex 32b hex 32b hex 32b hex 32c hex 32c hex 32c hex 32c hex 32c
hex 32d hex 32d hex 32d hex 32d hex 32d hex 32e hex 32e hex 32e
hex 32e hex 32e hex 32f hex 32f hex 32f hex 32f hex 32f hex 330
hex 330 hex 330 hex 330 hex 331 hex 331 hex 331 hex 331 hex 331
hex 332 hex 332 hex 332 hex 332 hex 332 hex 333 hex 333 hex 333
hex 333 hex 333 hex 334 hex 334 hex 334 hex 334 hex 334 hex 335
hex 335 hex 335 hex 335 hex 335 hex 336 hex 336 hex 336 hex 336
hex 337 hex 337 hex 337 hex 337 hex 337 hex 338 hex 338 hex 338
hex 338 hex 338 hex 339 hex 339 hex 339 hex 339 hex 339 hex 33a
hex 33a hex 33a hex 33a hex 33a hex 33b hex 33b hex 33b hex 33b
hex 33b hex 33c hex 33c hex 33c hex 33c hex 33d hex 33d hex 33d
hex 33d hex 33d hex 33e hex 33e hex 33e hex 33e hex 33e hex 33f
hex 33f hex 33f hex 33f hex 33f hex 340 hex 340 hex 340 hex 340
hex 340 hex 341 hex 341 hex 341 hex 341 hex 341 hex 342 hex 342
hex 342 hex 342 hex 342 hex 343 hex 343 hex 343 hex 343 hex 344
hex 344 hex 344 hex 344 hex 344 hex 345 hex 345 hex 345 hex 345
hex 345 hex 346 hex 346 hex 346 hex 346 hex 346 hex 347 hex 347
hex 347 hex 347 hex 347 hex 348 hex 348 hex 348 hex 348 hex 348
hex 349 hex 349 hex 349 hex 349 hex 349 hex 34a hex 34a hex 34a
hex 34a hex 34a hex 34b hex 34b hex 34b hex 34b hex 34b hex 34c
hex 34c hex 34c hex 34c hex 34c hex 34d hex 34d hex 34d hex 34d
hex 34d hex 34e hex 34e hex 34e hex 34e hex 34f hex 34f hex 34f
hex 34f hex 34f hex 350 hex 350 hex 350 hex 350 hex 350 hex 351
hex 351 hex 351 hex 351 hex 351 hex 352 hex 352 hex 352 hex 352
hex 352 hex 353 hex 353 hex 353 hex 353 hex 353 hex 354 hex 354
hex 354 hex 354 hex 354 hex 355 hex 355 hex 355 hex 355 hex 355
hex 356 hex 356 hex 356 hex 356 hex 356 hex 357 hex 357 hex 357
hex 357 hex 357 hex 358 hex 358 hex 358 hex 358 hex 358 hex 359
hex 359 hex 359 hex 359 hex 359 hex 35a hex 35a hex 35a hex 35a
hex 35a hex 35b hex 35b hex 35b hex 35b hex 35b hex 35c hex 35c
hex 35c hex 35c hex 35c hex 35d hex 35d hex 35d hex 35d hex 35d
hex 35e hex 35e hex 35e hex 35e hex 35e hex 35f hex 35f hex 35f
hex 35f hex 35f hex 360 hex 360 hex 360 hex 360 hex 360 hex 361
hex 361 hex 361 hex 361 hex 362 hex 362 hex 362 hex 362 hex 362
hex 363 hex 363 hex 363 hex 363 hex 363 hex 364 hex 364 hex 364
hex 364 hex 364 hex 365 hex 365 hex 365 hex 365 hex 365 hex 366
hex 366 hex 366 hex 366 hex 366 hex 367 hex 367 hex 367 hex 367
hex 367 hex 368 hex 368 hex 368 hex 368 hex 368 hex 369 hex 369
hex 369 hex 369 hex 369 hex 36a hex 36a hex 36a hex 36a hex 36a
hex 36b hex 36b hex 36b hex 36b hex 36b hex 36c hex 36c hex 36c
hex 36c hex 36c hex 36d hex 36d hex 36d hex 36d hex 36d hex 36e
hex 36e hex 36e hex 36e hex 36e hex 36f hex 36f hex 36f hex 36f
hex 36f hex 370 hex 370 hex 370 hex 370 hex 370 hex 371 hex 371
hex 371 hex 371 hex 371 hex 371 hex 372 hex 372 hex 372 hex 372
hex 372 hex 373 hex 373 hex 373 hex 373 hex 373 hex 374 hex 374
hex 374 hex 374 hex 374 hex 375 hex 375 hex 375 hex 375 hex 375 hex 376 hex 376 hex 376 hex 376 hex 376 hex 377 hex 377 hex 377
hex 377 hex 377 hex 378 hex 378 hex 378 hex 378 hex 378 hex 379
hex 379 hex 379 hex 379 hex 379 hex 37a hex 37a hex 37a hex 37a
hex 37a hex 37b hex 37b hex 37b hex 37b hex 37b hex 37c hex 37c
hex 37c hex 37c hex 37c hex 37d hex 37d hex 37d hex 37d hex 37d
hex 37e hex 37e hex 37e hex 37e hex 37e hex 37f hex 37f hex 37f
hex 37f hex 37f hex 380 hex 380 hex 380 hex 380 hex 380 hex 381
hex 381 hex 381 hex 381 hex 381 hex 381 hex 382 hex 382 hex 382
hex 382 hex 382 hex 383 hex 383 hex 383 hex 383 hex 383 hex 384
hex 384 hex 384 hex 384 hex 384 hex 385 hex 385 hex 385 hex 385
hex 385 hex 386 hex 386 hex 386 hex 386 hex 386 hex 387 hex 387
hex 387 hex 387 hex 387 hex 388 hex 388 hex 388 hex 388 hex 388
hex 389 hex 389 hex 389 hex 389 hex 389 hex 38a hex 38a hex 38a
hex 38a hex 38a hex 38a hex 38b hex 38b hex 38b hex 38b hex 38b
hex 38c hex 38c hex 38c hex 38c hex 38c hex 38d hex 38d hex 38d
hex 38d hex 38d hex 38e hex 38e hex 38e hex 38e hex 38e hex 38f
hex 38f hex 38f hex 38f hex 38f hex 390 hex 390 hex 390 hex 390
hex 390 hex 391 hex 391 hex 391 hex 391 hex 391 hex 392 hex 392
hex 392 hex 392 hex 392 hex 392 hex 393 hex 393 hex 393 hex 393
hex 393 hex 394 hex 394 hex 394 hex 394 hex 394 hex 395 hex 395
hex 395 hex 395 hex 395 hex 396 hex 396 hex 396 hex 396 hex 396
hex 397 hex 397 hex 397 hex 397 hex 397 hex 398 hex 398 hex 398
hex 398 hex 398 hex 399 hex 399 hex 399 hex 399 hex 399 hex 399
hex 39a hex 39a hex 39a hex 39a hex 39a hex 39b hex 39b hex 39b
hex 39b hex 39b hex 39c hex 39c hex 39c hex 39c hex 39c hex 39d
hex 39d hex 39d hex 39d hex 39d hex 39e hex 39e hex 39e hex 39e
hex 39e hex 39e hex 39f hex 39f hex 39f hex 39f hex 39f hex 3a0
hex 3a0 hex 3a0 hex 3a0 hex 3a0 hex 3a1 hex 3a1 hex 3a1 hex 3a1
hex 3a1 hex 3a2 hex 3a2 hex 3a2 hex 3a2 hex 3a2 hex 3a3 hex 3a3
hex 3a3 hex 3a3 hex 3a3 hex 3a3 hex 3a4 hex 3a4 hex 3a4 hex 3a4
hex 3a4 hex 3a5 hex 3a5 hex 3a5 hex 3a5 hex 3a5 hex 3a6 hex 3a6
hex 3a6 hex 3a6 hex 3a6 hex 3a7 hex 3a7 hex 3a7 hex 3a7 hex 3a7
hex 3a8 hex 3a8 hex 3a8 hex 3a8 hex 3a8 hex 3a8 hex 3a9 hex 3a9
hex 3a9 hex 3a9 hex 3a9 hex 3aa hex 3aa hex 3aa hex 3aa hex 3aa
hex 3ab hex 3ab hex 3ab hex 3ab hex 3ab hex 3ac hex 3ac hex 3ac
hex 3ac hex 3ac hex 3ac hex 3ad hex 3ad hex 3ad hex 3ad hex 3ad
hex 3ae hex 3ae hex 3ae hex 3ae hex 3ae hex 3af hex 3af hex 3af
hex 3af hex 3af hex 3b0 hex 3b0 hex 3b0 hex 3b0 hex 3b0 hex 3b0
hex 3b1 hex 3b1 hex 3b1 hex 3b1 hex 3b1 hex 3b2 hex 3b2 hex 3b2
hex 3b2 hex 3b2 hex 3b3 hex 3b3 hex 3b3 hex 3b3 hex 3b3 hex 3b4
hex 3b4 hex 3b4 hex 3b4 hex 3b4 hex 3b4 hex 3b5 hex 3b5 hex 3b5
hex 3b5 hex 3b5 hex 3b6 hex 3b6 hex 3b6 hex 3b6 hex 3b6 hex 3b7
hex 3b7 hex 3b7 hex 3b7 hex 3b7 hex 3b8 hex 3b8 hex 3b8 hex 3b8
hex 3b8 hex 3b8 hex 3b9 hex 3b9 hex 3b9 hex 3b9 hex 3b9 hex 3ba
hex 3ba hex 3ba hex 3ba hex 3ba hex 3bb hex 3bb hex 3bb hex 3bb hex 3bb hex 3bb hex 3bc hex 3bc hex 3bc hex 3bc hex 3bc hex 3bd
hex 3bd hex 3bd hex 3bd hex 3bd hex 3be hex 3be hex 3be hex 3be
hex 3be hex 3bf hex 3bf hex 3bf hex 3bf hex 3bf hex 3bf hex 3c0
hex 3c0 hex 3c0 hex 3c0 hex 3c0 hex 3c1 hex 3c1 hex 3c1 hex 3c1
hex 3c1 hex 3c2 hex 3c2 hex 3c2 hex 3c2 hex 3c2 hex 3c2 hex 3c3
hex 3c3 hex 3c3 hex 3c3 hex 3c3 hex 3c4 hex 3c4 hex 3c4 hex 3c4
hex 3c4 hex 3c5 hex 3c5 hex 3c5 hex 3c5 hex 3c5 hex 3c5 hex 3c6
hex 3c6 hex 3c6 hex 3c6 hex 3c6 hex 3c7 hex 3c7 hex 3c7 hex 3c7
hex 3c7 hex 3c8 hex 3c8 hex 3c8 hex 3c8 hex 3c8 hex 3c8 hex 3c9
hex 3c9 hex 3c9 hex 3c9 hex 3c9 hex 3ca hex 3ca hex 3ca hex 3ca
hex 3ca hex 3cb hex 3cb hex 3cb hex 3cb hex 3cb hex 3cb hex 3cc
hex 3cc hex 3cc hex 3cc hex 3cc hex 3cd hex 3cd hex 3cd hex 3cd
hex 3cd hex 3ce hex 3ce hex 3ce hex 3ce hex 3ce hex 3ce hex 3cf
hex 3cf hex 3cf hex 3cf hex 3cf hex 3d0 hex 3d0 hex 3d0 hex 3d0
hex 3d0 hex 3d0 hex 3d1 hex 3d1 hex 3d1 hex 3d1 hex 3d1 hex 3d2
hex 3d2 hex 3d2 hex 3d2 hex 3d2 hex 3d3 hex 3d3 hex 3d3 hex 3d3
hex 3d3 hex 3d3 hex 3d4 hex 3d4 hex 3d4 hex 3d4 hex 3d4 hex 3d5
hex 3d5 hex 3d5 hex 3d5 hex 3d5 hex 3d6 hex 3d6 hex 3d6 hex 3d6
hex 3d6 hex 3d6 hex 3d7 hex 3d7 hex 3d7 hex 3d7 hex 3d7 hex 3d8
hex 3d8 hex 3d8 hex 3d8 hex 3d8 hex 3d8 hex 3d9 hex 3d9 hex 3d9
hex 3d9 hex 3d9 hex 3da hex 3da hex 3da hex 3da hex 3da hex 3db
hex 3db hex 3db hex 3db hex 3db hex 3db hex 3dc hex 3dc hex 3dc
hex 3dc hex 3dc hex 3dd hex 3dd hex 3dd hex 3dd hex 3dd hex 3dd
hex 3de hex 3de hex 3de hex 3de hex 3de hex 3df hex 3df hex 3df
hex 3df hex 3df hex 3df hex 3e0 hex 3e0 hex 3e0 hex 3e0 hex 3e0
hex 3e1 hex 3e1 hex 3e1 hex 3e1 hex 3e1 hex 3e2 hex 3e2 hex 3e2
hex 3e2 hex 3e2 hex 3e2 hex 3e3 hex 3e3 hex 3e3 hex 3e3 hex 3e3
hex 3e4 hex 3e4 hex 3e4 hex 3e4 hex 3e4 hex 3e4 hex 3e5 hex 3e5
hex 3e5 hex 3e5 hex 3e5 hex 3e6 hex 3e6 hex 3e6 hex 3e6 hex 3e6
hex 3e6 hex 3e7 hex 3e7 hex 3e7 hex 3e7 hex 3e7 hex 3e8 hex 3e8
hex 3e8 hex 3e8 hex 3e8 hex 3e9 hex 3e9 hex 3e9 hex 3e9 hex 3e9
hex 3e9 hex 3ea hex 3ea hex 3ea hex 3ea hex 3ea hex 3eb hex 3eb
hex 3eb hex 3eb hex 3eb hex 3eb hex 3ec hex 3ec hex 3ec hex 3ec
hex 3ec hex 3ed hex 3ed hex 3ed hex 3ed hex 3ed hex 3ed hex 3ee
hex 3ee hex 3ee hex 3ee hex 3ee hex 3ef hex 3ef hex 3ef hex 3ef
hex 3ef hex 3ef hex 3f0 hex 3f0 hex 3f0 hex 3f0 hex 3f0 hex 3f1
hex 3f1 hex 3f1 hex 3f1 hex 3f1 hex 3f1 hex 3f2 hex 3f2 hex 3f2
hex 3f2 hex 3f2 hex 3f3 hex 3f3 hex 3f3 hex 3f3 hex 3f3 hex 3f3
hex 3f4 hex 3f4 hex 3f4 hex 3f4 hex 3f4 hex 3f5 hex 3f5 hex 3f5
hex 3f5 hex 3f5 hex 3f5 hex 3f6 hex 3f6 hex 3f6 hex 3f6 hex 3f6
hex 3f7 hex 3f7 hex 3f7 hex 3f7 hex 3f7 hex 3f7 hex 3f8 hex 3f8
hex 3f8 hex 3f8 hex 3f8 hex 3f9 hex 3f9 hex 3f9 hex 3f9 hex 3f9
hex 3f9 hex 3fa hex 3fa hex 3fa hex 3fa hex 3fa hex 3fb hex 3fb
hex 3fb hex 3fb hex 3fb hex 3fb hex 3fc hex 3fc hex 3fc hex 3fc
hex 3fc hex 3fd hex 3fd hex 3fd hex 3fd hex 3fd hex 3fd hex 3fe
hex 3fe hex 3fe hex 3fe hex 3fe hex 3fe hex 3ff hex 3ff hex 3ff;

init chartbl
```
     9 8 7 7 6 6 6 6 5 5 5 5 5 5 5
     4 4 4 4 4 4 4 4 4 4 4 4 4 4 4
     3 3 3 3 3 3 3 3 3 3 3 3 3 3 3
     3 3 3 3 3 3 3 3 3 3 3 3 3 3 3
     2 2 2 2 2 2 2 2 2 2 2 2 2 2 2
     2 2 2 2 2 2 2 2 2 2 2 2 2 2 2
     2 2 2 2 2 2 2 2 2 2 2 2 2 2 2
     2 2 2 2 2 2 2 2 2 2 2 2 2 2 2
     1 1 1 1 1 1 1 1 1 1 1 1 1 1 1
     1 1 1 1 1 1 1 1 1 1 1 1 1 1 1
     1 1 1 1 1 1 1 1 1 1 1 1 1 1 1
     1 1 1 1 1 1 1 1 1 1 1 1 1 1 1
     1 1 1 1 1 1 1 1 1 1 1 1 1 1 1
     1 1 1 1 1 1 1 1 1 1 1 1 1 1 1
     1 1 1 1 1 1 1 1 1 1 1 1 1 1 1
     1 1 1 1 1 1 1 1 1 1 1 1 1 1 1
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0
     0 0 0 0 0 0 0 0 0 0 0 0 0 0 0;
  alogaddr=addr alogtbl
  logaddr=addr logtbl
  charaddr=addr chartbl
  probaddr=addr probtbl
endfn function inittbl;
  (initiallize parameters for the logcoder and decoder)

kmin2=0
  kmin1=1
  kmin=5
```

```
    kavg=8              (don't change without redoing the probtable)
    kmax=11
    maketbls            (set up addresses to alog, log tbls)
    b1=probaddr
    s=addr stats
    b1= probaddr
    b2=+s *12 100       (room for 99 states+dummy)
    begin
       dlrst=expl nmaxlp
       ist=b1
       kst=0
       mpsst=0
       if s llt b2
          s=+s 12
          repeat
       endif
    endbegin
  bpst=addr cbuffer
endfn function initenc;
  inittbl
  len=256
  bp=-bpst 3                (will output 2 zeroes before data)
  be=++bpst len 2           (allow two extra bytes at end of buffer)
  fill bp 0 +len 5          (clear buffer to zeros)
  x=0                       (clear out x)
  lr=hex 1001    (binary 1 00.00 0000 0001=characteristic of 4, mantissa lrm=lr
endfn function initdec;
  inittbl
  len=expl readc bpst rc
  bp=bpst
  be=+bpst len
  x=expl b
  bp=+bp 1
  x=sll x 8
  x=+x expl b
  lr=hex 1001    (binary 1 00.00 0000 0001=characteristic is 4, mantissa lrm=lr
  logx
```

```
  if x = hex ffff
    bp=+bp 1
  endif
endfn
```

Appendix 2. Antilog Table Generation Functions.

Storage Definitions:

```
  word flptbl(base b0) fdlptbl(base b0+4096);
  word lptbl(base b1) dlptbl(base b1+4096);
  word lptblx(base b1+4) dlptblx(base b1+4100);
 (word lmps(base b0) dlps(base b0+4)
       summ(base b0+8) summl(base b0+12) suml(base b0+16);
  word lmpsn(base b0+20) dlpsn(base b0+24);)
common
  word i ql qa cl c2 k m m2 n n2 pa pq pq1 pq4;
  word bsize sumli tx sx cnt sp err;
  float fi cr cn plim px p q piflps mf mf2;
  pointer linksv b2sv b2new b2st;
  word partial;
  pointer codest codend b0end b0tem;
  pointer b0st b2end;
  word cdbook(5120);
  array word declg(4096);
  array word a(1023) an(2047) asn(2047);
  array word as(1023) da(1023);
  array word flp(1023) fdl(1023);
  array word lp(1023) dl(1023);
  word dum(1024);
  array word declg2(4096);
```

Main routine for table generation:

```
function alogtbl qli(w) qai(w) ct(p,1);
  (generate the antilog table with the restriction that for each
   entry i and j, alog(i+j) <= * alog(i) alog(j)  )
   byte s(256);
   word so(12) i j x xn xn2 pq1 xs tcpu tcpux tcpusv;
   tcpusv=wordat +timer 28         (init cpu timer)
   tcpux=tcpusv
   q1=qli                          (init common with input)
   qa=qai
   s 0=0
   pq1=fixit pwr 2 q1
```

```
   pq=-pq1 1
   pq4=sll pq 2
   n=fixit pwr 2 qa
   pa=-n 1
   n2=*n 2
   if ql>10
      display 'can''t do'
      return;
   endif
   if & bytecount ct¬=0  ct 0¬=0
      s 0=0
      addstr s cat 'ALOG' todec ql,todec qa ' TABLE';
      display cat 'Reading file ' s;
      b0=addr a 0
      open r so b0 s fixed 4
      do i=0 to pq
         d0=read buffer a i so
         if d0¬=4
            display 'Input file too short'
            return;
         endif
         as i=fixit _floor _* floatit n power 2 /floatit i floatit pq1
      asn i=*as i n
      asn +i pq1=*2 asn i    (note that n*as and 2*n*as tables contiguous)
      da i=-a i as i
      a i=+as i da i
      an i=+asn i *da i n
      an +i pq1=+asn +i pq1 * da i n2
   enddo
   d0=read buffer a i so    (see if out of data)
   if d0¬=0
      display 'Input file too long'
      return;
   endif
   close so
   s 0=0                              (clear string)
else
   do i=0 to pq                       (generate first approximation to alog)
      as i=fixit _floor _* floatit n power 2 /floatit i floatit pq1
      asn i=*as i n
      asn +i pq1=*2 asn i    (note that n*as and 2*n*as tables contiguous)
   enddo
   (now adjust entries to table to insure a(i+j) ¬> * a(i) a(j))
   x= 0
   j=0
```

```
begin
  xn2=* x n2
  xn=* x n
  do i=j to pq                      (init da)
    da i=x
    a i=+as i x
    an i=+asn i xn
    an +i pq1=+asn +i pq1 xn2     (2*n*as contiguous with n*as table)
  enddo
  if chka¬=0
    display cat 'initial offset=' todec x ' is insufficient.';
    display '  Hit enter to continue.'
    input s
    x=+x 1
    j=1                            (j=1 keeps 0th entry at zero offset)
    if s 0=0
      pointerat Ggetbuf=+Ggetbuf 4
      repeat
    else
      display 'Present table does not meet antilog conditions.'
      return;
    endif
  endif
endbegin
display ' '
display cat 'Initial offset=' todec x ' is OK.';
display '  Hit enter to start optimization.'
display ' '
input s
endif
if s 0¬=0
  display 'Optimization incomplete, but table can be used.'
else
  begin
    xs=0                           (zero sum of offsets)
    m=+pq 1
    do i=pq to 0 by _1             (start at smallest antilog)
      a i=-a i 1                   (decrement a(i) by 1 unit and test)
      an i=-an i n
      an +i pq1=-an +i pq1 n2
      k=chka
      if k¬=0
        m=-m 1
        a i=+a i 1                 (restore if decrement is too much)
        an i=+an i n
```

```
         an +i pq1=+an +i pq1 n2
      else
         da i=-da i 1             (remember new delta)
      endif
      xs=+xs da i                 (update sum of offsets)
      tcpu=wordat +timer 28       (check cpu time usage)
      if | bytecount ct=0 & bytecount ct¬=0 ct 0 ¬<0
         if -tcpu tcpux > 10000000    (10 second interrupt)
            display cat 'elapsed cpu time='
                        tofloat /floatit /-tcpu tcpusv 10000 100
                        ' seconds.';
            display ' Hit enter to continue.'
            input s
         endif
         if s 0¬=0
            return;
         endif
         tcpux=tcpu
      endif
   enddo
   if | bytecount ct=0 & bytecount ct¬=0 ct 0 ¬<0
      tcpu=wordat +timer 28       (check cpu time usage)
      display cat 'elapsed cpu time='
                  tofloat /floatit /-tcpu tcpusv 10000 100
                  ' seconds.';
   endif
   if m¬=0                        (haven't exhausted all possibilities)
      if | bytecount ct=0 & bytecount ct¬=0 ct 0 ¬<0
         display cat 'average offset=' tofloat /floatit xs floatit pq1;
         display cat todec m ' not yet optimized.';
         display ' Hit enter to continue.'
         input s
      endif
      if s 0=0
         pointerat Ggetbuf=+Ggetbuf 4
         repeat
      endif
   else
      display cat 'optimization complete for qa=' todec qa ', ql='
              todec ql;
      display cat 'average offset=' tofloat /floatit xs floatit pq1;
   endif
  endbegin
 endif
 if unique=0
```

```
      s 0=0
      addstr s cat 'ALOG' todec ql todec qa ' TABLE';
      display cat 'Writing file ' s;
      b0=addr a 0
      open w so b0 s fixed 4
      do i=0 to pq
        write buffer a i so
      enddo
      close so
    endif
    tcpu=wordat +timer 28
  display cat 'total elapsed cpu time='
              tofloat / floatit /-tcpu tcpusv 10000 100
              ' seconds';
endfn Subroutines:

function chka;
 (check the antilog table to see if the restriction that for each
  log i and j,  alog(i+j) <= * alog(i) alog(j).  Note that if
  +i j>=1, the relation checked is /alog(-+i j 1) 2<=*alog(i) alog(j).
  This is done by making the tables for *n alog(i) and *2 *n alog(i)
  contiguous, such that when the sum of logs is greater than or equal
  to 1, the second test occurs.)
  pointer pt b0end;
  b0=addr a 0
  pt=b0
  b0end=+b0 expl pq4
  begin                          (sequence b0)
    b1=b0                        (point j index at i)
    b2=++b1 expl -b0 expl pt 4096   (index to an, an2 for sum of i+j)
    begin                        (search all j¬<i)
      if wordat b2 > * wordat b0 wordat b1
        return asword 1
      endif
      if b1 llt b0end
        b1=+b1 4
        b2=+b2 4
        repeat
      endif
    endbegin
    if b0 llt b0end
      b0=+b0 4
      repeat
```

```
      endif
   endbegin
   return asword 0
endfn function unique;
   (check uniqueness of all entries in array a.  This is a requirement
   for generating a reversible log (antilog x) = x table.)
   word i k pq;
   pq=fixit pwr 2 ql
   pq=-pq 2
   k=0
   do i=0 to pq
      if a i= a +i 1
         k=+i 1
      endif
   enddo
   if k¬=0
      display cat 'table entries not unique, last index=' todec -k 1;
   else
      display 'all table entries unique'
   endif
   return k
endfn Routine to invert the address order of the antilog table:

function flipal qli(w) qai(w);
(read in the antilog table, invert the address order, and format for
an init process)
byte s(256);
word a(1025) ai(1024) so;
pointer b0s b0end;
s 0=0
ql=qli
qa=qai
addstr s cat 'ALOG' todec ql todec qa ' TABLE';
display cat 'Reading file ' s;
b0=addr a
open r so b0 s fixed 4
   begin                        (read in the table)
      d0=read buffer b0 so
      if d0=4
         b0=+b0 4
         repeat
```

```
        endif
    endbegin
    close so
    b0=+addr a *4 fixit pwr 2 q1    .(q1 +1 entries of alog table)
    wordat b0=sll a 0 1         (force last entry to be 2)
    b1=addr ai                  (start of inverse order table)
    b0end=addr a                (1st entry in a table)
    begin
        s 0=0                   (clear the string)
        b2=-b0 32               (go for 8 hex words)
        if b0end lgt b2
            b2=b0end
        endif
        begin
        wordat b1=wordat b0
        addstr s cat ' hex ' tohex wordat b1 4;
        b0=-b0 4
        b1=+b1 4
        if b0 lgt b2
            repeat
        endif
        endbegin
        display s
        pointerat Ggetbuf=+Ggetbuf 4
        if b0 lgt b0end
            repeat
        endif
    endbegin
endfn
```

Appendix 3.  LP, LQP table generation, including the general table generation and the routines to collapse the table.

Storage Definitions:
  See Appendix 2.

Routine to generate complete log P, log Q/P table:

```
function logtbl;
    (generate table of (-log p), (log p)-(log q), using constraint that
        1 ¬< alog (log p) + alog (log q)
    where log q is the largest log value which, within quantization
    limits, will fit within the range of 1)
    float pp;
    byte s(80) ss(20);
    word i j p t ldd tl exprnge so;
```

```
    s 0=0
    pq1=fixit pwr 2 ql
    pq=-pq1 1
    addstr s cat 'ALOG' todec ql todec qa ' TABLE';
    display cat 'Reading file ' s;
    b0=addr a 0
    open r so b0 s fixed 4
    do i=0 to pq
      d0=read buffer a i so
      if d0¬=4
        display 'Input file too short'
        return;
      endif
    enddo
    j=fixit pwr 2 ql
    exprnge=sll fixit pwr 2 qa 16
    do i=j to 1 by _1      (generate for all possible log values of mps)
      flp -j i=i
      lp -j i=i
      pp=alog _i
      p=alogi _i
      t=fixit floor *floatit j log2 -1 pp   (estimate log)
      t=+t 2
      k=_2
      begin                 (range checking)
        if exprnge <+p alogi t    (see if antilog of trial log fits)
          t=-t 1           (if not, make more negative)
          k=+k 1
          repeat
        endif
      endbegin
      ldd=_+i t
      fdl -j i=ldd
      dl - j i=ldd
      t=_t
      (formatit '' i t ldd k;)
      pointerat Ggetbuf=+Ggetbuf 4
    enddo
  endfn Subroutines for above:

function alog lg(w);
  (generate antilog for any value of log)
  (variables ql and qa are in common, preset at entry to precision
  of log and antilog tables.  Returns floating point result.)
```

```
  word x c m;
  float y cf;
  c=sra lg ql        (characteristic of log. Round makes more neg)
  m=-lg sll c ql     (mantissa of log)
  x=a m              (antilog for mantissa)
  if c¬<0            (if c positive or zero)
    c=sll 1 c
    y=floatit c
  else
    c=sll 1 _c
    y=/1 floatit c
  endif
  y=*y floatit x
  y=/y power 2 floatit qa
  return y
endfn function alogi lg(w);
  (generate antilog for any value of log)
  (variables ql and qa are in common, preset at entry to precision
  of log and antilog tables. Returns floating point result.)
  word x c m;
  word y;
  c=sra lg ql        (characteristic of log)
  m=-lg sll c ql     (mantissa of log)
  x=a m              (antilog for mantissa)
  x=sll x 16         (shift up by 16 bits)
  if c¬<0            (if c positive or zero)
    if c>-16 qa
      display cat 'alogi: log too positive at ' todec c;
    endif
    x=sll x c
  else
    x=srl x _c
    if c<_16
      display cat 'alogi: log too negative at ' todec c;
      display cat 'lg=' todec lg;
    endif
  endif
  return x
endfn function shorttbl;
  (eliminate unused entries in lp table)
  float p q i li;
```

```
word k j z;
pointer b0sv;
j=-fixit pwr 2 ql 1    (number of entries in full table - 1)
b0=addr flp 0
codend=+b0 expl sll j 2
b1=addr lp 0           (storage for truncated table)
fill b1 0 *3 4096      (zero the table)
li=_3
b0sv=b0
lptbl=flptbl           (save first entry in truncated table)
dlptbl=fdlptbl
cnt=1
z=1
begin
  li=+li .01
  i=power 2 li         (next i index for probability)
  q=/16 +32 i          (prob lps)
  p=-1 q
  cr=+ *p floatit flptbl * q floatit +flptbl fdlptbl
  begin
    b0=+b0 4           (next table entry)
    cn=+ *p floatit flptbl * q floatit +flptbl fdlptbl
    if cn<cr
      b0sv=b0
      cr=cn
    endif
    if | b0 lge codend  0.1< /-cn cr cr
      b0=b0sv
      if lptbl¬=flptbl
        pointerat Ggetbuf=+4 Ggetbuf
        formatit '' lptbl dlptbl cnt;
        b1=+b1 4        (new slot in truncated table)
        lptbl=flptbl    (save in truncated table)
        dlptbl=fdlptbl
        z=+z 1
        cnt=1
      else
        cnt=+cnt 1
      endif
    else
      repeat
    endif
  endbegin
  if lptbl¬=1
    repeat
```

```
      endif
   endbegin
   pointerat Ggetbuf=+4 Ggetbuf
   formatit '' lptbl dlptbl cnt;
   display cat 'table length=' todec z;
endfn function shorter cmp(f);
   (eliminate all codewords following each codeword used if error to
   codeword following is less than 0.1%)

float nf qx cr ie re;
   pointer b1sv;
   word lmps0(base b0) dlps0(base b0+4096);
   word lmps1(base b1) dlps1(base b1+4096);
   static
      word kmax;
      init kmax 8;
   b0=addr lp 0                              (start b0 at beginning of table)
   b1=+b0 4                                  (and b1 at next word)
   b1sv=b1
   nf=pwr 2 q1                               (normalizing constant for logs)
   formatit '' lmps0 dlps0;
   begin                                     (remove entries from codebook)
      begin
         qx=/ floatit -lmps0 lmps1 floatit -dlps1 dlps0   (intersection)
         cr=+ * -1 qx floatit lmps0 * qx floatit +lmps0 dlps0   (code rate)
         cr=/cr nf                           (normalize)
         ie= + * -1 qx _log2 -1 qx * qx _log2 qx   (ideal entropy)
         re= /-cr ie ie                      (relative error)
         if re < cmp                         (if error small)
            if lmps1>1                       (if not end of bk)
               b1=+b1 4
               repeat
            endif
         else
            if b1 lgt b1sv                   (if b1 incr)
               b1=-b1 4                      (back up one entry)
            endif
         endif
      endbegin
      b0=+b0 4                               (next table slot)
      lmps0=lmps1                            (transfer entries)
      dlps0=dlps1
      pointerat Ggetbuf=+4 Ggetbuf
```

```
    formatit '' lmps0 dlps0;
    if lmps1 > 1                                    (more to go)
      b1=+b1 4
      b1sv=b1
      repeat
    else
      b0=+b0 4
      lmps0=0                                       (terminate table)
      dlps0=0
    endif
  endbegin
  display cat 'table length=' todec / expl -b0 expl addr lp 0 4;
endfn
```

Appendix 4. LX table generation.

```
function dectbl qli(w) qai(w);
  (structure a log table such that lx' = log (antilog (lx'))

lx' <= lx for all antilog values which are between values
               generated by the antilog table.
```

Basically, for each Xc generated by the antilog table, we must be able to distinguish between Xc and Xc-1. If $X \geq Xc$, we have a lps, and if $X \leq Xc-1$, we have a mps. Therefore, for any given antilog table output, if X is less than that output, log(X) should be rounded down to the next antilog table output. Note that the log(R) value must be decremented by at least one for the next symbol, eliminating any possibility of confusion for X between this Xc and the next antilog.

The normal sign convention holds: log(x) is an increasing monotonic function of x, and antilog(y) is an increasing monotonic function of y.

The antilog is quantized such that there are $m=2^{**}qa$ possible values. Decodability demands that the precision be sufficient that no two output values are the same.

The log is quantized such that there are $n=2^{**}ql$ possible values. Therefore, since there must be an entry in the antilog table for every possible log value, the antilog table will have n entries and therefore n (unique) output values, $q_1, q_2, \ldots q_n$.

Similarly, since there must be an entry in the log table for every possible antilog value, the log table will have m entries and therefore m output values. The uniqueness of the antilog output puts constraints on the log and antilog precisions such that the the log outputs cannot be unique. n < m, and for our case:

ql=10, n=1024
   qa=12, m=4096

With n entries in the antilog table, not all possible antilog values can be generated by the table. The log table must be such that $$L(q)=L(q<x>) \quad \text{where} \quad q<x> <= q < q<x+1>$$

where $L(q<x>)$ is defined to be the inverse of the antilog table.

q<x> := antilog(y<x>)
   L(q<x>)=y<x>
)
word i q cnt y yn yc;
cnt=0
i=0                             (index into a)
y=a i                           (current alog output)
yn=a +i 1                       (next alog output)
do q=0 to srl hex fff -12 qai   (go over all possible values of alog)
  yc=+q srl hex 1000 -12 qai
  if yn -> yc                   (if next alog output < logtbl index)
    i=+i 1                      (get next value of y)
    y=yn                        (take current output)
    if i < srl hex 3ff -10 qli
      yn=a +i 1                 (get next alog output)
    else
      yn=srl hex 2000 -12 qai   (force wraparound)
      endif
    endif
    declg q=i
  enddo
endfn

Appendix 5. Test Sequence for a small data set.

The test file was generated using a random number generator set such that the probability of 0's in the binary sequence was 0.1. The actual number of zeros in the file was 27 (out of 256 symbols), and if coded to the entropy limit, the file would have compressed to 124.4 bits (given a priori knowledge of the probability). The results show the values after completion of each event.
Test data (in hexadecimal form):

effffffeffff6c7fffffffffffbdff3fdffffff6f5f7febffbdff6edffe7ff

Encoder:

| EVENT | YN | MPS | LR | LRM | X | DX | K | LP |
|---|---|---|---|---|---|---|---|---|
| 0 | - | - | 1001 | 1001 | 00000000 | - | - | - |
| 1 | 1 | 0 | 1401 | 5001 | 00007ff4 | 007ff4 | 01 | 400 |
| 2 | 1 | 0 | 1801 | 5001 | 0000bfee | 003ffa | 02 | 400 |
| 3 | 1 | 0 | 1c01 | 5001 | 0000dfeb | 001ffd | 03 | 400 |
| 4 | 0 | 0 | 2001 | 5001 | 0000dfeb | 000000 | 03 | 400 |
| 5 | 1 | 0 | 0401 | 3001 | 00e7ea40 | 07ff40 | 04 | 400 |
| 6 | 1 | 0 | 0801 | 3001 | 00ebe9e0 | 03ffa0 | 05 | 400 |
| 7 | 1 | 0 | 0c01 | 3001 | 00ede9b0 | 01ffd0 | 06 | 400 |
| 8 | 1 | 0 | 1001 | 3001 | 00eee998 | 00ffe8 | 07 | 400 |
| 9 | 1 | 0 | 1401 | 3001 | 00ef698c | 007ff4 | 08 | 400 |
| 10 | 1 | 0 | 1801 | 3001 | 00efa986 | 003ffa | 09 | 400 |
| 11 | 1 | 0 | 1c01 | 3001 | 00efc983 | 001ffd | 0a | 400 |
| 12 | 1 | 1 | 0001 | 3b02 | efd98180 | 0ffe80 | 00 | 31b |
| 13 | 1 | 1 | 031c | 3b02 | efd98180 | 000000 | 00 | 31b |
| 14 | 1 | 1 | 0637 | 3b02 | efd98180 | 000000 | 00 | 31b |
| 15 | 1 | 1 | 0952 | 3b02 | efd98180 | 000000 | 00 | 31b |
| 16 | 1 | 1 | 0c6d | 3b02 | efd98180 | 000000 | 00 | 31b |
| 17 | 1 | 1 | 0f88 | 3b02 | efd98180 | 000000 | 00 | 31b |
| 18 | 1 | 1 | 12a3 | 3b02 | efd98180 | 000000 | 00 | 31b |
| 19 | 1 | 1 | 15be | 3b02 | efd98180 | 000000 | 00 | 31b |
| 20 | 1 | 1 | 18d9 | 3b02 | efd98180 | 000000 | 00 | 31b |
| 21 | 1 | 1 | 1bf4 | 3b02 | efd98180 | 000000 | 00 | 31b |
| 22 | 1 | 1 | 1f0f | 3b02 | efd98180 | 000000 | 00 | 31b |
| 23 | 1 | 1 | 222a | 3b02 | efd98180 | 000000 | 00 | 31b |
| 24 | 1 | 1 | 2545 | 3b02 | efd98180 | 000000 | 00 | 31b |
| 25 | 1 | 1 | 2860 | 3b02 | efd98180 | 000000 | 00 | 31b |
| 26 | 1 | 1 | 2b7b | 3b02 | efd98180 | 000000 | 00 | 31b |
| 27 | 1 | 1 | 2e96 | 3b02 | efd98180 | 000000 | 00 | 31b |
| 28 | 1 | 1 | 31b1 | 3b02 | efd98180 | 000000 | 00 | 31b |
| 29 | 1 | 1 | 34cc | 3b02 | efd98180 | 000000 | 00 | 31b |
| 30 | 1 | 1 | 37e7 | 3b02 | efd98180 | 000000 | 00 | 31b |
| 31 | 1 | 1 | 3b02 | 6b21 | efd98180 | 000000 | 00 | 07f |
| 32 | 0 | 1 | 296f | 590f | d981a2e6 | 0022e6 | 01 | 07f |
| 33 | 1 | 1 | 29ee | 590f | d981a2e6 | 000000 | 01 | 07f |
| 34 | 1 | 1 | 2a6d | 590f | d981a2e6 | 000000 | 01 | 07f |
| 35 | 1 | 1 | 2aec | 590f | d981a2e6 | 000000 | 01 | 07f |
| 36 | 1 | 1 | 2b6b | 590f | d981a2e6 | 000000 | 01 | 07f |
| 37 | 1 | 1 | 2bea | 590f | d981a2e6 | 000000 | 01 | 07f |
| 38 | 1 | 1 | 2c69 | 590f | d981a2e6 | 000000 | 01 | 07f |
| 39 | 1 | 1 | 2ce8 | 590f | d981a2e6 | 000000 | 01 | 07f |
| 40 | 1 | 1 | 2d67 | 590f | d981a2e6 | 000000 | 01 | 07f |

| | | | | | | | | |
|---|---|---|---|---|---|---|---|---|
| 41 | 1 | 1 | 2de6 | 590f | d981a2e6 | 000000 | 01 | 07f |
| 42 | 1 | 1 | 2e65 | 590f | d981a2e6 | 000000 | 01 | 07f |
| 43 | 1 | 1 | 2ee4 | 590f | d981a2e6 | 000000 | 01 | 07f |
| 44 | 1 | 1 | 2f63 | 590f | d981a2e6 | 000000 | 01 | 07f |
| 45 | 1 | 1 | 2fe2 | 590f | d981a2e6 | 000000 | 01 | 07f |
| 46 | 1 | 1 | 3061 | 590f | d981a2e6 | 000000 | 01 | 07f |
| 47 | 1 | 1 | 30e0 | 590f | d981a2e6 | 000000 | 01 | 07f |
| 48 | 1 | 1 | 315f | 590f | d981a2e6 | 000000 | 01 | 07f |
| 49 | 1 | 1 | 31de | 590f | d981a2e6 | 000000 | 01 | 07f |
| 50 | 1 | 1 | 325d | 590f | d981a2e6 | 000000 | 01 | 07f |
| 51 | 1 | 1 | 32dc | 590f | d981a2e6 | 000000 | 01 | 07f |
| 52 | 1 | 1 | 335b | 590f | d981a2e6 | 000000 | 01 | 07f |
| 53 | 0 | 1 | 21c8 | 46fd | 81a36968 | 008368 | 02 | 07f |
| 54 | 1 | 1 | 2247 | 46fd | 81a36968 | 000000 | 02 | 07f |
| 55 | 1 | 1 | 22c6 | 46fd | 81a36968 | 000000 | 02 | 07f |
| 56 | 0 | 1 | 1133 | 34eb | a3727e00 | 091600 | 03 | 07f |
| 57 | 1 | 1 | 11b2 | 34eb | a3727e00 | 000000 | 03 | 07f |
| 58 | 1 | 1 | 1231 | 34eb | a3727e00 | 000000 | 03 | 07f |
| 59 | 0 | 1 | 209e | 42d9 | a3731ec8 | 00a0c8 | 04 | 07f |
| 60 | 0 | 1 | 0f0b | 30c7 | 732bfa80 | 0d3280 | 05 | 07f |
| 61 | 0 | 1 | 1d78 | 3eb5 | 732d1000 | 011580 | 06 | 07f |
| 62 | 1 | 1 | 1df7 | 3eb5 | 732d1000 | 000000 | 06 | 07f |
| 63 | 1 | 1 | 1e76 | 3eb5 | 732d1000 | 000000 | 06 | 07f |
| 64 | 1 | 1 | 1ef5 | 3eb5 | 732d1000 | 000000 | 06 | 07f |
| 65 | 1 | 1 | 1f74 | 3eb5 | 732d1000 | 000000 | 06 | 07f |
| 66 | 1 | 1 | 1ff3 | 3eb5 | 732d1000 | 000000 | 06 | 07f |
| 67 | 1 | 1 | 2072 | 3eb5 | 732d1000 | 000000 | 06 | 07f |
| 68 | 1 | 1 | 20f1 | 3eb5 | 732d1000 | 000000 | 06 | 07f |
| 69 | 1 | 1 | 2170 | 3eb5 | 732d1000 | 000000 | 06 | 07f |
| 70 | 1 | 1 | 21ef | 3eb5 | 732d1000 | 000000 | 06 | 07f |
| 71 | 1 | 1 | 226e | 3eb5 | 732d1000 | 000000 | 06 | 07f |
| 72 | 1 | 1 | 22ed | 3eb5 | 732d1000 | 000000 | 06 | 07f |
| 73 | 1 | 1 | 236c | 3eb5 | 732d1000 | 000000 | 06 | 07f |
| 74 | 1 | 1 | 23eb | 3eb5 | 732d1000 | 000000 | 06 | 07f |
| 75 | 1 | 1 | 246a | 3eb5 | 732d1000 | 000000 | 06 | 07f |
| 76 | 1 | 1 | 24e9 | 3eb5 | 732d1000 | 000000 | 06 | 07f |
| 77 | 1 | 1 | 2568 | 3eb5 | 732d1000 | 000000 | 06 | 07f |
| 78 | 1 | 1 | 25e7 | 3eb5 | 732d1000 | 000000 | 06 | 07f |
| 79 | 1 | 1 | 2666 | 3eb5 | 732d1000 | 000000 | 06 | 07f |
| 80 | 1 | 1 | 26e5 | 3eb5 | 732d1000 | 000000 | 06 | 07f |
| 81 | 1 | 1 | 2764 | 3eb5 | 732d1000 | 000000 | 06 | 07f |
| 82 | 1 | 1 | 27e3 | 3eb5 | 732d1000 | 000000 | 06 | 07f |
| 83 | 1 | 1 | 2862 | 3eb5 | 732d1000 | 000000 | 06 | 07f |
| 84 | 1 | 1 | 28e1 | 3eb5 | 732d1000 | 000000 | 06 | 07f |
| 85 | 1 | 1 | 2960 | 3eb5 | 732d1000 | 000000 | 06 | 07f |

| | | | | | | | |
|---|---|---|---|---|---|---|---|
| 86 | 1 | 1 | 29df | 3eb5 | 732d1000 | 000000 | 06 | 07f |
| 87 | 1 | 1 | 2a5e | 3eb5 | 732d1000 | 000000 | 06 | 07f |
| 88 | 1 | 1 | 2add | 3eb5 | 732d1000 | 000000 | 06 | 07f |
| 89 | 1 | 1 | 2b5c | 3eb5 | 732d1000 | 000000 | 06 | 07f |
| 90 | 1 | 1 | 2bdb | 3eb5 | 732d1000 | 000000 | 06 | 07f |
| 91 | 1 | 1 | 2c5a | 3eb5 | 732d1000 | 000000 | 06 | 07f |
| 92 | 1 | 1 | 2cd9 | 3eb5 | 732d1000 | 000000 | 06 | 07f |
| 93 | 1 | 1 | 2d58 | 3eb5 | 732d1000 | 000000 | 06 | 07f |
| 94 | 1 | 1 | 2dd7 | 3eb5 | 732d1000 | 000000 | 06 | 07f |
| 95 | 1 | 1 | 2e56 | 3eb5 | 732d1000 | 000000 | 06 | 07f |
| 96 | 1 | 1 | 2ed5 | 3eb5 | 732d1000 | 000000 | 06 | 07f |
| 97 | 1 | 1 | 2f54 | 3eb5 | 732d1000 | 000000 | 06 | 07f |
| 98 | 1 | 1 | 2fd3 | 3eb5 | 732d1000 | 000000 | 06 | 07f |
| 99 | 1 | 1 | 3052 | 3eb5 | 732d1000 | 000000 | 06 | 07f |
| 100 | 1 | 1 | 30d1 | 3eb5 | 732d1000 | 000000 | 06 | 07f |
| 101 | 1 | 1 | 3150 | 3eb5 | 732d1000 | 000000 | 06 | 07f |
| 102 | 1 | 1 | 31cf | 3eb5 | 732d1000 | 000000 | 06 | 07f |
| 103 | 1 | 1 | 324e | 3eb5 | 732d1000 | 000000 | 06 | 07f |
| 104 | 1 | 1 | 32cd | 3eb5 | 732d1000 | 000000 | 06 | 07f |
| 105 | 1 | 1 | 334c | 3eb5 | 732d1000 | 000000 | 06 | 07f |
| 106 | 1 | 1 | 33cb | 3eb5 | 732d1000 | 000000 | 06 | 07f |
| 107 | 1 | 1 | 344a | 3eb5 | 732d1000 | 000000 | 06 | 07f |
| 108 | 1 | 1 | 34c9 | 3eb5 | 732d1000 | 000000 | 06 | 07f |
| 109 | 1 | 1 | 3548 | 3eb5 | 732d1000 | 000000 | 06 | 07f |
| 110 | 0 | 1 | 23b5 | 2ca3 | 2d105e20 | 005e20 | 07 | 07f |
| 111 | 1 | 1 | 2434 | 2ca3 | 2d105e20 | 000000 | 07 | 07f |
| 112 | 1 | 1 | 24b3 | 2ca3 | 2d105e20 | 000000 | 07 | 07f |
| 113 | 1 | 1 | 2532 | 2ca3 | 2d105e20 | 000000 | 07 | 07f |
| 114 | 1 | 1 | 25b1 | 2ca3 | 2d105e20 | 000000 | 07 | 07f |
| 115 | 0 | 1 | 141e | 1a91 | 10639ac0 | 057ac0 | 08 | 07f |
| 116 | 1 | 1 | 149d | 1a91 | 10639ac0 | 000000 | 08 | 07f |
| 117 | 1 | 1 | 151c | 1a91 | 10639ac0 | 000000 | 08 | 07f |
| 118 | 1 | 1 | 159b | 1a91 | 10639ac0 | 000000 | 08 | 07f |
| 119 | 1 | 1 | 161a | 1a91 | 10639ac0 | 000000 | 08 | 07f |
| 120 | 1 | 1 | 1699 | 1a91 | 10639ac0 | 000000 | 08 | 07f |
| 121 | 1 | 1 | 1718 | 1a91 | 10639ac0 | 000000 | 08 | 07f |
| 122 | 1 | 1 | 1797 | 1a91 | 10639ac0 | 000000 | 08 | 07f |
| 123 | 1 | 1 | 1816 | 1a91 | 10639ac0 | 000000 | 08 | 07f |
| 124 | 1 | 1 | 1895 | 1a91 | 10639ac0 | 000000 | 08 | 07f |
| 125 | 0 | 1 | 2702 | 287f | 1063cfde | 00351e | 09 | 07f |
| 126 | 0 | 1 | 156f | 166d | 63d43ac0 | 045cc0 | 0a | 07f |
| 127 | 1 | 1 | 15ee | 166d | 63d43ac0 | 000000 | 0a | 07f |
| 128 | 1 | 1 | 166d | 468c | 63d43ac0 | 000000 | 00 | 07f |
| 129 | 1 | 1 | 16ec | 468c | 63d43ac0 | 000000 | 00 | 07f |
| 130 | 1 | 1 | 176b | 468c | 63d43ac0 | 000000 | 00 | 07f |

| 131 | 1 | 1 | 17ea | 468c | 63d43ac0 | 000000 | 00 | 07f |
| 132 | 1 | 1 | 1869 | 468c | 63d43ac0 | 000000 | 00 | 07f |
| 133 | 1 | 1 | 18e8 | 468c | 63d43ac0 | 000000 | 00 | 07f |
| 134 | 1 | 1 | 1967 | 468c | 63d43ac0 | 000000 | 00 | 07f |
| 135 | 0 | 1 | 27d4 | 547a | 63d468d6 | 002e16 | 01 | 07f |
| 136 | 1 | 1 | 2853 | 547a | 63d468d6 | 000000 | 01 | 07f |
| 137 | 1 | 1 | 28d2 | 547a | 63d468d6 | 000000 | 01 | 07f |
| 138 | 1 | 1 | 2951 | 547a | 63d468d6 | 000000 | 01 | 07f |
| 139 | 1 | 1 | 29d0 | 547a | 63d468d6 | 000000 | 01 | 07f |
| 140 | 1 | 1 | 2a4f | 547a | 63d468d6 | 000000 | 01 | 07f |
| 141 | 1 | 1 | 2ace | 547a | 63d468d6 | 000000 | 01 | 07f |
| 142 | 1 | 1 | 2b4d | 547a | 63d468d6 | 000000 | 01 | 07f |
| 143 | 1 | 1 | 2bcc | 547a | 63d468d6 | 000000 | 01 | 07f |
| 144 | 1 | 1 | 2c4b | 547a | 63d468d6 | 000000 | 01 | 07f |
| 145 | 1 | 1 | 2cca | 547a | 63d468d6 | 000000 | 01 | 07f |
| 146 | 1 | 1 | 2d49 | 547a | 63d468d6 | 000000 | 01 | 07f |
| 147 | 1 | 1 | 2dc8 | 547a | 63d468d6 | 000000 | 01 | 07f |
| 148 | 1 | 1 | 2e47 | 547a | 63d468d6 | 000000 | 01 | 07f |
| 149 | 1 | 1 | 2ec6 | 547a | 63d468d6 | 000000 | 01 | 07f |
| 150 | 1 | 1 | 2f45 | 547a | 63d468d6 | 000000 | 01 | 07f |
| 151 | 1 | 1 | 2fc4 | 547a | 63d468d6 | 000000 | 01 | 07f |
| 152 | 1 | 1 | 3043 | 547a | 63d468d6 | 000000 | 01 | 07f |
| 153 | 1 | 1 | 30c2 | 547a | 63d468d6 | 000000 | 01 | 07f |
| 154 | 1 | 1 | 3141 | 547a | 63d468d6 | 000000 | 01 | 07f |
| 155 | 1 | 1 | 31c0 | 547a | 63d468d6 | 000000 | 01 | 07f |
| 156 | 1 | 1 | 323f | 547a | 63d468d6 | 000000 | 01 | 07f |
| 157 | 1 | 1 | 32be | 547a | 63d468d6 | 000000 | 01 | 07f |
| 158 | 1 | 1 | 333d | 547a | 63d468d6 | 000000 | 01 | 07f |
| 159 | 1 | 1 | 33bc | 547a | 63d468d6 | 000000 | 01 | 07f |
| 160 | 1 | 1 | 343b | 547a | 63d468d6 | 000000 | 01 | 07f |
| 161 | 1 | 1 | 34ba | 547a | 63d468d6 | 000000 | 01 | 07f |
| 162 | 1 | 1 | 3539 | 547a | 63d468d6 | 000000 | 01 | 07f |
| 163 | 1 | 1 | 35b8 | 547a | 63d468d6 | 000000 | 01 | 07f |
| 164 | 1 | 1 | 3637 | 547a | 63d468d6 | 000000 | 01 | 07f |
| 165 | 0 | 1 | 24a4 | 4268 | d4692614 | 005014 | 02 | 07f |
| 166 | 1 | 1 | 2523 | 4268 | d4692614 | 000000 | 02 | 07f |
| 167 | 1 | 1 | 25a2 | 4268 | d4692614 | 000000 | 02 | 07f |
| 168 | 0 | 1 | 140f | 3056 | 692b9d00 | 058900 | 03 | 07f |
| 169 | 1 | 1 | 148e | 3056 | 692b9d00 | 000000 | 03 | 07f |
| 170 | 1 | 1 | 150d | 3056 | 692b9d00 | 000000 | 03 | 07f |
| 171 | 1 | 1 | 158c | 3056 | 692b9d00 | 000000 | 03 | 07f |
| 172 | 1 | 1 | 160b | 3056 | 692b9d00 | 000000 | 03 | 07f |
| 173 | 0 | 1 | 2478 | 3e44 | 692bef7c | 00527c | 04 | 07f |
| 174 | 1 | 1 | 24f7 | 3e44 | 692bef7c | 000000 | 04 | 07f |
| 175 | 0 | 1 | 1364 | 2c32 | 2bf5b2c0 | 0636c0 | 05 | 07f |

| | | | | | | | |
|---|---|---|---|---|---|---|---|
| 176 | 1 | 1 | 13e3 | 2c32 | 2bf5b2c0 | 000000 | 05 | 07f |
| 177 | 1 | 1 | 1462 | 2c32 | 2bf5b2c0 | 000000 | 05 | 07f |
| 178 | 1 | 1 | 14e1 | 2c32 | 2bf5b2c0 | 000000 | 05 | 07f |
| 179 | 1 | 1 | 1560 | 2c32 | 2bf5b2c0 | 000000 | 05 | 07f |
| 180 | 1 | 1 | 15df | 2c32 | 2bf5b2c0 | 000000 | 05 | 07f |
| 181 | 0 | 1 | 244c | 3a20 | 2bf607bc | 0054fc | 06 | 07f |
| 182 | 1 | 1 | 24cb | 3a20 | 2bf607bc | 000000 | 06 | 07f |
| 183 | 1 | 1 | 254a | 3a20 | 2bf607bc | 000000 | 06 | 07f |
| 184 | 1 | 1 | 25c9 | 3a20 | 2bf607bc | 000000 | 06 | 07f |
| 185 | 1 | 1 | 2648 | 3a20 | 2bf607bc | 000000 | 06 | 07f |
| 186 | 1 | 1 | 26c7 | 3a20 | 2bf607bc | 000000 | 06 | 07f |
| 187 | 1 | 1 | 2746 | 3a20 | 2bf607bc | 000000 | 06 | 07f |
| 188 | 1 | 1 | 27c5 | 3a20 | 2bf607bc | 000000 | 06 | 07f |
| 189 | 1 | 1 | 2844 | 3a20 | 2bf607bc | 000000 | 06 | 07f |
| 190 | 1 | 1 | 28c3 | 3a20 | 2bf607bc | 000000 | 06 | 07f |
| 191 | 1 | 1 | 2942 | 3a20 | 2bf607bc | 000000 | 06 | 07f |
| 192 | 0 | 1 | 17af | 280e | f60ab000 | 02f400 | 07 | 07f |
| 193 | 1 | 1 | 182e | 280e | f60ab000 | 000000 | 07 | 07f |
| 194 | 0 | 1 | 269b | 35fc | f60ae8f2 | 0038f2 | 08 | 07f |
| 195 | 1 | 1 | 271a | 35fc | f60ae8f2 | 000000 | 08 | 07f |
| 196 | 1 | 1 | 2799 | 35fc | f60ae8f2 | 000000 | 08 | 07f |
| 197 | 1 | 1 | 2818 | 35fc | f60ae8f2 | 000000 | 08 | 07f |
| 198 | 1 | 1 | 2897 | 35fc | f60ae8f2 | 000000 | 08 | 07f |
| 199 | 1 | 1 | 2916 | 35fc | f60ae8f2 | 000000 | 08 | 07f |
| 200 | 1 | 1 | 2995 | 35fc | f60ae8f2 | 000000 | 08 | 07f |
| 201 | 1 | 1 | 2a14 | 35fc | f60ae8f2 | 000000 | 08 | 07f |
| 202 | 1 | 1 | 2a93 | 35fc | f60ae8f2 | 000000 | 08 | 07f |
| 203 | 1 | 1 | 2b12 | 35fc | f60ae8f2 | 000000 | 08 | 07f |
| 204 | 1 | 1 | 2b91 | 35fc | f60ae8f2 | 000000 | 08 | 07f |
| 205 | 1 | 1 | 2c10 | 35fc | f60ae8f2 | 000000 | 08 | 07f |
| 206 | 0 | 1 | 1a7d | 23ea | 0aeac2e0 | 01d0e0 | 09 | 07f |
| 207 | 1 | 1 | 1afc | 23ea | 0aeac2e0 | 000000 | 09 | 07f |
| 208 | 1 | 1 | 1b7b | 23ea | 0aeac2e0 | 000000 | 09 | 07f |
| 209 | 1 | 1 | 1bfa | 23ea | 0aeac2e0 | 000000 | 09 | 07f |
| 210 | 1 | 1 | 1c79 | 23ea | 0aeac2e0 | 000000 | 09 | 07f |
| 211 | 0 | 1 | 2ae6 | 31d8 | 0aeaddf1 | 001b11 | 0a | 07f |
| 212 | 1 | 1 | 2b65 | 31d8 | 0aeaddf1 | 000000 | 0a | 07f |
| 213 | 1 | 1 | 2be4 | 31d8 | 0aeaddf1 | 000000 | 0a | 07f |
| 214 | 1 | 1 | 2c63 | 31d8 | 0aeaddf1 | 000000 | 0a | 07f |
| 215 | 1 | 1 | 2ce2 | 31d8 | 0aeaddf1 | 000000 | 0a | 07f |
| 216 | 1 | 1 | 2d61 | 31d8 | 0aeaddf1 | 000000 | 0a | 07f |
| 217 | 1 | 1 | 2de0 | 31d8 | 0aeaddf1 | 000000 | 0a | 07f |
| 218 | 1 | 1 | 2e5f | 31d8 | 0aeaddf1 | 000000 | 0a | 07f |
| 219 | 1 | 1 | 2ede | 31d8 | 0aeaddf1 | 000000 | 0a | 07f |
| 220 | 1 | 1 | 2f5d | 31d8 | 0aeaddf1 | 000000 | 0a | 07f |

| | | | | | | | | |
|---|---|---|---|---|---|---|---|---|
| 221 | 0 | 1 | 1dca | 4e63 | eadef770 | 010670 | 00 | 08f |
| 222 | 1 | 1 | 1e59 | 4e63 | eadef770 | 000000 | 00 | 08f |
| 223 | 1 | 1 | 1ee8 | 4e63 | eadef770 | 000000 | 00 | 08f |
| 224 | 0 | 1 | 2cad | 5b99 | eadf0901 | 001191 | 01 | 08f |
| 225 | 1 | 1 | 2d3c | 5b99 | eadf0901 | 000000 | 01 | 08f |
| 226 | 1 | 1 | 2dcb | 5b99 | eadf0901 | 000000 | 01 | 08f |
| 227 | 1 | 1 | 2e5a | 5b99 | eadf0901 | 000000 | 01 | 08f |
| 228 | 0 | 1 | 1c1f | 48cf | df0a3670 | 013570 | 02 | 08f |
| 229 | 1 | 1 | 1cae | 48cf | df0a3670 | 000000 | 02 | 08f |
| 230 | 1 | 1 | 1d3d | 48cf | df0a3670 | 000000 | 02 | 08f |
| 231 | 0 | 1 | 2b02 | 5605 | df0a4de3 | 001773 | 03 | 08f |
| 232 | 1 | 1 | 2b91 | 5605 | df0a4de3 | 000000 | 03 | 08f |
| 233 | 1 | 1 | 2c20 | 5605 | df0a4de3 | 000000 | 03 | 08f |
| 234 | 1 | 1 | 2caf | 5605 | df0a4de3 | 000000 | 03 | 08f |
| 235 | 1 | 1 | 2d3e | 5605 | df0a4de3 | 000000 | 03 | 08f |
| 236 | 1 | 1 | 2dcd | 5605 | df0a4de3 | 000000 | 03 | 08f |
| 237 | 1 | 1 | 2e5c | 5605 | df0a4de3 | 000000 | 03 | 08f |
| 238 | 1 | 1 | 2eeb | 5605 | df0a4de3 | 000000 | 03 | 08f |
| 239 | 1 | 1 | 2f7a | 5605 | df0a4de3 | 000000 | 03 | 08f |
| 240 | 1 | 1 | 3009 | 5605 | df0a4de3 | 000000 | 03 | 08f |
| 241 | 1 | 1 | 3098 | 5605 | df0a4de3 | 000000 | 03 | 08f |
| 242 | 1 | 1 | 3127 | 5605 | df0a4de3 | 000000 | 03 | 08f |
| 243 | 1 | 1 | 31b6 | 5605 | df0a4de3 | 000000 | 03 | 08f |
| 244 | 0 | 1 | 1f7b | 433b | 0a4e8fe0 | 00ace0 | 04 | 08f |
| 245 | 0 | 1 | 0d40 | 3071 | 4e9fc580 | 0fe580 | 05 | 08f |
| 246 | 1 | 1 | 0dcf | 3071 | 4e9fc580 | 000000 | 05 | 08f |
| 247 | 1 | 1 | 0e5e | 3071 | 4e9fc580 | 000000 | 05 | 08f |
| 248 | 1 | 1 | 0eed | 3071 | 4e9fc580 | 000000 | 05 | 08f |
| 249 | 1 | 1 | 0f7c | 3071 | 4e9fc580 | 000000 | 05 | 08f |
| 250 | 1 | 1 | 100b | 3071 | 4e9fc580 | 000000 | 05 | 08f |
| 251 | 1 | 1 | 109a | 3071 | 4e9fc580 | 000000 | 05 | 08f |
| 252 | 1 | 1 | 1129 | 3071 | 4e9fc580 | 000000 | 05 | 08f |
| 253 | 1 | 1 | 11b8 | 3071 | 4e9fc580 | 000000 | 05 | 08f |
| 254 | 1 | 1 | 1247 | 3071 | 4e9fc580 | 000000 | 05 | 08f |
| 255 | 1 | 1 | 12d6 | 3071 | 4e9fc580 | 000000 | 05 | 08f |
| 256 | 1 | 1 | 1365 | 3071 | 4e9fc580 | 000000 | 05 | 08f |

Decoder:

| EVENT | YN | MPS | LR | LRM | X | DX | K | LP | LX |
|---|---|---|---|---|---|---|---|---|---|
| 0 | - | - | 1001 | 1001 | 0000efd5 | - | - | - | |
| 1 | 1 | 0 | 1401 | 5001 | 00006fe5 | 007ff4 | 01 | 400 | 14c8 |
| 2 | 1 | 0 | 1801 | 5001 | 00002feb | 003ffa | 02 | 400 | 19ad |
| 3 | 1 | 0 | 1c01 | 5001 | 00000fee | 001ffd | 03 | 400 | 2000 |
| 4 | 0 | 0 | 0001 | 3001 | 000fee81 | 000000 | 03 | 400 | 0007 |

| | | | | | | | | | |
|---|---|---|---|---|---|---|---|---|---|
| 5 | 1 | 0 | 0401 | 3001 | 0007ef41 | 07ff40 | 04 | 400 | 040d |
| 6 | 1 | 0 | 0801 | 3001 | 0003efa1 | 03ffa0 | 05 | 400 | 0819 |
| 7 | 1 | 0 | 0c01 | 3001 | 0001efd1 | 01ffd0 | 06 | 400 | 0c30 |
| 8 | 1 | 0 | 1001 | 3001 | 0000efe9 | 00ffe8 | 07 | 400 | 1061 |
| 9 | 1 | 0 | 1401 | 3001 | 00006ff5 | 007ff4 | 08 | 400 | 14c7 |
| 10 | 1 | 0 | 1801 | 3001 | 00002ffb | 003ffa | 09 | 400 | 19ab |
| 11 | 1 | 0 | 1c01 | 3001 | 00000ffe | 001ffd | 0a | 400 | 2000 |
| 12 | 1 | 1 | 0001 | 3b02 | 00000023 | 0ffe80 | 00 | 31b | 2000 |
| 13 | 1 | 1 | 031c | 3b02 | 00000023 | 000000 | 00 | 31b | 2000 |
| 14 | 1 | 1 | 0637 | 3b02 | 00000023 | 000000 | 00 | 31b | 2000 |
| 15 | 1 | 1 | 0952 | 3b02 | 00000023 | 000000 | 00 | 31b | 2000 |
| 16 | 1 | 1 | 0c6d | 3b02 | 00000023 | 000000 | 00 | 31b | 2000 |
| 17 | 1 | 1 | 0f88 | 3b02 | 00000023 | 000000 | 00 | 31b | 2000 |
| 18 | 1 | 1 | 12a3 | 3b02 | 00000023 | 000000 | 00 | 31b | 2000 |
| 19 | 1 | 1 | 15be | 3b02 | 00000023 | 000000 | 00 | 31b | 2000 |
| 20 | 1 | 1 | 18d9 | 3b02 | 00000023 | 000000 | 00 | 31b | 2000 |
| 21 | 1 | 1 | 1bf4 | 3b02 | 00000023 | 000000 | 00 | 31b | 2000 |
| 22 | 1 | 1 | 1f0f | 3b02 | 00000023 | 000000 | 00 | 31b | 2000 |
| 23 | 1 | 1 | 022a | 1b02 | 00002373 | 000000 | 00 | 31b | 1b6a |
| 24 | 1 | 1 | 0545 | 1b02 | 00002373 | 000000 | 00 | 31b | 1b6a |
| 25 | 1 | 1 | 0860 | 1b02 | 00002373 | 000000 | 00 | 31b | 1b6a |
| 26 | 1 | 1 | 0b7b | 1b02 | 00002373 | 000000 | 00 | 31b | 1b6a |
| 27 | 1 | 1 | 0e96 | 1b02 | 00002373 | 000000 | 00 | 31b | 1b6a |
| 28 | 1 | 1 | 11b1 | 1b02 | 00002373 | 000000 | 00 | 31b | 1b6a |
| 29 | 1 | 1 | 14cc | 1b02 | 00002373 | 000000 | 00 | 31b | 1b6a |
| 30 | 1 | 1 | 17e7 | 1b02 | 00002373 | 000000 | 00 | 31b | 1b6a |
| 31 | 1 | 1 | 1b02 | 4b21 | 00002373 | 000000 | 00 | 07f | 1b6a |
| 32 | 0 | 1 | 296f | 590f | 0000008d | 0022e6 | 01 | 07f | 2000 |
| 33 | 1 | 1 | 09ee | 390f | 00008d2d | 000000 | 01 | 07f | 1371 |
| 34 | 1 | 1 | 0a6d | 390f | 00008d2d | 000000 | 01 | 07f | 1371 |
| 35 | 1 | 1 | 0aec | 390f | 00008d2d | 000000 | 01 | 07f | 1371 |
| 36 | 1 | 1 | 0b6b | 390f | 00008d2d | 000000 | 01 | 07f | 1371 |
| 37 | 1 | 1 | 0bea | 390f | 00008d2d | 000000 | 01 | 07f | 1371 |
| 38 | 1 | 1 | 0c69 | 390f | 00008d2d | 000000 | 01 | 07f | 1371 |
| 39 | 1 | 1 | 0ce8 | 390f | 00008d2d | 000000 | 01 | 07f | 1371 |
| 40 | 1 | 1 | 0d67 | 390f | 00008d2d | 000000 | 01 | 07f | 1371 |
| 41 | 1 | 1 | 0de6 | 390f | 00008d2d | 000000 | 01 | 07f | 1371 |
| 42 | 1 | 1 | 0e65 | 390f | 00008d2d | 000000 | 01 | 07f | 1371 |
| 43 | 1 | 1 | 0ee4 | 390f | 00008d2d | 000000 | 01 | 07f | 1371 |
| 44 | 1 | 1 | 0f63 | 390f | 00008d2d | 000000 | 01 | 07f | 1371 |
| 45 | 1 | 1 | 0fe2 | 390f | 00008d2d | 000000 | 01 | 07f | 1371 |
| 46 | 1 | 1 | 1061 | 390f | 00008d2d | 000000 | 01 | 07f | 1371 |
| 47 | 1 | 1 | 10e0 | 390f | 00008d2d | 000000 | 01 | 07f | 1371 |
| 48 | 1 | 1 | 115f | 390f | 00008d2d | 000000 | 01 | 07f | 1371 |
| 49 | 1 | 1 | 11de | 390f | 00008d2d | 000000 | 01 | 07f | 1371 |

|     | 111 |   |      |      |          |        |     | 112 |      |
| --- | --- | - | ---- | ---- | -------- | ------ | --- | --- | ---- |
| 50  | 1   | 1 | 125d | 390f | 00008d2d | 000000 | 01  | 07f | 1371 |
| 51  | 1   | 1 | 12dc | 390f | 00008d2d | 000000 | 01  | 07f | 1371 |
| 52  | 1   | 1 | 135b | 390f | 00008d2d | 000000 | 01  | 07f | 1371 |
| 53  | 0   | 1 | 21c8 | 46fd | 000009c5 | 008368 | 02  | 07f | 2000 |
| 54  | 1   | 1 | 0247 | 26fd | 0009c510 | 000000 | 02  | 07f | 02da |
| 55  | 1   | 1 | 02c6 | 26fd | 0009c510 | 000000 | 02  | 07f | 02da |
| 56  | 0   | 1 | 1133 | 34eb | 0000af10 | 091600 | 03  | 07f | 1233 |
| 57  | 1   | 1 | 11b2 | 34eb | 0000af10 | 000000 | 03  | 07f | 1233 |
| 58  | 1   | 1 | 1231 | 34eb | 0000af10 | 000000 | 03  | 07f | 1233 |
| 59  | 0   | 1 | 209e | 42d9 | 00000e48 | 00a0c8 | 04  | 07f | 2000 |
| 60  | 0   | 1 | 0f0b | 30c7 | 000115e3 | 0d3280 | 05  | 07f | 0f88 |
| 61  | 0   | 1 | 1d78 | 3eb5 | 00000063 | 011580 | 06  | 07f | 2000 |
| 62  | 1   | 1 | 1df7 | 3eb5 | 00000063 | 000000 | 06  | 07f | 2000 |
| 63  | 1   | 1 | 1e76 | 3eb5 | 00000063 | 000000 | 06  | 07f | 2000 |
| 64  | 1   | 1 | 1ef5 | 3eb5 | 00000063 | 000000 | 06  | 07f | 2000 |
| 65  | 1   | 1 | 1f74 | 3eb5 | 00000063 | 000000 | 06  | 07f | 2000 |
| 66  | 1   | 1 | 1ff3 | 3eb5 | 00000063 | 000000 | 06  | 07f | 2000 |
| 67  | 1   | 1 | 0072 | 1eb5 | 000063d4 | 000000 | 06  | 07f | 1570 |
| 68  | 1   | 1 | 00f1 | 1eb5 | 000063d4 | 000000 | 06  | 07f | 1570 |
| 69  | 1   | 1 | 0170 | 1eb5 | 000063d4 | 000000 | 06  | 07f | 1570 |
| 70  | 1   | 1 | 01ef | 1eb5 | 000063d4 | 000000 | 06  | 07f | 1570 |
| 71  | 1   | 1 | 026e | 1eb5 | 000063d4 | 000000 | 06  | 07f | 1570 |
| 72  | 1   | 1 | 02ed | 1eb5 | 000063d4 | 000000 | 06  | 07f | 1570 |
| 73  | 1   | 1 | 036c | 1eb5 | 000063d4 | 000000 | 06  | 07f | 1570 |
| 74  | 1   | 1 | 03eb | 1eb5 | 000063d4 | 000000 | 06  | 07f | 1570 |
| 75  | 1   | 1 | 046a | 1eb5 | 000063d4 | 000000 | 06  | 07f | 1570 |
| 76  | 1   | 1 | 04e9 | 1eb5 | 000063d4 | 000000 | 06  | 07f | 1570 |
| 77  | 1   | 1 | 0568 | 1eb5 | 000063d4 | 000000 | 06  | 07f | 1570 |
| 78  | 1   | 1 | 05e7 | 1eb5 | 000063d4 | 000000 | 06  | 07f | 1570 |
| 79  | 1   | 1 | 0666 | 1eb5 | 000063d4 | 000000 | 06  | 07f | 1570 |
| 80  | 1   | 1 | 06e5 | 1eb5 | 000063d4 | 000000 | 06  | 07f | 1570 |
| 81  | 1   | 1 | 0764 | 1eb5 | 000063d4 | 000000 | 06  | 07f | 1570 |
| 82  | 1   | 1 | 07e3 | 1eb5 | 000063d4 | 000000 | 06  | 07f | 1570 |
| 83  | 1   | 1 | 0862 | 1eb5 | 000063d4 | 000000 | 06  | 07f | 1570 |
| 84  | 1   | 1 | 08e1 | 1eb5 | 000063d4 | 000000 | 06  | 07f | 1570 |
| 85  | 1   | 1 | 0960 | 1eb5 | 000063d4 | 000000 | 06  | 07f | 1570 |
| 86  | 1   | 1 | 09df | 1eb5 | 000063d4 | 000000 | 06  | 07f | 1570 |
| 87  | 1   | 1 | 0a5e | 1eb5 | 000063d4 | 000000 | 06  | 07f | 1570 |
| 88  | 1   | 1 | 0add | 1eb5 | 000063d4 | 000000 | 06  | 07f | 1570 |
| 89  | 1   | 1 | 0b5c | 1eb5 | 000063d4 | 000000 | 06  | 07f | 1570 |
| 90  | 1   | 1 | 0bdb | 1eb5 | 000063d4 | 000000 | 06  | 07f | 1570 |
| 91  | 1   | 1 | 0c5a | 1eb5 | 000063d4 | 000000 | 06  | 07f | 1570 |
| 92  | 1   | 1 | 0cd9 | 1eb5 | 000063d4 | 000000 | 06  | 07f | 1570 |
| 93  | 1   | 1 | 0d58 | 1eb5 | 000063d4 | 000000 | 06  | 07f | 1570 |
| 94  | 1   | 1 | 0dd7 | 1eb5 | 000063d4 | 000000 | 06  | 07f | 1570 |

| | 113 | | | | | | | | 114 |
|---|---|---|---|---|---|---|---|---|---|
| 95  | 1 | 1 | 0e56 | 1eb5 | 000063d4 | 000000 | 06 | 07f | 1570 |
| 96  | 1 | 1 | 0ed5 | 1eb5 | 000063d4 | 000000 | 06 | 07f | 1570 |
| 97  | 1 | 1 | 0f54 | 1eb5 | 000063d4 | 000000 | 06 | 07f | 1570 |
| 98  | 1 | 1 | 0fd3 | 1eb5 | 000063d4 | 000000 | 06 | 07f | 1570 |
| 99  | 1 | 1 | 1052 | 1eb5 | 000063d4 | 000000 | 06 | 07f | 1570 |
| 100 | 1 | 1 | 10d1 | 1eb5 | 000063d4 | 000000 | 06 | 07f | 1570 |
| 101 | 1 | 1 | 1150 | 1eb5 | 000063d4 | 000000 | 06 | 07f | 1570 |
| 102 | 1 | 1 | 11cf | 1eb5 | 000063d4 | 000000 | 06 | 07f | 1570 |
| 103 | 1 | 1 | 124e | 1eb5 | 000063d4 | 000000 | 06 | 07f | 1570 |
| 104 | 1 | 1 | 12cd | 1eb5 | 000063d4 | 000000 | 06 | 07f | 1570 |
| 105 | 1 | 1 | 134c | 1eb5 | 000063d4 | 000000 | 06 | 07f | 1570 |
| 106 | 1 | 1 | 13cb | 1eb5 | 000063d4 | 000000 | 06 | 07f | 1570 |
| 107 | 1 | 1 | 144a | 1eb5 | 000063d4 | 000000 | 06 | 07f | 1570 |
| 108 | 1 | 1 | 14c9 | 1eb5 | 000063d4 | 000000 | 06 | 07f | 1570 |
| 109 | 1 | 1 | 1548 | 1eb5 | 000063d4 | 000000 | 06 | 07f | 1570 |
| 110 | 0 | 1 | 23b5 | 2ca3 | 000005b4 | 005e20 | 07 | 07f | 2000 |
| 111 | 1 | 1 | 0434 | 0ca3 | 0005b469 | 000000 | 07 | 07f | 05f5 |
| 112 | 1 | 1 | 04b3 | 0ca3 | 0005b469 | 000000 | 07 | 07f | 05f5 |
| 113 | 1 | 1 | 0532 | 0ca3 | 0005b469 | 000000 | 07 | 07f | 05f5 |
| 114 | 1 | 1 | 05b1 | 0ca3 | 0005b469 | 000000 | 07 | 07f | 05f5 |
| 115 | 0 | 1 | 141e | 1a91 | 000039a9 | 057ac0 | 08 | 07f | 189b |
| 116 | 1 | 1 | 149d | 1a91 | 000039a9 | 000000 | 08 | 07f | 189b |
| 117 | 1 | 1 | 151c | 1a91 | 000039a9 | 000000 | 08 | 07f | 189b |
| 118 | 1 | 1 | 159b | 1a91 | 000039a9 | 000000 | 08 | 07f | 189b |
| 119 | 1 | 1 | 161a | 1a91 | 000039a9 | 000000 | 08 | 07f | 189b |
| 120 | 1 | 1 | 1699 | 1a91 | 000039a9 | 000000 | 08 | 07f | 189b |
| 121 | 1 | 1 | 1718 | 1a91 | 000039a9 | 000000 | 08 | 07f | 189b |
| 122 | 1 | 1 | 1797 | 1a91 | 000039a9 | 000000 | 08 | 07f | 189b |
| 123 | 1 | 1 | 1816 | 1a91 | 000039a9 | 000000 | 08 | 07f | 189b |
| 124 | 1 | 1 | 1895 | 1a91 | 000039a9 | 000000 | 08 | 07f | 189b |
| 125 | 0 | 1 | 2702 | 287f | 0000048b | 00351e | 09 | 07f | 2000 |
| 126 | 0 | 1 | 156f | 166d | 00002e6b | 045cc0 | 0a | 07f | 19dc |
| 127 | 1 | 1 | 15ee | 166d | 00002e6b | 000000 | 0a | 07f | 19dc |
| 128 | 1 | 1 | 166d | 468c | 00002e6b | 000000 | 00 | 07f | 19dc |
| 129 | 1 | 1 | 16ec | 468c | 00002e6b | 000000 | 00 | 07f | 19dc |
| 130 | 1 | 1 | 176b | 468c | 00002e6b | 000000 | 00 | 07f | 19dc |
| 131 | 1 | 1 | 17ea | 468c | 00002e6b | 000000 | 00 | 07f | 19dc |
| 132 | 1 | 1 | 1869 | 468c | 00002e6b | 000000 | 00 | 07f | 19dc |
| 133 | 1 | 1 | 18e8 | 468c | 00002e6b | 000000 | 00 | 07f | 19dc |
| 134 | 1 | 1 | 1967 | 468c | 00002e6b | 000000 | 00 | 07f | 19dc |
| 135 | 0 | 1 | 27d4 | 547a | 00000055 | 002e16 | 01 | 07f | 2000 |
| 136 | 1 | 1 | 0853 | 347a | 000055f6 | 000000 | 01 | 07f | 164e |
| 137 | 1 | 1 | 08d2 | 347a | 000055f6 | 000000 | 01 | 07f | 164e |
| 138 | 1 | 1 | 0951 | 347a | 000055f6 | 000000 | 01 | 07f | 164e |
| 139 | 1 | 1 | 09d0 | 347a | 000055f6 | 000000 | 01 | 07f | 164e |

| | | | | | | | | |
|---|---|---|---|---|---|---|---|---|
| 140 | 1 | 1 | 0a4f | 347a | 000055f6 | 000000 | 01 | 07f | 164e |
| 141 | 1 | 1 | 0ace | 347a | 000055f6 | 000000 | 01 | 07f | 164e |
| 142 | 1 | 1 | 0b4d | 347a | 000055f6 | 000000 | 01 | 07f | 164e |
| 143 | 1 | 1 | 0bcc | 347a | 000055f6 | 000000 | 01 | 07f | 164e |
| 144 | 1 | 1 | 0c4b | 347a | 000055f6 | 000000 | 01 | 07f | 164e |
| 145 | 1 | 1 | 0cca | 347a | 000055f6 | 000000 | 01 | 07f | 164e |
| 146 | 1 | 1 | 0d49 | 347a | 000055f6 | 000000 | 01 | 07f | 164e |
| 147 | 1 | 1 | 0dc8 | 347a | 000055f6 | 000000 | 01 | 07f | 164e |
| 148 | 1 | 1 | 0e47 | 347a | 000055f6 | 000000 | 01 | 07f | 164e |
| 149 | 1 | 1 | 0ec6 | 347a | 000055f6 | 000000 | 01 | 07f | 164e |
| 150 | 1 | 1 | 0f45 | 347a | 000055f6 | 000000 | 01 | 07f | 164e |
| 151 | 1 | 1 | 0fc4 | 347a | 000055f6 | 000000 | 01 | 07f | 164e |
| 152 | 1 | 1 | 1043 | 347a | 000055f6 | 000000 | 01 | 07f | 164e |
| 153 | 1 | 1 | 10c2 | 347a | 000055f6 | 000000 | 01 | 07f | 164e |
| 154 | 1 | 1 | 1141 | 347a | 000055f6 | 000000 | 01 | 07f | 164e |
| 155 | 1 | 1 | 11c0 | 347a | 000055f6 | 000000 | 01 | 07f | 164e |
| 156 | 1 | 1 | 123f | 347a | 000055f6 | 000000 | 01 | 07f | 164e |
| 157 | 1 | 1 | 12be | 347a | 000055f6 | 000000 | 01 | 07f | 164e |
| 158 | 1 | 1 | 133d | 347a | 000055f6 | 000000 | 01 | 07f | 164e |
| 159 | 1 | 1 | 13bc | 347a | 000055f6 | 000000 | 01 | 07f | 164e |
| 160 | 1 | 1 | 143b | 347a | 000055f6 | 000000 | 01 | 07f | 164e |
| 161 | 1 | 1 | 14ba | 347a | 000055f6 | 000000 | 01 | 07f | 164e |
| 162 | 1 | 1 | 1539 | 347a | 000055f6 | 000000 | 01 | 07f | 164e |
| 163 | 1 | 1 | 15b8 | 347a | 000055f6 | 000000 | 01 | 07f | 164e |
| 164 | 1 | 1 | 1637 | 347a | 000055f6 | 000000 | 01 | 07f | 164e |
| 165 | 0 | 1 | 24a4 | 4268 | 000005e2 | 005014 | 02 | 07f | 2000 |
| 166 | 1 | 1 | 0523 | 2268 | 0005e20a | 000000 | 02 | 07f | 05c7 |
| 167 | 1 | 1 | 05a2 | 2268 | 0005e20a | 000000 | 02 | 07f | 05c7 |
| 168 | 0 | 1 | 140f | 3056 | 0000590a | 058900 | 03 | 07f | 161a |
| 169 | 1 | 1 | 148e | 3056 | 0000590a | 000000 | 03 | 07f | 161a |
| 170 | 1 | 1 | 150d | 3056 | 0000590a | 000000 | 03 | 07f | 161a |
| 171 | 1 | 1 | 158c | 3056 | 0000590a | 000000 | 03 | 07f | 161a |
| 172 | 1 | 1 | 160b | 3056 | 0000590a | 000000 | 03 | 07f | 161a |
| 173 | 0 | 1 | 2478 | 3e44 | 0000068e | 00527c | 04 | 07f | 2000 |
| 174 | 1 | 1 | 04f7 | 1e44 | 00068eea | 000000 | 04 | 07f | 0527 |
| 175 | 0 | 1 | 1364 | 2c32 | 0000582a | 0636c0 | 05 | 07f | 1628 |
| 176 | 1 | 1 | 13e3 | 2c32 | 0000582a | 000000 | 05 | 07f | 1628 |
| 177 | 1 | 1 | 1462 | 2c32 | 0000582a | 000000 | 05 | 07f | 1628 |
| 178 | 1 | 1 | 14e1 | 2c32 | 0000582a | 000000 | 05 | 07f | 1628 |
| 179 | 1 | 1 | 1560 | 2c32 | 0000582a | 000000 | 05 | 07f | 1628 |
| 180 | 1 | 1 | 15df | 2c32 | 0000582a | 000000 | 05 | 07f | 1628 |
| 181 | 0 | 1 | 244c | 3a20 | 0000032e | 0054fc | 06 | 07f | 2000 |
| 182 | 1 | 1 | 04cb | 1a20 | 00032edf | 000000 | 06 | 07f | 0953 |
| 183 | 1 | 1 | 054a | 1a20 | 00032edf | 000000 | 06 | 07f | 0953 |
| 184 | 1 | 1 | 05c9 | 1a20 | 00032edf | 000000 | 06 | 07f | 0953 |

| | | | | | | | | | |
|---|---|---|---|---|---|---|---|---|---|
| 185 | 1 | 1 | 0648 | 1a20 | 00032edf | 000000 | 06 | 07f | 0953 |
| 186 | 1 | 1 | 06c7 | 1a20 | 00032edf | 000000 | 06 | 07f | 0953 |
| 187 | 1 | 1 | 0746 | 1a20 | 00032edf | 000000 | 06 | 07f | 0953 |
| 188 | 1 | 1 | 07c5 | 1a20 | 00032edf | 000000 | 06 | 07f | 0953 |
| 189 | 1 | 1 | 0844 | 1a20 | 00032edf | 000000 | 06 | 07f | 0953 |
| 190 | 1 | 1 | 08c3 | 1a20 | 00032edf | 000000 | 06 | 07f | 0953 |
| 191 | 1 | 1 | 0942 | 1a20 | 00032edf | 000000 | 06 | 07f | 0953 |
| 192 | 0 | 1 | 17af | 280e | 00003adf | 02f400 | 07 | 07f | 187c |
| 193 | 1 | 1 | 182e | 280e | 00003adf | 000000 | 07 | 07f | 187c |
| 194 | 0 | 1 | 269b | 35fc | 000001ed | 0038f2 | 08 | 07f | 2000 |
| 195 | 1 | 1 | 071a | 15fc | 0001ed0a | 000000 | 08 | 07f | 0c39 |
| 196 | 1 | 1 | 0799 | 15fc | 0001ed0a | 000000 | 08 | 07f | 0c39 |
| 197 | 1 | 1 | 0818 | 15fc | 0001ed0a | 000000 | 08 | 07f | 0c39 |
| 198 | 1 | 1 | 0897 | 15fc | 0001ed0a | 000000 | 08 | 07f | 0c39 |
| 199 | 1 | 1 | 0916 | 15fc | 0001ed0a | 000000 | 08 | 07f | 0c39 |
| 200 | 1 | 1 | 0995 | 15fc | 0001ed0a | 000000 | 08 | 07f | 0c39 |
| 201 | 1 | 1 | 0a14 | 15fc | 0001ed0a | 000000 | 08 | 07f | 0c39 |
| 202 | 1 | 1 | 0a93 | 15fc | 0001ed0a | 000000 | 08 | 07f | 0c39 |
| 203 | 1 | 1 | 0b12 | 15fc | 0001ed0a | 000000 | 08 | 07f | 0c39 |
| 204 | 1 | 1 | 0b91 | 15fc | 0001ed0a | 000000 | 08 | 07f | 0c39 |
| 205 | 1 | 1 | 0c10 | 15fc | 0001ed0a | 000000 | 08 | 07f | 0c39 |
| 206 | 0 | 1 | 1a7d | 23ea | 00001c2a | 01d0e0 | 09 | 07f | 1cbe |
| 207 | 1 | 1 | 1afc | 23ea | 00001c2a | 000000 | 09 | 07f | 1cbe |
| 208 | 1 | 1 | 1b7b | 23ea | 00001c2a | 000000 | 09 | 07f | 1cbe |
| 209 | 1 | 1 | 1bfa | 23ea | 00001c2a | 000000 | 09 | 07f | 1cbe |
| 210 | 1 | 1 | 1c79 | 23ea | 00001c2a | 000000 | 09 | 07f | 1cbe |
| 211 | 0 | 1 | 2ae6 | 31d8 | 00000119 | 001b11 | 0a | 07f | 2000 |
| 212 | 1 | 1 | 0b65 | 11d8 | 0001194e | 000000 | 0a | 07f | 0f76 |
| 213 | 1 | 1 | 0be4 | 11d8 | 0001194e | 000000 | 0a | 07f | 0f76 |
| 214 | 1 | 1 | 0c63 | 11d8 | 0001194e | 000000 | 0a | 07f | 0f76 |
| 215 | 1 | 1 | 0ce2 | 11d8 | 0001194e | 000000 | 0a | 07f | 0f76 |
| 216 | 1 | 1 | 0d61 | 11d8 | 0001194e | 000000 | 0a | 07f | 0f76 |
| 217 | 1 | 1 | 0de0 | 11d8 | 0001194e | 000000 | 0a | 07f | 0f76 |
| 218 | 1 | 1 | 0e5f | 11d8 | 0001194e | 000000 | 0a | 07f | 0f76 |
| 219 | 1 | 1 | 0ede | 11d8 | 0001194e | 000000 | 0a | 07f | 0f76 |
| 220 | 1 | 1 | 0f5d | 11d8 | 0001194e | 000000 | 0a | 07f | 0f76 |
| 221 | 0 | 1 | 1dca | 4e63 | 000012de | 010670 | 00 | 08f | 1f0e |
| 222 | 1 | 1 | 1e59 | 4e63 | 000012de | 000000 | 00 | 08f | 1f0e |
| 223 | 1 | 1 | 1ee8 | 4e63 | 000012de | 000000 | 00 | 08f | 1f0e |
| 224 | 0 | 1 | 2cad | 5b99 | 0000014d | 001191 | 01 | 08f | 2000 |
| 225 | 1 | 1 | 0d3c | 3b99 | 00014d9f | 000000 | 01 | 08f | 0e7a |
| 226 | 1 | 1 | 0dcb | 3b99 | 00014d9f | 000000 | 01 | 08f | 0e7a |
| 227 | 1 | 1 | 0e5a | 3b99 | 00014d9f | 000000 | 01 | 08f | 0e7a |
| 228 | 0 | 1 | 1c1f | 48cf | 0000182f | 013570 | 02 | 08f | 1d9f |
| 229 | 1 | 1 | 1cae | 48cf | 0000182f | 000000 | 02 | 08f | 1d9f |

| | | | | | | | | | |
|---|---|---|---|---|---|---|---|---|---|
| 230 | 1 | 1 | 1d3d | 48cf | 0000182f | 000000 | 02 | 08f | 1d9f |
| 231 | 0 | 1 | 2b02 | 5605 | 000000bc | 001773 | 03 | 08f | 2000 |
| 232 | 1 | 1 | 0b91 | 3605 | 0000bcc5 | 000000 | 03 | 08f | 11c3 |
| 233 | 1 | 1 | 0c20 | 3605 | 0000bcc5 | 000000 | 03 | 08f | 11c3 |
| 234 | 1 | 1 | 0caf | 3605 | 0000bcc5 | 000000 | 03 | 08f | 11c3 |
| 235 | 1 | 1 | 0d3e | 3605 | 0000bcc5 | 000000 | 03 | 08f | 11c3 |
| 236 | 1 | 1 | 0dcd | 3605 | 0000bcc5 | 000000 | 03 | 08f | 11c3 |
| 237 | 1 | 1 | 0e5c | 3605 | 0000bcc5 | 000000 | 03 | 08f | 11c3 |
| 238 | 1 | 1 | 0eeb | 3605 | 0000bcc5 | 000000 | 03 | 08f | 11c3 |
| 239 | 1 | 1 | 0f7a | 3605 | 0000bcc5 | 000000 | 03 | 08f | 11c3 |
| 240 | 1 | 1 | 1009 | 3605 | 0000bcc5 | 000000 | 03 | 08f | 11c3 |
| 241 | 1 | 1 | 1098 | 3605 | 0000bcc5 | 000000 | 03 | 08f | 11c3 |
| 242 | 1 | 1 | 1127 | 3605 | 0000bcc5 | 000000 | 03 | 08f | 11c3 |
| 243 | 1 | 1 | 11b6 | 3605 | 0000bcc5 | 000000 | 03 | 08f | 11c3 |
| 244 | 0 | 1 | 1f7b | 433b | 00000fe5 | 00ace0 | 04 | 08f | 2000 |
| 245 | 0 | 1 | 0d40 | 3071 | 00000000 | 0fe580 | 05 | 08f | 2000 |
| 246 | 1 | 1 | 0dcf | 3071 | 00000000 | 000000 | 05 | 08f | 2000 |
| 247 | 1 | 1 | 0e5e | 3071 | 00000000 | 000000 | 05 | 08f | 2000 |
| 248 | 1 | 1 | 0eed | 3071 | 00000000 | 000000 | 05 | 08f | 2000 |
| 249 | 1 | 1 | 0f7c | 3071 | 00000000 | 000000 | 05 | 08f | 2000 |
| 250 | 1 | 1 | 100b | 3071 | 00000000 | 000000 | 05 | 08f | 2000 |
| 251 | 1 | 1 | 109a | 3071 | 00000000 | 000000 | 05 | 08f | 2000 |
| 252 | 1 | 1 | 1129 | 3071 | 00000000 | 000000 | 05 | 08f | 2000 |
| 253 | 1 | 1 | 11b8 | 3071 | 00000000 | 000000 | 05 | 08f | 2000 |
| 254 | 1 | 1 | 1247 | 3071 | 00000000 | 000000 | 05 | 08f | 2000 |
| 255 | 1 | 1 | 12d6 | 3071 | 00000000 | 000000 | 05 | 08f | 2000 |
| 256 | 1 | 1 | 1365 | 3071 | 00000000 | 000000 | 05 | 08f | 2000 |

For this file the coded bit count is 160, including the overhead to flush the final data. The actual compressed data stream in hexadecimal form is:

efd981a3732d1063d4692bf60aeadf0a4e9fc580

The usage of the different log p values in the encoder/decoder was:

| log P | count |
|---|---|
| 1024 | 12 |
| 795 | 19 |
| 143 | 35 |
| 127 | 190 |

We claim:

1. A machine-implemented method of compressing data where successive binary decisions are normally encoded to a point in a range R along a number line, wherein one decision outcome has a probability Q and the other decision outcome has a probability P and wherein the range R normally shrinks in magnitude with each successive encoded decision to a new range product of either R multiplied by Q (R*Q) or R multiplied by P (R*P), the method comprising the steps of:

producing, in a state generator, a string of decisions and a respective context state corresponding to each produced decision; and logarithmically encoding the string of decisions and context states into a compressed form including the steps of:

representing the range and probability values of the new range product in the logarithmic domain, wherein each such logarithmic value has a finite precision mantissa; and re-computing a next range R in the logarithmic domain as the sum of the logarithm of the current R (log R) plus the logarithm of either P or Q (log P or log Q) depending on the decision outcome being encoded.

2. The method of claim 1 comprising the further steps of:

forming and storing in memory an antilog table to be used in converting logarithmic domain values back to the real number domain;

said table forming and storing including the steps of:

making an antilog look-up table of mantissa inputs wherein each input has associated therewith a finite precision output, wherein for any two mantissas $\alpha$ and $\beta$ the following constraint applies:

antilog($\alpha+\beta$) $\leq$ antilog($\alpha$)*antilog($\beta$); and selecting each antilog table output value to be unique.

3. The method of claim 2 wherein said table forming and storing step further includes the steps of:

applying the following first constraint when ($\alpha+\beta$) is less than one:

antilog($\alpha+\beta$) $\leq$ antilog($\alpha$)*antilog($\beta$);

applying the following constraint when ($\alpha+\beta$) is equal to or greater than one:

2*antilog($\alpha+\beta-1$) $\leq$ antilog($\alpha$)*antilog($\beta$); and selecting each antilog table output value to be unique.

4. The method of claim 3 comprising the further step of:

making a look-up table for containing in a memory selectable values for log P which includes the steps of:

selecting a limited number of all possible estimated log P values, wherein the number of possible log P values is $2^A$ where A is the precision of log P; and forming (log P, log Q) pairs including the step of selecting the largest log Q value which satisfies the following constraint for a given P:

antilog (log P)+antilog(log Q) $\leq$ 1.

5. The method of claim 4 wherein said log P value selecting step further includes the step of:

choosing estimated log P values each of which, for at least one actual probability, represents a minimum coding inefficiency relative to other selected log P values.

6. The method of claim 5 comprising the further steps of:

setting a threshold coding inefficiency limit;

storing as log P table entries, a plurality of chosen log P values each of which has a coding inefficiency below the set threshold.

7. The method of claim 6 comprising the further step of:

identifying the lower portion of the range R along the probability number line at any given time to represent the logarithmic probability log P and the remaining upper portion of the range R to represent log Q.

8. The method of claim 3 wherein the values of P, Q, and R are fractions in the real number domain, the method further comprising the steps of:

converting any of the real fraction values (X) to the logarithmic domain according to a corresponding logarithm (LX) table including the steps of:

(i) generating, for each possible antilog value, an entry in an LX table where LX=($-$log X);

(ii) generating the LX entries so that:
LX=log (antilog (LX)); and (iii) given Xa and Xb as adjacent output values of the LX table and an X' such that Xa>X'>Xb, storing the output of X' as Xb in the LX table.

9. The method of claim 1 wherein encoded data is in the form of a compressed data stream, the method comprising the further steps of:

conveying the compressed data stream to a log decoder as a sequence of data bytes, each byte including a series of bits.

10. A computerized apparatus for compressing data where successive binary decisions are normally encoded to a point in a range R along a number line, wherein one decision outcome has a probability Q and the other decision outcome has a probability P and wherein the range R normally shrinks in magnitude with each successive encoded decision to a new range product of either R multiplied by Q (R*Q) or R multiplied by P (R*P), the apparatus comprising:

state generator means for producing a string of decisions and a respective context state corresponding to each produced decision; and means for logarithmically encoding the string of decisions and context states into a compressed form including:

means for representing the range and probability values of the new range product in the logarithmic domain, wherein each such logarithmic value has a finite precision mantissa; and means for recomputing a next range R in the logarithmic domain as the sum of the logarithm of the current R (log R) plus the logarithm of either P or Q (log P or log Q) depending on the decision outcome being encoded.

11. In data compression/decompression where successive binary decisions are normally encoded to one code stream value X after another each of which corresponds to one point in a range R along a number line after another, wherein one decision outcome has a probability Q and the other decision outcome has a probability P and wherein a next range R is normally determined for each successive encoded decision outcome as either a current range R multiplied by Q or the current range R multiplied by P, a logarithmic arithmetic coding data compression/decompression computerized apparatus comprising:

encoder state generator means for producing, in response to input data, a string of decision outcomes and a respective context state which indicates (i) the respective probability values of P and Q and (ii) which decision outcome is more probable for each produced decision; and log encoder means for logarithmically encoding the string of decision outcomes and context states into a compressed form including:
- first memory table means for storing logarithmic mantissa values associated with real domain values, each mantissa value having a finite bit length;
- means for converting the range-determining values into the logarithmic domain as a mantissa value from said first table means; and adder means for re-computing, for a given decision outcome and context state, the next range in the logarithmic domain as LR, where LR is the sum of the logarithm of the current range R (log R) plus the logarithm of either P (log P) or Q (log Q) depending on the decision outcome being encoded.

12. Apparatus of claim 11 wherein the data to be compressed is image pixel data and wherein P corresponds to the probability value of the more likely outcome of the current binary decision and Q corresponds to the probability value of the less likely outcome.

13. Apparatus of claim 12 further comprising:
- means for forming and storing in computer memory an antilog table to be used in converting logarithmic domain values back to the real number domain;
- means for retrieving a stored antilog value antilog LX from said antilog table for an argument based on the value LR; and
- means for updating the value X from the retrieved value antilog LX.

14. Apparatus of claim 13 wherein said table forming and storing means includes:
- means for constructing in computer memory an antilog look-up table of mantissa input entries wherein each input entry has associated therewith a finite precision output, wherein for any two mantissas $\alpha$ and $\beta$ in the antilog table the following constraint applies:

$$\text{antilo}(\alpha+\beta) \leq \text{antilog}(\alpha)*\text{antilog}(\beta); \text{ and}$$

wherein each antilog table output value is unique.

15. The apparatus of claim 12 wherein the image pixel data corresponds to black/white binary decisions.

16. Apparatus as in claim 12 wherein said means for making the antilog table applies the following first constraint when $(\alpha+\beta)$ is less than one:

$$\text{antilog}(\alpha+\beta) \leq \text{antilog}(\alpha)*\text{antilog}(\beta); \text{ and}$$

wherein said means for making the antilog table applies the following second constraint when $(\alpha+\beta)$ is equal to or greater than one:

$$2*\text{antilog}(\alpha+\beta-1) \leq \text{antilog}(\alpha)*\text{antilog}(\beta); \text{ and}$$

wherein each antilog table output value is unique.

17. The apparatus of claim 12 further comprising:
- decoder state generator means for generating context state data; and
- logarithmic decoder means which, in response to compressed data input generated by said log encoder means and to corresponding context state data received from said decoder state generator means, converts the compressed data back into the decision string entering said encoder state generator means.

* * * * *